United States Patent
Yamazaki et al.

(10) Patent No.: US 10,566,459 B2
(45) Date of Patent: Feb. 18, 2020

(54) SEMICONDUCTOR DEVICE HAVING A FIRST REGION COMPRISING SILICON, OXYGEN AND AT LEAST ONE METAL ELEMENT FORMED BETWEEN AN OXIDE SEMICONDUCTOR LAYER AND AN INSULATING LAYER

(71) Applicant: Semiconductor Energy Laboratory Co., Ltd., Atsugi-shi, Kanagawa-ken (JP)

(72) Inventors: Shunpei Yamazaki, Setagaya (JP); Akiharu Miyanaga, Hadano (JP); Masahiro Takahashi, Atsugi (JP); Hideyuki Kishida, Atsugi (JP); Junichiro Sakata, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/795,736

(22) Filed: Oct. 27, 2017

(65) Prior Publication Data
US 2018/0053857 A1 Feb. 22, 2018

Related U.S. Application Data

(60) Continuation of application No. 14/474,609, filed on Sep. 2, 2014, now abandoned, which is a division of
(Continued)

(30) Foreign Application Priority Data

Oct. 30, 2009 (JP) .................................. 2009-249876

(51) Int. Cl.
*H01L 29/786* (2006.01)
*H01L 27/12* (2006.01)
(Continued)

(52) U.S. Cl.
CPC ...... *H01L 29/7869* (2013.01); *H01L 27/1225* (2013.01); *H01L 29/42364* (2013.01);
(Continued)

(58) Field of Classification Search
CPC ............. H01L 27/1225; H01L 27/1251; H01L 29/7869
See application file for complete search history.

(56) References Cited

U.S. PATENT DOCUMENTS 5,440,157 A   8/1995 Imai et al.
5,731,856 A   3/1998 Kim et al.
(Continued)

FOREIGN PATENT DOCUMENTS

CN   101258607 A   9/2008
CN   101506986 A   8/2009
(Continued)

OTHER PUBLICATIONS

International Search Report (Application No. PCT/JP2010/067997) dated Nov. 22, 2010.
(Continued)

*Primary Examiner* — Anh D Mai
(74) *Attorney, Agent, or Firm* — Robinson Intellectual Property Law Office; Eric J. Robinson

(57) ABSTRACT

An object is to provide a semiconductor device including an oxide semiconductor with stable electric characteristics can be provided. An insulating layer having many defects typified by dangling bonds is formed over an oxide semiconductor layer with an oxygen-excess mixed region or an oxygen-excess oxide insulating layer interposed therebetween, whereby impurities in the oxide semiconductor layer, such as hydrogen or moisture (a hydrogen atom or a compound including a hydrogen atom such as $H_2O$), are moved through the oxygen-excess mixed region or oxygen-excess
(Continued)

oxide insulating layer and diffused into the insulating layer. Thus, the impurity concentration of the oxide semiconductor layer is reduced.

9 Claims, 22 Drawing Sheets

Related U.S. Application Data application No. 12/912,196, filed on Oct. 26, 2010, now abandoned.

(51) Int. Cl.
*H01L 29/66* (2006.01)
*H01L 29/423* (2006.01)
*H01L 29/51* (2006.01)

(52) U.S. Cl.
CPC ...... *H01L 29/42384* (2013.01); *H01L 29/518* (2013.01); *H01L 29/66969* (2013.01); *H01L 29/78606* (2013.01); *H01L 29/78696* (2013.01)

(56) References Cited

U.S. PATENT DOCUMENTS

| | | |
|---|---|---|
| 5,744,864 A | 4/1998 | Cillessen et al. |
| 5,847,410 A | 12/1998 | Nakajima |
| 6,294,274 B1 | 9/2001 | Kawazoe et al. |
| 6,465,285 B2 | 10/2002 | Tokuhiro et al. |
| 6,563,174 B2 | 5/2003 | Kawasaki et al. |
| 6,586,346 B1 | 7/2003 | Yamazaki et al. |
| 6,727,522 B1 | 4/2004 | Kawasaki et al. |
| 6,759,283 B2 | 7/2004 | Yasuda et al. |
| 6,852,623 B2 | 2/2005 | Park et al. |
| 6,960,812 B2 | 11/2005 | Yamazaki et al. |
| 7,049,190 B2 | 5/2006 | Takeda et al. |
| 7,061,014 B2 | 6/2006 | Hosono et al. |
| 7,061,018 B2 | 6/2006 | Tokuhiro et al. |
| 7,064,346 B2 | 6/2006 | Kawasaki et al. |
| 7,105,868 B2 | 9/2006 | Nause et al. |
| 7,141,821 B1 | 11/2006 | Yamazaki et al. |
| 7,189,654 B2 | 3/2007 | Yamazaki et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,301,211 B2 | 11/2007 | Yamazaki et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,470,607 B2 | 12/2008 | Carcia et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 7,791,074 B2 | 9/2010 | Iwasaki |
| 7,791,082 B2 | 9/2010 | Iwasaki |
| 7,829,444 B2 | 11/2010 | Yabuta et al. |
| 7,833,845 B2 | 11/2010 | Yamazaki et al. |
| 7,910,490 B2 | 3/2011 | Akimoto et al. |
| 7,932,521 B2 | 4/2011 | Akimoto et al. |
| 7,935,582 B2 | 5/2011 | Iwasaki |
| 7,956,361 B2 | 6/2011 | Iwasaki |
| 7,960,218 B2 | 6/2011 | Ma et al. |
| 7,977,675 B2 | 7/2011 | Kawamura et al. |
| 7,982,215 B2 | 7/2011 | Inoue et al. |
| 8,030,195 B2 | 10/2011 | Inoue et al. |
| 8,053,780 B2 | 11/2011 | Kanno et al. |
| 8,063,421 B2 | 11/2011 | Kang et al. |
| 8,110,436 B2 | 2/2012 | Hayashi et al. |
| 8,143,115 B2 | 3/2012 | Omura et al. |
| 8,148,245 B2 | 4/2012 | Ikisawa et al. |
| 8,148,721 B2 | 4/2012 | Hayashi et al. |
| 8,148,779 B2 | 4/2012 | Jeong et al. |
| 8,154,024 B2 | 4/2012 | Iwasaki |
| 8,164,256 B2 | 4/2012 | Sano et al. |
| 8,188,471 B2 | 5/2012 | Iwasaki et al. |
| 8,188,480 B2 | 5/2012 | Itai |
| 8,193,045 B2 | 6/2012 | Omura et al. |
| 8,203,143 B2 | 6/2012 | Imai |
| 8,247,811 B2 | 8/2012 | Morosawa et al. |
| 8,263,421 B2 | 9/2012 | Yamazaki et al. |
| 8,274,077 B2 | 9/2012 | Akimoto et al. |
| 8,304,773 B2 | 11/2012 | Shimada |
| 8,304,779 B2 | 11/2012 | Yamazaki et al. |
| 8,377,762 B2 | 2/2013 | Eguchi et al. |
| 8,384,077 B2 | 2/2013 | Yano et al. |
| 8,415,198 B2 | 4/2013 | Itagaki et al. |
| 8,440,510 B2 | 5/2013 | Yamazaki |
| 8,461,583 B2 | 6/2013 | Yano et al. |
| 8,466,463 B2 | 6/2013 | Akimoto et al. |
| 8,502,217 B2 | 8/2013 | Sato et al. |
| 8,541,944 B2 | 9/2013 | Sano et al. |
| 8,592,814 B2 | 11/2013 | Yamazaki et al. |
| 8,629,069 B2 | 1/2014 | Akimoto et al. |
| 8,654,272 B2 | 2/2014 | Yamazaki et al. |
| 8,669,550 B2 | 3/2014 | Akimoto et al. |
| 8,704,217 B2 | 4/2014 | Yano et al. |
| 8,735,229 B2 | 5/2014 | Son et al. |
| 8,785,240 B2 | 7/2014 | Watanabe |
| 8,790,959 B2 | 7/2014 | Akimoto et al. |
| 8,791,458 B2 | 7/2014 | Yamazaki et al. |
| 8,796,069 B2 | 8/2014 | Akimoto et al. |
| 8,890,152 B2 | 11/2014 | Yamazaki et al. |
| 9,035,313 B2 | 5/2015 | Jeong et al. |
| 9,082,857 B2 | 7/2015 | Yamazaki et al. |
| 9,166,055 B2 | 10/2015 | Yamazaki et al. |
| 9,218,966 B2 | 12/2015 | Honda et al. |
| 9,224,609 B2 | 12/2015 | Yamazaki et al. |
| 9,397,194 B2 | 7/2016 | Yamazaki et al. |
| 9,627,198 B2 | 4/2017 | Yamazaki et al. |
| 9,754,784 B2 | 9/2017 | Yamazaki et al. |
| 2001/0046027 A1 | 11/2001 | Tai et al. |
| 2002/0020839 A1 | 2/2002 | Yamazaki et al. |
| 2002/0056838 A1 | 5/2002 | Ogawa |
| 2002/0132454 A1 | 9/2002 | Ohtsu et al. |
| 2002/0171084 A1 | 11/2002 | Yasuda et al. |
| 2003/0107023 A1 | 6/2003 | Chae et al. |
| 2003/0189401 A1 | 10/2003 | Kido et al. |
| 2003/0218222 A1 | 11/2003 | Wager, III et al. |
| 2003/0234424 A1 | 12/2003 | Suzawa et al. |
| 2004/0038446 A1 | 2/2004 | Takeda et al. |
| 2004/0076835 A1 | 4/2004 | Watanabe |
| 2004/0077134 A1 | 4/2004 | Takayama et al. |
| 2004/0099926 A1 | 5/2004 | Yamazaki et al. |
| 2004/0112735 A1 | 6/2004 | Saigal et al. |
| 2004/0121591 A1 | 6/2004 | Ichinose et al. |
| 2004/0127038 A1 | 7/2004 | Carcia et al. |
| 2005/0011752 A1 | 1/2005 | Yamazaki et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0121700 A1 | 6/2006 | Peng et al. |
| 2006/0138399 A1 | 6/2006 | Itano et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |

(56) References Cited

U.S. PATENT DOCUMENTS

| | | |
|---|---|---|
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0263949 A1 | 11/2006 | Tsai et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0063211 A1 | 3/2007 | Iwasaki |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0167023 A1 | 7/2007 | Yamazaki et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0129933 A1 | 6/2008 | Nishida et al. |
| 2008/0166834 A1 | 7/2008 | Kim et al. |
| 2008/0182358 A1 | 7/2008 | Cowdery-Corvan et al. |
| 2008/0203387 A1 | 8/2008 | Kang et al. |
| 2008/0224133 A1 | 9/2008 | Park et al. |
| 2008/0237598 A1 | 10/2008 | Nakayama |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0299702 A1 | 12/2008 | Son et al. |
| 2008/0308796 A1 | 12/2008 | Akimoto et al. |
| 2008/0308797 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0042394 A1 | 2/2009 | Yamazaki et al. |
| 2009/0045397 A1 | 2/2009 | Iwasaki |
| 2009/0065771 A1 | 3/2009 | Iwasaki et al. |
| 2009/0068773 A1 | 3/2009 | Lai et al. |
| 2009/0072232 A1 | 3/2009 | Hayashi et al. |
| 2009/0073325 A1 | 3/2009 | Kuwabara et al. |
| 2009/0090915 A1 | 4/2009 | Yamazaki et al. |
| 2009/0114910 A1 | 5/2009 | Chang |
| 2009/0134399 A1 | 5/2009 | Sakakura et al. |
| 2009/0140438 A1 | 6/2009 | Yamazaki |
| 2009/0152506 A1 | 6/2009 | Umeda et al. |
| 2009/0152541 A1 | 6/2009 | Maekawa et al. |
| 2009/0159894 A1 | 6/2009 | Yasumatsu |
| 2009/0166616 A1 | 7/2009 | Uchiyama |
| 2009/0179199 A1 | 7/2009 | Sano et al. |
| 2009/0261325 A1 | 10/2009 | Kawamura et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2009/0325341 A1 | 12/2009 | Itagaki et al. |
| 2010/0025675 A1 | 2/2010 | Yamazaki et al. |
| 2010/0025678 A1 | 2/2010 | Yamazaki et al. |
| 2010/0035379 A1 | 2/2010 | Miyairi et al. |
| 2010/0035429 A1 | 2/2010 | Jang et al. |
| 2010/0051937 A1 | 3/2010 | Kaji et al. |
| 2010/0051940 A1 | 3/2010 | Yamazaki et al. |
| 2010/0051949 A1 | 3/2010 | Yamazaki et al. |
| 2010/0059751 A1 | 3/2010 | Takahashi et al. |
| 2010/0065844 A1 | 3/2010 | Tokunaga |
| 2010/0065851 A1 | 3/2010 | Makita |
| 2010/0072468 A1 | 3/2010 | Yamazaki et al. |
| 2010/0072469 A1 | 3/2010 | Yamazaki et al. |
| 2010/0084648 A1 | 4/2010 | Watanabe |
| 2010/0092800 A1 | 4/2010 | Itagaki et al. |
| 2010/0102313 A1 | 4/2010 | Miyairi et al. |
| 2010/0109002 A1 | 5/2010 | Itagaki et al. |
| 2010/0203673 A1 | 8/2010 | Hayashi et al. |
| 2010/0207117 A1 | 8/2010 | Sakata et al. |
| 2010/0207118 A1 | 8/2010 | Sakata et al. |
| 2010/0207119 A1 | 8/2010 | Sakata et al. |
| 2010/0213459 A1 | 8/2010 | Shimada et al. |
| 2010/0267198 A1 | 10/2010 | Yabuta et al. |
| 2010/0276685 A1 | 11/2010 | Itagaki et al. |
| 2010/0276689 A1 | 11/2010 | Iwasaki |
| 2010/0279462 A1 | 11/2010 | Iwasaki |
| 2010/0283049 A1 | 11/2010 | Sato et al. |
| 2010/0289020 A1 | 11/2010 | Yano et al. |
| 2011/0062433 A1 | 3/2011 | Yamazaki |
| 2011/0062435 A1 | 3/2011 | Yamazaki et al. |
| 2011/0068336 A1 | 3/2011 | Yamazaki et al. |
| 2011/0068388 A1 | 3/2011 | Yamazaki et al. |
| 2011/0070693 A1 | 3/2011 | Yamazaki et al. |
| 2011/0079778 A1 | 4/2011 | Yamazaki et al. |
| 2011/0084273 A1 | 4/2011 | Yamazaki et al. |
| 2011/0089416 A1 | 4/2011 | Yamazaki et al. |
| 2011/0104851 A1 | 5/2011 | Akimoto et al. |
| 2011/0121290 A1 | 5/2011 | Akimoto et al. |
| 2012/0168750 A1 | 7/2012 | Hayashi et al. |
| 2013/0140175 A1 | 6/2013 | Yano et al. |
| 2013/0146452 A1 | 6/2013 | Yano et al. |
| 2013/0153877 A1 | 6/2013 | Eguchi et al. |
| 2014/0113407 A1 | 4/2014 | Yamazaki et al. |
| 2014/0138681 A1 | 5/2014 | Yamazaki et al. |
| 2015/0084048 A1 | 3/2015 | Hayashi et al. |
| 2015/0303280 A1 | 10/2015 | Yamazaki et al. |

FOREIGN PATENT DOCUMENTS

| | | |
|---|---|---|
| EP | 0730298 A | 9/1996 |
| EP | 1209748 A | 5/2002 |
| EP | 1592053 A | 11/2005 |
| EP | 1737044 A | 12/2006 |
| EP | 1770788 A | 4/2007 |
| EP | 1933293 A | 6/2008 |
| EP | 1976018 A | 10/2008 |
| EP | 1995787 A | 11/2008 |
| EP | 1998373 A | 12/2008 |
| EP | 1998374 A | 12/2008 |
| EP | 1998375 A | 12/2008 |
| EP | 2105967 A | 9/2009 |
| EP | 2141743 A | 1/2010 |
| EP | 2159845 A | 3/2010 |
| EP | 2192437 A | 6/2010 |
| EP | 2226847 A | 9/2010 |
| EP | 2339639 A | 6/2011 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 03-231472 A | 10/1991 |
| JP | 05-251705 A | 9/1993 |
| JP | 05-331619 A | 12/1993 |
| JP | 08-264794 A | 10/1996 |
| JP | 08-298260 A | 11/1996 |
| JP | 08-338998 A | 12/1996 |
| JP | 09-090331 A | 4/1997 |
| JP | 11-505377 | 5/1999 |
| JP | 11-274504 A | 10/1999 |
| JP | 2000-044236 A | 2/2000 |

(56) References Cited

FOREIGN PATENT DOCUMENTS

| | | |
|---|---|---|
| JP | 2000-114532 A | 4/2000 |
| JP | 2000-150900 A | 5/2000 |
| JP | 2002-076356 A | 3/2002 |
| JP | 2002-289859 A | 10/2002 |
| JP | 2003-037270 A | 2/2003 |
| JP | 2003-086000 A | 3/2003 |
| JP | 2003-086808 A | 3/2003 |
| JP | 2003-207808 A | 7/2003 |
| JP | 2003-264148 A | 9/2003 |
| JP | 2004-103957 A | 4/2004 |
| JP | 2004-273614 A | 9/2004 |
| JP | 2004-273732 A | 9/2004 |
| JP | 2004-288864 A | 10/2004 |
| JP | 2005-191077 A | 7/2005 |
| JP | 2006-165527 A | 6/2006 |
| JP | 2006-165528 A | 6/2006 |
| JP | 2006-165529 A | 6/2006 |
| JP | 2006-165531 A | 6/2006 |
| JP | 2007-073560 A | 3/2007 |
| JP | 2007-073698 A | 3/2007 |
| JP | 2007-096055 A | 4/2007 |
| JP | 2007-103918 A | 4/2007 |
| JP | 2007-115808 A | 5/2007 |
| JP | 2007-123861 A | 5/2007 |
| JP | 2007-157916 A | 6/2007 |
| JP | 2007-158304 A | 6/2007 |
| JP | 2007-173489 A | 7/2007 |
| JP | 2007-194594 A | 8/2007 |
| JP | 2007-250983 A | 9/2007 |
| JP | 2007-258223 A | 10/2007 |
| JP | 2007-311404 A | 11/2007 |
| JP | 2008-053356 A | 3/2008 |
| JP | 2008-060419 A | 3/2008 |
| JP | 2008-085048 A | 4/2008 |
| JP | 2008-121034 A | 5/2008 |
| JP | 2008-141119 A | 6/2008 |
| JP | 2008-166716 A | 7/2008 |
| JP | 2008-218495 A | 9/2008 |
| JP | 2008-281988 A | 11/2008 |
| JP | 2008-311342 A | 12/2008 |
| JP | 2009-010362 A | 1/2009 |
| JP | 2009-081413 A | 4/2009 |
| JP | 2009-099944 A | 5/2009 |
| JP | 2009-099953 A | 5/2009 |
| JP | 2009-135380 A | 6/2009 |
| JP | 2009-135436 A | 6/2009 |
| JP | 2009-141002 A | 6/2009 |
| JP | 2009-158663 A | 7/2009 |
| JP | 2009-212497 A | 9/2009 |
| JP | 2009-224479 A | 10/2009 |
| JP | 2009-253204 A | 10/2009 |
| JP | 2009-260002 A | 11/2009 |
| JP | 2010-016348 A | 1/2010 |
| JP | 2010-062229 A | 3/2010 |
| JP | 2010-067954 A | 3/2010 |
| JP | 2010-182818 A | 8/2010 |
| KR | 1999-0057541 A | 7/1999 |
| KR | 2004-0079516 A | 9/2004 |
| KR | 2007-0108969 A | 11/2007 |
| KR | 2008-0029100 A | 4/2008 |
| KR | 2008-0079906 A | 9/2008 |
| KR | 2008-0104588 A | 12/2008 |
| KR | 2009-0018587 A | 2/2009 |
| KR | 2009-0089450 A | 8/2009 |
| KR | 2009-0101828 A | 9/2009 |
| TW | 588209 | 5/2004 |
| TW | 200915579 | 4/2009 |
| TW | 200941722 | 10/2009 |
| TW | 200941727 | 10/2009 |
| WO | WO-2004/070820 | 8/2004 |
| WO | WO-2004/114391 | 12/2004 |
| WO | WO-2007/029844 | 3/2007 |
| WO | WO-2007/040194 | 4/2007 |
| WO | WO-2007/119386 | 10/2007 |
| WO | WO-2008/023553 | 2/2008 |
| WO | WO-2008/069056 | 6/2008 |
| WO | WO-2008/069255 | 6/2008 |
| WO | WO-2008/069286 | 6/2008 |
| WO | WO-2008/105250 | 9/2008 |
| WO | WO-2008/126879 | 10/2008 |
| WO | WO-2008/139859 | 11/2008 |
| WO | WO-2008/149873 | 12/2008 |
| WO | WO-2009/031634 | 3/2009 |
| WO | WO-2009/041544 | 4/2009 |
| WO | WO-2009/041713 | 4/2009 |
| WO | WO-2009/072532 | 6/2009 |
| WO | WO-2009/072533 | 6/2009 |
| WO | WO-2009/075281 | 6/2009 |
| WO | WO-2009/081885 | 7/2009 |
| WO | WO-2009/084537 | 7/2009 |
| WO | WO-2009/087943 | 7/2009 |
| WO | WO-2010/029865 | 3/2010 |
| WO | WO-2010/053060 | 5/2010 |
| WO | WO-2010/058746 | 5/2010 |
| WO | WO-2010/071183 | 6/2010 |
| WO | WO-2011/043163 | 4/2011 |

OTHER PUBLICATIONS

Written Opinion (Application No. PCT/JP2010/067997) dated Nov. 22, 2010.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review, A), May 1, 1984, vol. 29, No. 5, pp. 2957-2959.

Kimizuka.N. et al., "SPINEL,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu or Zn] at Temperatures over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Li.C et al., "Modulated Structures of Homologous Compounds InMO3(ZnO)m (M=In, Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

(56) References Cited

OTHER PUBLICATIONS

Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Lee.H et al., "Current Status of, Challenges to, and Perspective View of AM-OLED ", IDW '06 : Proceedings of the 13th International Display Workshops, Dec. 7, 2006, pp. 663-666.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.
Park.S et al., "Challenge to Future Displays: Transparent AM-OLED Driven by Peald Grown ZnO TFT", IMID '07 Digest, 2007, pp. 1249-1252.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Miyasaka.M, "SUFTLA Flexible Microelectronics on Their Way to Business", SID Digest '07 : SID International Symposium Digest of Technical Papers, 2007, vol. 38, pp. 1673-1676.
Kurokawa.Y et al., "UHF RFCPUS on Flexible and Glass Substrates for Secure RFID Systems", Journal of Solid-State Circuits , 2008, vol. 43, No. 1, pp. 292-299.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Park.J et al., "Amorphous Indium-Gallium-Zinc Oxide TFTS and Their Application for Large Size AMOLED", AM-FPD '08 Digest of Technical Papers, Jul. 2, 2008, pp. 275-278.
Takahashi.M et al., "Theoretical Analysis of IgZO Transparent Amorphous Oxide Semiconductor", IDW '08 : Proceedings of the 15th International Display Workshops, Dec. 3, 2008, pp. 1637-1640.
Sakata.J et al., "Development of 4.0-IN. AMOLED Display With Driver Circuit Using Amorphous In—Ga—Zn-Oxide TFTS", IDW '09 : Proceedings of the 16th International Display Workshops, 2009, pp. 689-692.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Ohara.H et al., "21.3:4.0 IN. QVGA AMOLED Display Using In—Ga—Zn-Oxide TFTS With a Novel Passivation Layer", SID Digest '09 : SID International Symposium Digest of Technical Papers, May 31, 2009, pp. 284-287.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Park.J et al., "High performance amorphous oxide thin film transistors with self-aligned top-gate structure", IEDM 09: Technical Digest of International Electron Devices Meeting, Dec. 7, 2009, pp. 191-194.
Nakamura.M, "Synthesis of Homologous Compound with New Long-Period Structure", NIRIM Newsletter, Mar. 1, 1995, vol. 150, pp. 1-4.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Orita.M et al., "Amorphous transparent conductive oxide InGaO3(ZnO)m (m<4):a Zn4s conductor", Philosophical Magazine, 2001, vol. 81, No. 5, pp. 501-515.
Janotti.A et al., "Oxygen Vacancies in ZnO", Appl. Phys. Lett. (Applied Physics Letters) , 2005, vol. 87, pp. 122102-1-122102-3.
Clark.S et al., "First Principles Methods Using CASTEP", Zeitschrift fur Kristallographie, 2005, vol. 220, pp. 567-570.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Park.J et al., "Electronic Transport Properties of Amorphous Indium-Gallium-Zinc Oxide Semiconductor Upon Exposure to Water", Appl. Phys. Lett. (Applied Physics Letters) , 2008, Vol, 92, pp. 072104-1-072104-3.

(56) References Cited

OTHER PUBLICATIONS

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Oba.F et al., "Defect energetics in ZnO: A hybrid Hartree-Fock density functional study", Phys. Rev. B (Physical Review. B), 2008, vol. 77, pp. 245202-1-245202-6.
Kim.S et al., "High-Performance oxide thin film transistors passivated by various gas plasmas", 214th ECS Meeting, 2008, No. 2317, ECS.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Son.K et al., "42.4L: Late-News Paper: 4 Inch QVGA AMOLED Driven by the Threshold Voltage Controlled Amorphous GiZo (Ga2O3—In2O3—ZnO) TFT", SID Digest '08 : SID International Symposium Digest of Technical Papers, May 20, 2008, vol. 39, pp. 633-636.
Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Mo.Y et al., "Amorphous Oxide TFT Backplanes for Large Size AMOLED Displays", IDW '08 : Proceedings of the 6th International Display Workshops, Dec. 3, 2008, pp. 581-584.
Asakuma.N. et al., "Crystallization and Reduction of Sol-Gel-Derived Zinc Oxide Films by Irradiation With Ultraviolet LAMP", Journal of Sol-Gel Science and Technology, 2003, vol. 26, pp. 181-184.
Fortunato.E et al., "Wide-Bandgap High-Mobility ZnO Thin-Film Transistors Produced At Room Temperature", Appl. Phys. Lett. (Applied Physics Letters) , Sep. 27, 2004, vol. 85, No. 13, pp. 2541-2543.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Nakamura.M et al., "Syntheses and crystal structures of new homologous compounds, indium iron zinc oxides (InFeO3(ZnO)m) (m natural number) and related compounds", Kotai Butsuri (Solid State Physics), 1993, vol. 28, No. 5, pp. 317-327.
Ohta.Y et al., "Amorphous In—Ga—Zn—O TFT-LCDs with High Reliability", IDW '09 : Proceedings of the 16th International Display Workshops, Dec. 9, 2009, vol. 3, pp. 1685-1688.
Dehuff.N et al., "Transparent thin-film transistors with zinc indium oxide channel layer", J. Appl. Phys. (Journal of Applied Physics) , 2005, vol. 97, pp. 064505-1-064505-5.
Honda.S et al., "Oxygen content of indium tin oxide films fabricated by reactive sputtering", J. Vac. Sci. Technol. A (Journal of Vacuum Science & Technology A), 1995, pp. 1100-1103.
Takeda.K et al., "Thermal annealing effects of dangling bonds in hydrogenated polymorphous silicon", J. Appl. Phys. (Journal of Applied Physics, 2008, vol. 104, pp. 053715-1-053715-6.
Taiwanese Office Action (Application No. 099136939) dated Nov. 17, 2015.
European Search Report (Application No. 10826518.2) dated Aug. 8, 2016.
Korean Office Action (Application No. 2012-7013500) dated Dec. 19, 2016.
Taiwanese Office Action (Application No. 105114941) dated Dec. 29, 2016.
Chinese Office Action (Application No. 201510142874.5) dated May 27, 2017.
Korean Office Action (Application No. 2012-7013500) dated Aug. 29, 2017.
European Office Action (Application No. 10826518.2) dated Oct. 19, 2018.

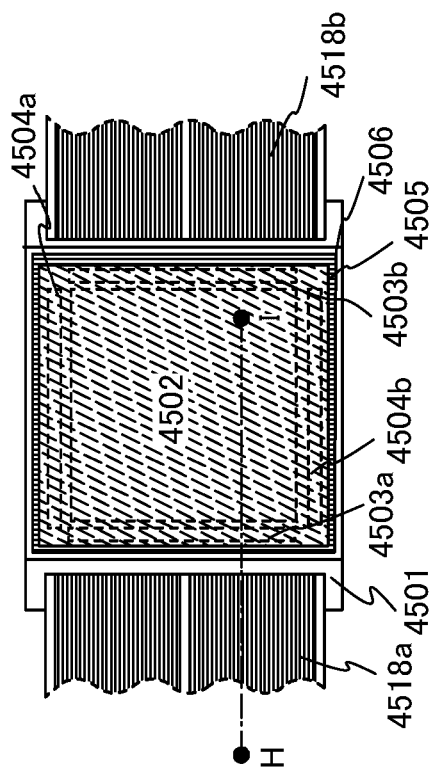
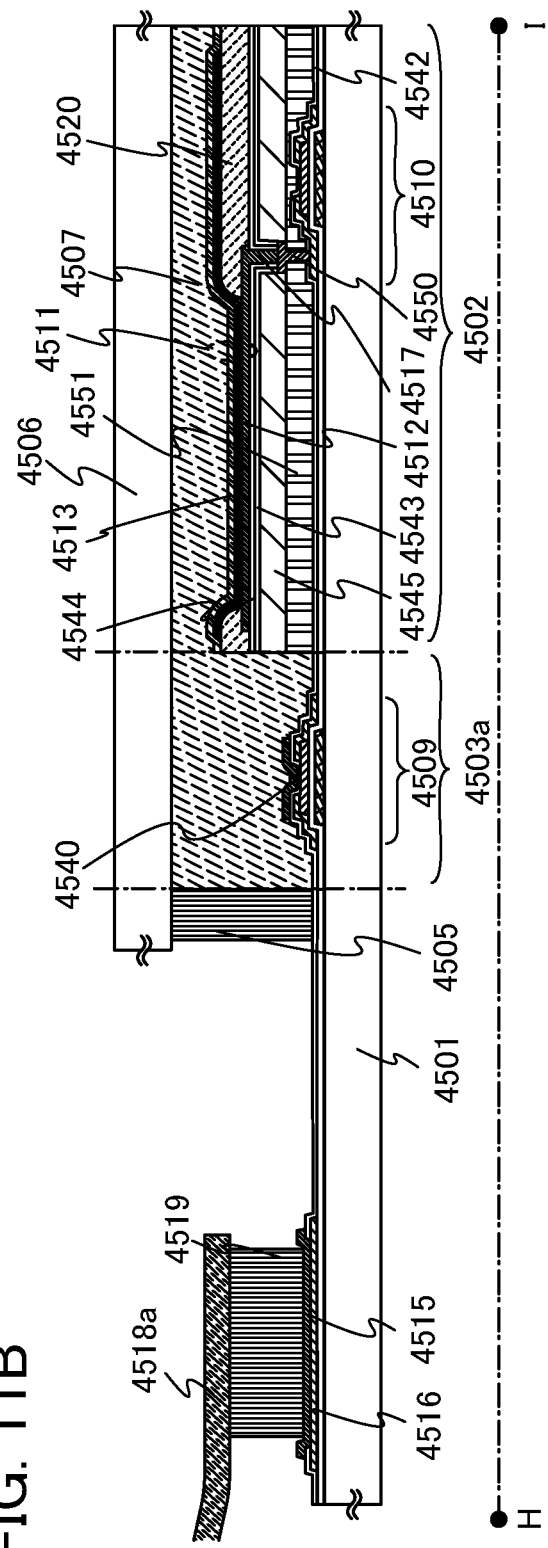
FIG. 11A
FIG. 11B minority carrier is zero

SEMICONDUCTOR DEVICE HAVING A FIRST REGION COMPRISING SILICON, OXYGEN AND AT LEAST ONE METAL ELEMENT FORMED BETWEEN AN OXIDE SEMICONDUCTOR LAYER AND AN INSULATING LAYER

TECHNICAL FIELD

The present invention relates to a semiconductor device using an oxide semiconductor and a manufacturing method thereof.

Note that the semiconductor device in this specification refers to all the devices which can operate by using semiconductor characteristics, and an electro-optical device, a semiconductor circuit, and an electronic device are all semiconductor devices.

BACKGROUND ART

A technique of forming a thin film transistor (TFT) by using a thin semiconductor film that is formed over a substrate having an insulating surface has attracted attention. A thin film transistor is used for a display device typified by a liquid crystal television. Besides a silicon-based semiconductor material which is known as a material for a semiconductor thin film applicable to a thin film transistor, an oxide semiconductor has attracted attention.

As a material for the oxide semiconductor, zinc oxide and a material containing zinc oxide as its component are known. In addition, a thin film transistor including an amorphous oxide (oxide semiconductor) electron carrier concentration of which is lower than $10^{18}/cm^3$ is disclosed (see Patent Documents 1 to 3).

REFERENCE

[Patent Document 1] Japanese Published Patent Application No. 2006-165527
[Patent Document 1] Japanese Published Patent Application No. 2006-165528
[Patent Document 1] Japanese Published Patent Application No. 2006-165529

DISCLOSURE OF INVENTION

However, a deviation from the stoichiometric composition in an oxide semiconductor arises in a thin film formation process. For example, electrical conductivity of an oxide semiconductor is changed due to excess and deficiency of oxygen. Further, hydrogen or moisture that enters the oxide semiconductor thin film during the formation of the thin film forms an oxygen-hydrogen (O—H) bond and functions as an electron donor, which is a factor of change in electrical conductivity. Furthermore, since an O—H is a polar molecule, it causes variation in characteristics of an active device such as a thin film transistor formed using an oxide semiconductor.

In view of such problems, it is an object of an embodiment of the present invention to provide a semiconductor device including an oxide semiconductor with stable electric characteristics.

In order to prevent variation in electric characteristics of the thin film transistor including an oxide semiconductor layer, impurities such as hydrogen, moisture, hydroxyl, or hydride (also referred to as a hydrogen compound) which cause the variation are removed from the oxide semiconductor layer.

An insulating layer having many defects typified by dangling bonds is formed over an oxide semiconductor layer with an oxygen-excess mixed region or an oxygen-excess oxide insulating layer interposed therebetween, whereby impurities in the oxide semiconductor layer, such as hydrogen or moisture (a hydrogen atom or a compound including a hydrogen atom such as $H_2O$), are moved through the oxygen-excess mixed region or the oxygen-excess oxide insulating layer and diffused into the insulating layer having defects. Thus, the impurity concentration of the oxide semiconductor layer is reduced.

Since an insulating layer having many defects has a high binding energy to hydrogen or moisture (a hydrogen atom or a compound including a hydrogen atom such as $H_2O$) and these impurities are stabilized in the insulating layer having many defects, these impurities can be diffused from the oxide semiconductor layer into the insulating layer having defects, whereby these impurities can be removed from the oxide semiconductor layer.

Further, the mixed region or the oxide insulating layer, which is provided between the oxide semiconductor layer and the insulating layer having defects, includes excess oxygen, and thus have many oxygen dangling bonds as defects and has high binding energy to impurities such as hydrogen or moisture (a hydrogen atom or a compound including a hydrogen atom such as $H_2O$). Therefore, when the impurities are diffused from the oxide semiconductor layer into the insulating layer having defects, the oxygen-excess mixed region or the oxygen-excess oxide insulating layer functions to facilitate the diffusion. On the other hand, when the impurities which have been removed from the oxide semiconductor layer and diffused into the insulating layer having defects move back toward the oxide semiconductor layer, the oxygen-excess mixed region or the oxygen-excess oxide insulating layer functions as a protective layer (a barrier layer) which is bound to and stabilizes the impurities so as to prevent the impurities from entering the oxide semiconductor layer.

Thus, impurities such as hydrogen or moisture (a hydrogen atom or a compound including a hydrogen atom such as $H_2O$) in the oxide semiconductor layer are diffused into the oxygen-excess mixed region or the oxygen-excess oxide insulating layer.

Thus, the oxygen-excess mixed region or the oxygen-excess oxide insulating layer removes impurities, such as hydrogen, moisture, hydroxyl, or hydride (also referred to as a hydrogen compound) which cause variation, from the oxide semiconductor layer, and further functions as a barrier layer which prevents the impurities which have been diffused into the insulating layer having defects from entering the oxide semiconductor layer again. Consequently, the impurity concentration of the oxide semiconductor layer can be kept low.

From the above, a thin film transistor including an oxide semiconductor layer in which impurities such as hydrogen, moisture, hydroxyl, or hydride (also referred to as a hydrogen compound) which cause variation are reduced has stable electric characteristics, and a semiconductor device including the thin film transistor can realize high reliability.

The mixed region is a mixed region of materials included in the oxide semiconductor layer and in the overlying insulating layer having defects. By providing the mixed region, an interface between the oxide semiconductor layer and the insulating layer having defects is not clearly defined;

thus, diffusion of hydrogen from the oxide semiconductor layer into the insulating layer having defects is facilitated. For example, when a silicon oxide layer is used as the insulating layer having defects, the mixed region includes oxygen, silicon, and at least one of the metal elements included in the oxide semiconductor layer. As the oxygen-excess oxide insulating layer, a silicon oxide layer ($SiO_{2+x}$, where x is preferably equal to or greater than 0 and less than 3) can be used. The thickness of the mixed region or the oxide insulating layer may be 0.1 nm to 30 nm (preferably, 2 nm to 10 nm).

The oxide semiconductor layer, the oxygen-excess mixed region, the oxygen-excess oxide insulating layer, and the insulating layer having defects are preferably formed in a film-formation chamber (a process chamber) in which the impurity concentration is lowered by evacuation with a capture-type vacuum pump such as a cryopump. As a capture-type vacuum pump, for example, a cryopump, an ion pump, or a titanium sublimation pump is preferably used. The capture-type vacuum pump functions to reduce the amount of hydrogen, water, hydroxyl, or hydride in the oxide semiconductor layer, the oxygen-excess mixed region, the oxygen-excess oxide insulating layer, and the insulating layer having defects.

Each of sputtering gases used in the formation of the oxide semiconductor layer, the oxygen-excess mixed region, the oxygen-excess oxide insulating layer, and the insulating layer having defects is preferably a high-purity gas in which impurities such as hydrogen, water, hydroxyl, or hydride are reduced to such a degree that the concentration thereof can be expressed by the unit ppm or ppb.

In the thin film transistor disclosed in this specification, a channel formation region is formed in the oxide semiconductor layer, in which the hydrogen is set equal to or less than $5 \times 10^{19}/cm^3$, preferably equal to or less than $5 \times 10^{18}/cm^3$, and more preferably equal to or less than $5 \times 10^{17}/cm^3$; hydrogen or O—H group is removed; and the carrier concentration is equal to or less than $5 \times 10^{14}/cm^3$, preferably equal to or less than $5 \times 10^{12}/cm^3$.

The energy gap of the oxide semiconductor is set to be equal to or greater than 2 eV, preferably equal to or greater than 2.5 eV, more preferably equal to or greater than 3 eV to reduce as much impurities, such as hydrogen which form donors, as possible, and the carrier concentration of the oxide semiconductor is set to equal to or less than $1 \times 10^{14}/cm^3$, preferably equal to or less than $1 \times 10^{12}/cm^3$.

When the thus purified oxide semiconductor is used for a channel formation region of a thin film transistor, even in the case where the channel width is 10 mm, the drain current of equal to or less than $1 \times 10^{-13}$ A is obtained at drain voltages of 1 V and 10 V and gate voltage in the range of −5 V to −20 V.

An embodiment of the present invention disclosed in this specification is a semiconductor device including: a gate electrode layer over a substrate; a gate insulating layer over the gate electrode layer; an oxide semiconductor layer over the gate insulating layer; a source electrode layer and a drain electrode layer over the oxide semiconductor layer; and an insulating layer having defects which is over the oxide semiconductor layer, the source electrode layer, and the drain electrode layer, and which is in contact with part of the oxide semiconductor layer; in which an oxygen-excess oxide insulating layer is provided between the oxide semiconductor layer and the insulating layer having defects.

Another embodiment of the present invention disclosed in this specification is a semiconductor device including: a gate electrode layer over a substrate; a gate insulating layer over the gate electrode layer; an oxide semiconductor layer over the gate insulating layer; a source electrode layer and a drain electrode layer over the oxide semiconductor layer; and an insulating layer having defects which is over the source electrode layer, and the drain electrode layer, and which is in contact with part of the oxide semiconductor layer; in which an oxygen-excess mixed region is provided at an interface between the oxide semiconductor layer and the insulating layer having defects; in which the insulating layer having defects includes silicon; and in which the oxygen-excess mixed region includes oxygen, silicon, and at least one of the metal elements included in the oxide semiconductor layer.

In the above structures, a protective insulating layer which covers the insulating layer having defects may be provided.

Another embodiment of the present invention disclosed in this specification is a method for manufacturing a semiconductor device, including: forming a gate electrode layer and a gate insulating layer which covers the gate electrode layer over a substrate and introducing the substrate into a process chamber under reduced pressure; introducing a sputtering gas from which hydrogen and moisture are removed while removing moisture remaining in the process chamber; forming an oxide semiconductor layer over the gate insulating layer using a metal oxide target provided in the process chamber in which moisture is removed; forming a source electrode layer and a drain electrode layer over the oxide semiconductor layer; forming an oxygen-excess oxide insulating layer which is over the source electrode layer and the drain electrode layer and which is in contact with the oxide semiconductor layer by a sputtering method; forming an insulating layer having defects over the oxygen-excess oxide insulating layer by a sputtering method; and heating the substrate to make hydrogen or moisture included in the oxide semiconductor layer move through the oxygen-excess oxide insulating layer and diffuse into the insulating layer having defects.

Another embodiment of the present invention disclosed in this specification is a method for manufacturing a semiconductor device, including: forming a gate electrode layer and a gate insulating layer which covers the gate electrode layer over a substrate and introducing the substrate into a process chamber under reduced pressure; introducing a sputtering gas from which hydrogen and moisture are removed while removing moisture remaining in the process chamber; forming an oxide semiconductor layer over the gate insulating layer using a metal oxide target provided in the process chamber in which moisture is removed; forming a source electrode layer and a drain electrode layer over the oxide semiconductor layer; forming an oxygen-excess mixed region which is in contact with the oxide semiconductor layer, and an insulating layer having defects which is over the source electrode layer and the drain electrode layer and which overlaps with the oxide semiconductor layer with the oxygen-excess mixed region between the insulating layer having defects and the oxide semiconductor layer, by a sputtering method; and heating the substrate to make hydrogen or moisture included in the oxide semiconductor layer move through the oxygen-excess mixed region and diffuse into the insulating layer having defects.

In the above structures, the heat treatment for making impurities such as hydrogen or moisture included in the oxide semiconductor layer diffuse into the insulating layer having defects through the oxygen-excess mixed region or the oxygen-excess oxide insulating layer may be performed after or while a protective insulating layer is formed over the insulating layer having defects (at least over a portion of the insulating layer having defects which overlaps with a channel formation region in the oxide semiconductor layer). The heat treatment is performed at 100° C. to 400° C. (or 150° C. to 400° C.).

In the above methods for manufacturing a semiconductor device, as the target for forming the oxide semiconductor film, a target including zinc oxide as a main component can be used. Alternatively, metal oxide including indium, gallium, or zinc can be used as the target.

In the above methods for manufacturing a semiconductor device, the insulating layer having defects may be a silicon oxide film. As a target including silicon for forming the silicon oxide film, a silicon target or a synthetic quartz target can be used.

With any one of the above structures, at least one of the above objects can be achieved.

Note that a thin film of $InMO_3(ZnO)_m$ (m>0) is used as an oxide semiconductor layer and a thin film transistor is formed using the thin film as an oxide semiconductor layer. Note that M represents one or more metal elements selected from Ga, Fe, Ni, Mn, and Co. For example, M may be Ga or may include any of the above metal elements in addition to Ga; for example, M may be Ga and Ni or Ga and Fe. Moreover, in the above oxide semiconductor, in some cases, a transition metal element such as Fe or Ni or oxide of the transition metal is included as an impurity element in addition to a metal element included as M. In this specification, among the oxide semiconductor layers whose composition formulas are represented by $InMO_3(ZnO)_m$ (m>0), an oxide semiconductor which includes Ga as M is referred to as an In—Ga—Zn—O-based oxide semiconductor, and a thin film of the In—Ga—Zn—O-based oxide semiconductor is also referred to as an In—Ga—Zn—O-based film.

As metal oxide applicable to the oxide semiconductor layer, any of the following oxide semiconductors can be applied besides the above: In—Sn—O-based, In—Sn—Zn—O-based, In—Al—Zn—O-based, Sn—Ga—Zn—O-based, Al—Ga—Zn—O-based, Sn—Al—Zn—O-based, In—Zn—O-based, Sn—Zn—O-based, Al—Zn—O-based, In—O-based, Sn—O-based, and Zn—O-based metal oxide. Silicon may be included in the oxide semiconductor layer formed using the above metal oxide.

The oxide semiconductor is preferably an oxide semiconductor containing In, more preferably an oxide semiconductor containing In and Ga. In order to obtain an i-type (intrinsic) oxide semiconductor layer, dehydration or dehydrogenation is effective.

Further, an oxide conductive layer may be formed between the oxide semiconductor layer and the source electrode layer and the drain electrode layer. The oxide conductive layer and the metal layer for forming the source and drain electrode layers can be formed successively.

Since a thin film transistor is easily broken due to static electricity or the like, a protective circuit for protecting the thin film transistor for a pixel portion is preferably provided over the same substrate as a gate line or a source line. The protective circuit is preferably formed using a non-linear element including an oxide semiconductor layer.

Note that the ordinal numbers such as first and second in this specification are used for convenience and do not denote the order of steps and the stacking order of layers. In addition, the ordinal numbers in this specification do not denote particular names which specify the present invention.

A semiconductor device including an oxide semiconductor with stable electric characteristics can be provided.

BRIEF DESCRIPTION OF DRAWINGS

FIGS. 11A and 11B illustrate a semiconductor device.

BEST MODE FOR CARRYING OUT THE INVENTION

Figure 1A:
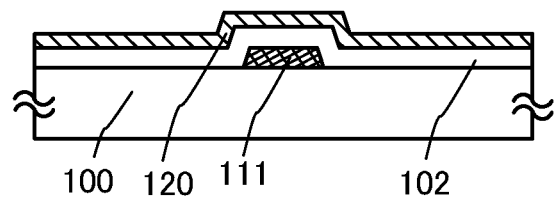
FIGS. 1A to 1E illustrate a semiconductor device and a manufacturing method thereof.

Hereinafter, embodiments of the present invention will be described in detail with reference to the accompanying drawings. Note that the present invention is not limited to the following description and it will be readily appreciated by those skilled in the art that modes and details can be modified in various ways. Accordingly, the present invention should not be construed as being limited to the description of the embodiments to be given below.

Embodiment 1

In this embodiment, an embodiment of a semiconductor device and a manufacturing method thereof will be described with reference to FIGS. 1A to 1E. The semiconductor device described in this embodiment is a thin film transistor.

FIGS. 1A to 1E illustrate an example of a cross-sectional structure of a semiconductor device. A thin film transistor 110 illustrated in FIGS. 1A to 1E has one type of a bottom-gate structure and is also referred to as an inverted staggered thin film transistor.

The thin film transistor 110 illustrated in FIGS. 1A to 1E includes, over a substrate 100 having an insulating surface, a gate electrode layer 111, a gate insulating layer 102, an oxide semiconductor layer 112, an oxygen-excess mixed region 119, a source electrode layer 115a, and a drain electrode layer 115b. In addition, an insulating layer 116 having defects which covers the thin film transistor 110 and overlaps with the oxide semiconductor layer 112 with the oxygen-excess mixed region 119 therebetween is provided, and a protective insulating layer 103 is additionally provided over the insulating layer 116 having defects.

Since the oxygen-excess mixed region 119 and the insulating layer 116 having defects have a high binding energy to hydrogen or moisture (a hydrogen atom or a compound including a hydrogen atom such as $H_2O$) and these impurities are stabilized in the oxygen-excess mixed region 119 and the insulating layer 116 having defects, these impurities can be diffused from the oxide semiconductor layer into the oxygen-excess mixed region 119 and the insulating layer 116 having defects, whereby these impurities can be removed from the oxide semiconductor layer. Further, the oxygen-excess mixed region 119 functions as a barrier layer against impurities which have been diffused into the insulating layer 116 having defects to prevent the impurities from entering the oxide semiconductor layer 112 again; thus, the impurity concentration of the oxide semiconductor layer 112 can be kept low. Accordingly, the thin film transistor 110 including the oxide semiconductor layer 112 in which impurities such as hydrogen, moisture, hydroxyl, or hydride (also referred to as a hydrogen compound) which cause variation are reduced is a highly reliable thin film transistor with stable electric characteristics.

Figure 19:
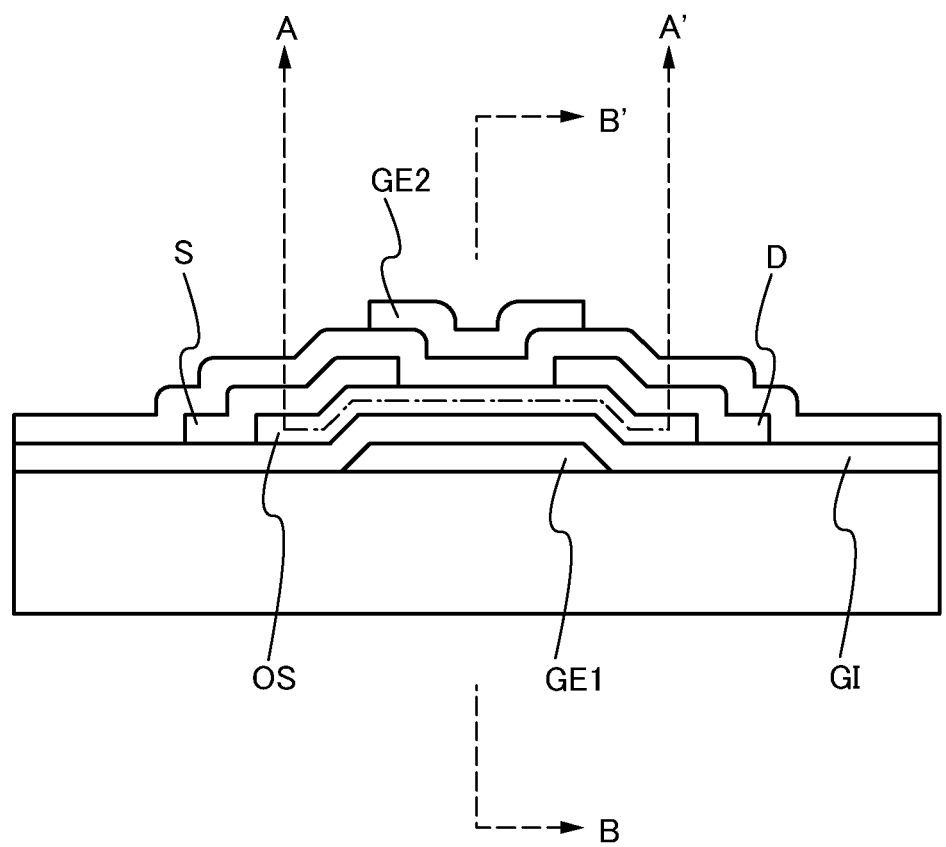
FIG. 19 is a longitudinal cross-sectional view of an inverted staggered thin film transistor including an oxide semiconductor.

FIG. 19 is a longitudinal cross-sectional view of an inverted staggered thin film transistor including an oxide semiconductor. An oxide semiconductor layer (OS) is provided over a gate electrode (GE1) with a gate insulating film (GI) interposed therebetween, and a source electrode (S) and a drain electrode (D) are provided thereover.

Figure 20A:
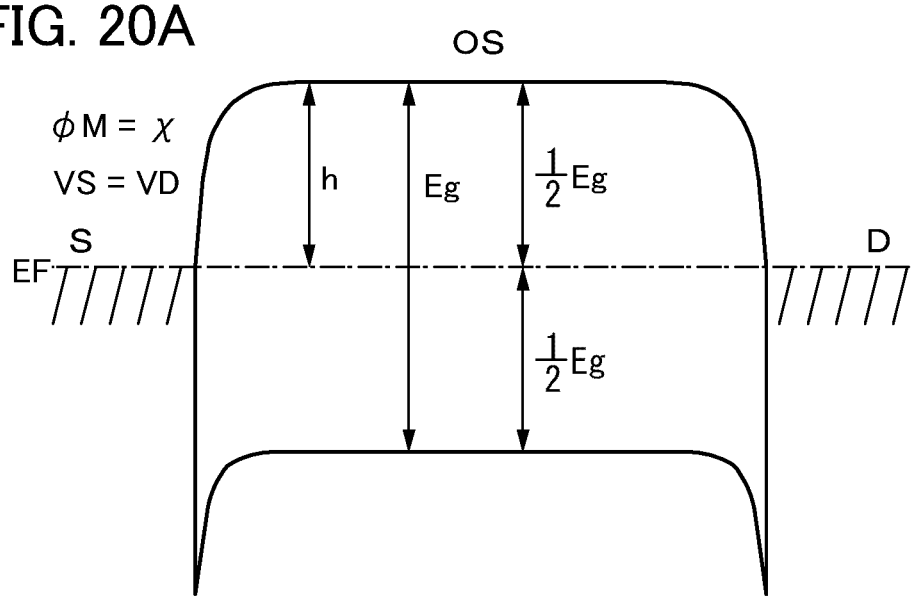
FIGS. 20A and 20B are energy band diagrams (schematic diagrams) along A-A' section illustrated in FIG. 19.
Figure 20B:
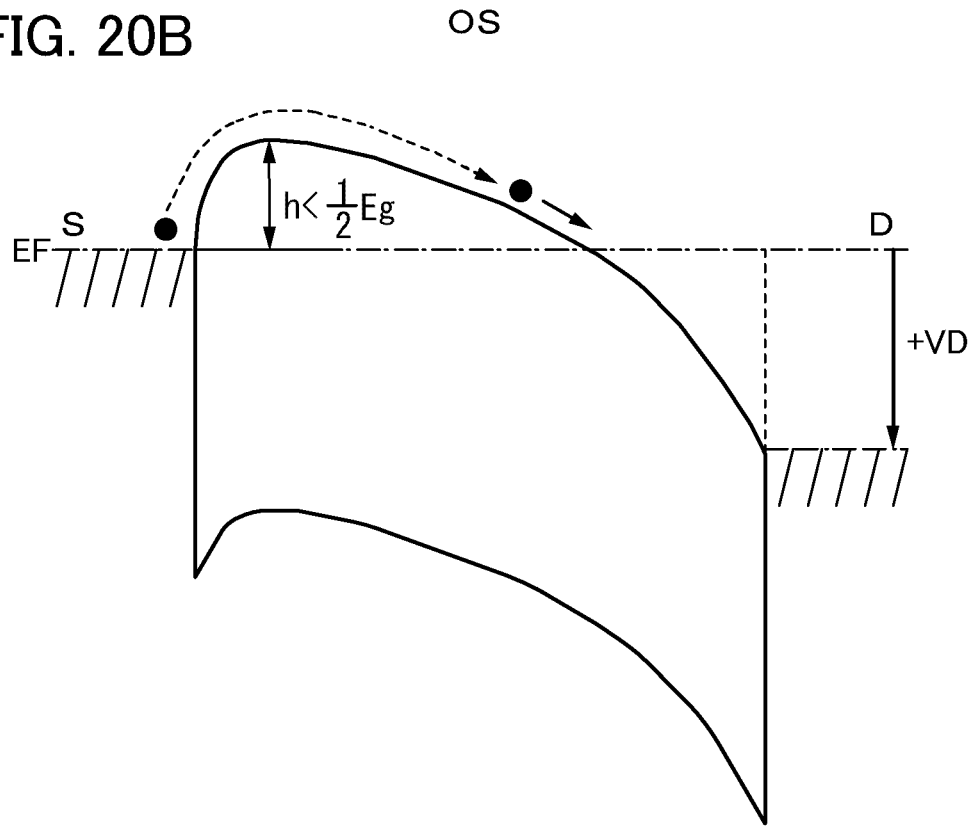

FIGS. 20A and 20B are energy band diagrams (schematic diagrams) along A-A' section illustrated in FIG. 19. FIG. 20A illustrates the case where the potential of voltage applied to the source is equal to the potential of voltage applied to the drain (VD=0 V), and FIG. 20B illustrates the case where a positive potential with respect to the source is applied to the drain (VD>0).

Figure 21A:
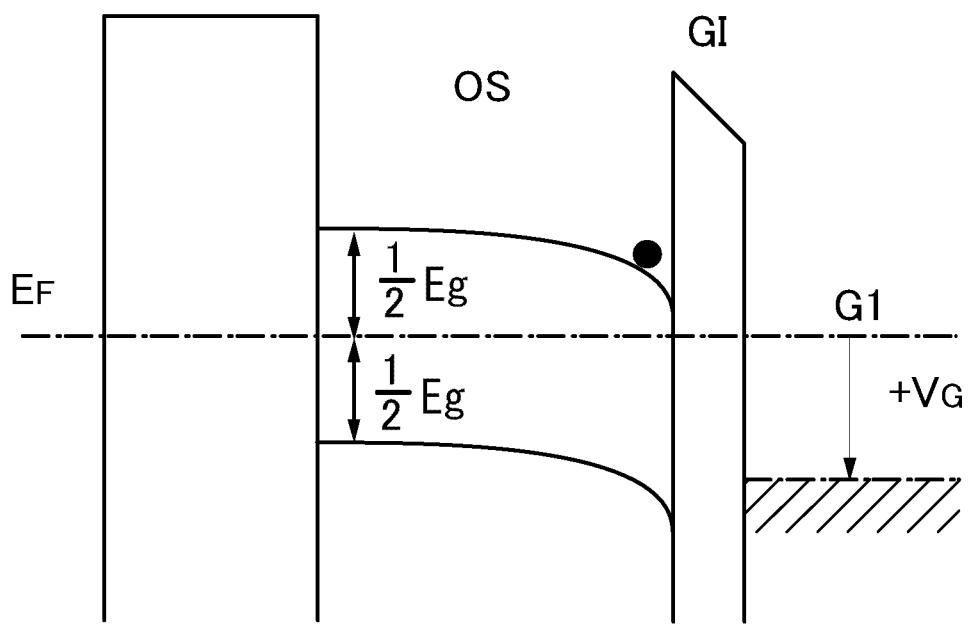
FIG. 21A shows a state in which a positive potential (+VG) is applied to a gate (G1)
Figure 21B:
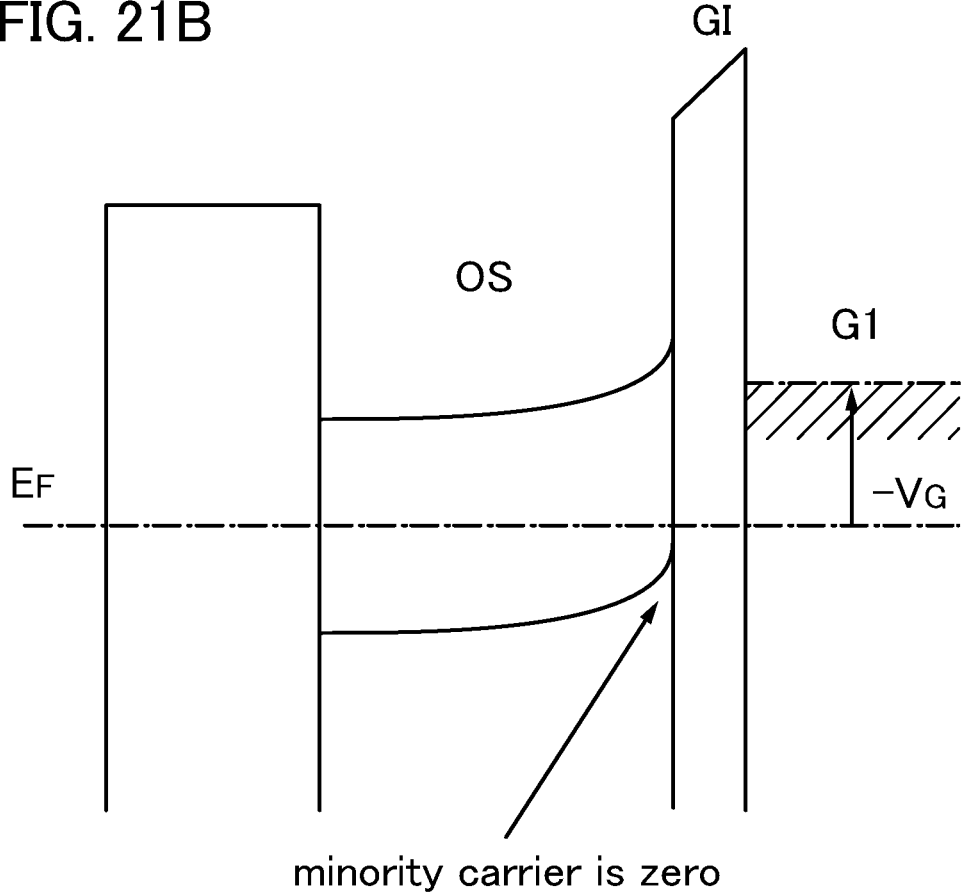
FIG. 21B shows a state in which a negative potential (−VG) is applied to the gate (G1).

FIGS. 21A and 21B are energy band diagrams (schematic diagrams) along B-B' section illustrated in FIG. 19. FIG. 21A illustrates an on state in which a positive potential (+VG) is applied to the gate (G1) and carriers (electrons) flow between the source and the drain. FIG. 21B illustrates an off state in which a negative potential ($-V_G$) is applied to the gate (G1) and minority carriers do not flow.

Figure 22:
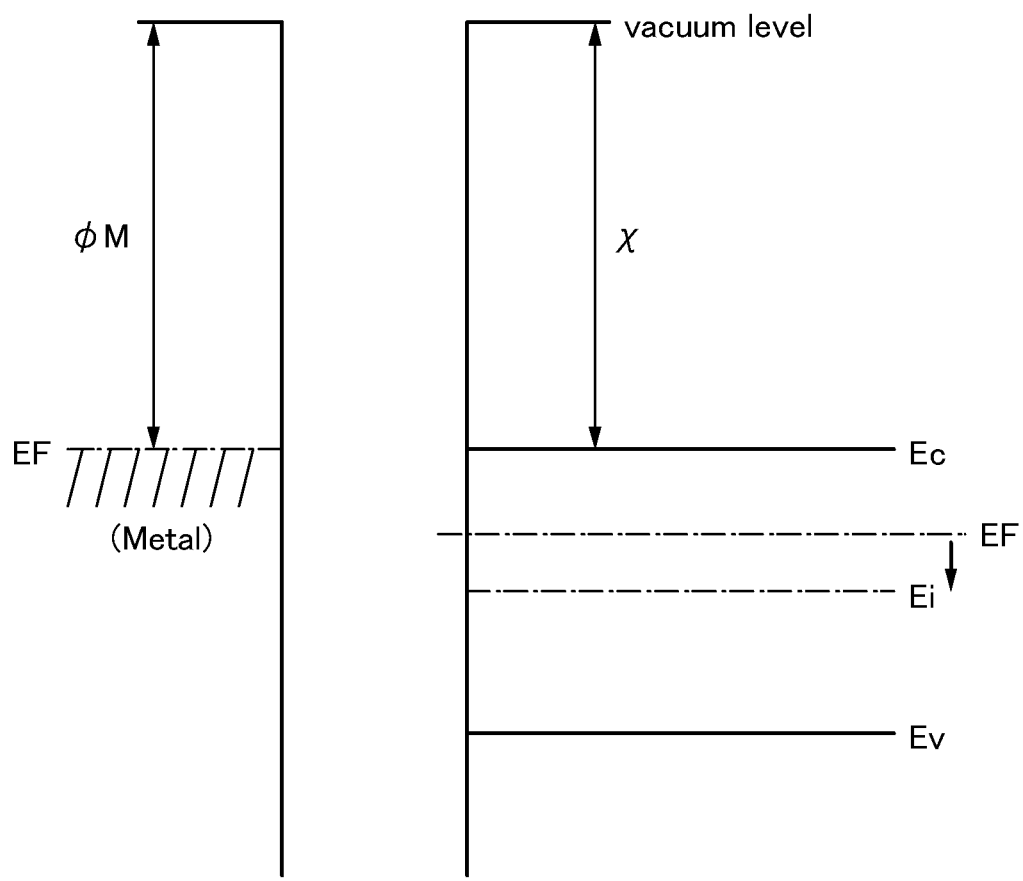
FIG. 22 shows a relation between the vacuum level and the work function of a metal (φM), and between the vacuum level and the electron affinity of an oxide semiconductor (χ).

FIG. 22 shows a relation between the vacuum level and the work function of a metal ($\phi M$), and between the vacuum level and the electron affinity of an oxide semiconductor ($\chi$).

Because electrons in metal are degenerated under room temperature, a Fermi level is located in a conduction band. In contrast, a conventional oxide semiconductor is generally of n-type, and Fermi level (Ef) in that case is located closer to the conduction band and is away from the intrinsic Fermi level (Ei) that is located in the middle of the band gap. Note that it is known that one of a factor that part of hydrogen is a donor which donates an electron in an oxide semiconductor, a conventional oxide semiconductor to be an n-type oxide semiconductor. Note that it is known that one of the factors which make a conventional oxide semiconductor to be an n-type oxide semiconductor is that part of hydrogen in an oxide semiconductor becomes a donor which donates an electron.

On the other hand, an oxide semiconductor according to the present invention is an intrinsic (i-type) or a substantially intrinsic oxide semiconductor which is obtained by removing hydrogen that is an n-type impurity from an oxide semiconductor and highly purifying the oxide semiconductor so that impurities that are not main components of the oxide semiconductor is prevented from being contained therein as much as possible. In other words, a highly purified i-type (intrinsic) semiconductor or a semiconductor close thereto is obtained not by adding an impurity but by removing impurities such as hydrogen or water as much as possible. This enables Fermi level (Ef) to be at the same level or to be substantially the same level as the intrinsic Fermi level (Ei).

It is said that the electron affinity ($\chi$) of an oxide semiconductor is 4.3 eV in the case where the band gap (Eg) thereof is 3.15 eV. The work function of titanium (Ti) used for forming the source and drain electrodes is substantially equal to the electron affinity ($\chi$) of the oxide semiconductor. In that case, a Schottky barrier for electrons is not formed at an interface between the metal and the oxide semiconductor.

In other words, in the case where the work function of metal ($\phi M$) and the electron affinity ($\chi$) of the oxide semiconductor are equal to each other and the metal and the oxide semiconductor are in contact with each other, an energy band diagram (a schematic diagram) as illustrated in FIG. 20A is obtained.

In FIG. 20B, a black circle (●) represents an electron. When a positive potential is applied to the drain, the electron is injected into the oxide semiconductor over the barrier (h) and flows toward the drain. In that case, the height of the barrier (h) changes depending on the gate voltage and the drain voltage; in the case where positive drain voltage is applied, the height of the barrier (h) is smaller than the height of the barrier in FIG. 20A where no voltage is applied, i.e., ½ of the band gap (Eg).

In this case, as shown in FIG. 21A, the electron moves along the lowest part of the oxide semiconductor, which is energetically stable, at an interface between the gate insulating film and the highly-purified oxide semiconductor.

In FIG. 21B, when a negative potential (reverse bias) is applied to the gate (G1), the number of holes that are minority carriers is substantially zero; thus, the current value becomes a value extremely close to zero.

For example, even when the thin film transistor has a channel width W of $1 \times 10^4$ μm and a channel length of 3 μm, an off current of $10^{-13}$ A or lower and a subthreshold value (S value) of 0.1 V/dec. (the thickness of the gate insulating film: 100 nm) can be obtained.

As described above, the oxide semiconductor is highly purified so that impurities that are not main components of the oxide semiconductor is prevented from being contained therein as much as possible, whereby favorable operation of the thin film transistor can be obtained.

Although the thin film transistor 110 is described as a single-gate thin film transistor, a multi-gate thin film transistor including a plurality of channel formation regions can be formed if needed.

Hereinafter, a process for manufacturing the thin film transistor 110 over the substrate 100 will be described with reference to FIGS. 1A to 1E.

First, a conductive film is formed over the substrate 100 having an insulating surface, and then the gate electrode layer 111 is formed by a first photolithography step. It is preferable that an end portion of the formed gate electrode layer be tapered because coverage with a gate insulating layer formed thereover is improved. Note that a resist mask may be formed by an ink jetting method. The formation of the resist mask by an ink jetting method does not use a photomask; thus, manufacturing cost can be reduced.

Although there is no particular limitation on a substrate which can be used as the substrate 100 having an insulating surface, it is necessary that the substrate have at least enough heat resistance to withstand heat treatment performed later. A glass substrate of barium borosilicate glass, aluminoborosilicate glass or the like can be used.

As a glass substrate, if the temperature of the heat treatment to be performed later is high, a glass substrate whose strain point is 730° C. or higher is preferably used. As a glass substrate, a glass material such as aluminosilicate glass, aluminoborosilicate glass, or barium borosilicate glass is used, for example. Note that by containing a larger amount of barium oxide (BaO) than boron oxide, a glass substrate which is heat-resistant and more practical can be obtained. Therefore, a glass substrate containing more BaO than $B_2O_3$ is preferably used.

Note that a substrate formed of an insulator such as a ceramic substrate, a quartz substrate, or a sapphire substrate may be used instead of the above glass substrate. Alternatively, crystallized glass or the like may be used. Further alternatively, a plastic substrate or the like can be used as appropriate.

An insulating film functioning as a base film may be provided between the substrate 100 and the gate electrode layer 111. The base film has a function of preventing diffusion of impurity elements from the substrate 100, and can be formed to have a single-layer or stacked-layer structure including one or more of a silicon nitride film, a silicon oxide film, a silicon nitride oxide film, and a silicon oxynitride film.

The gate electrode layer 111 can be formed to have a single-layer or a stacked-layer structure using a metal material such as molybdenum, titanium, chromium, tantalum, tungsten, aluminum, copper, neodymium, or scandium, or an alloy material which includes any of these materials as its main component.

For example, as a two-layer structure of the gate electrode layer 111, a two-layer structure in which a molybdenum layer is formed over an aluminum layer, a two-layer structure in which a molybdenum layer is formed over a copper layer, a two-layer structure in which a titanium nitride layer or a tantalum nitride layer is formed over a copper layer, or a two-layer structure in which a molybdenum layer is formed over a titanium nitride layer is preferable. As a three-layer structure, a stacked-layer structure in which a tungsten layer or a tungsten nitride layer, a layer of an alloy of aluminum and silicon or alloy of aluminum and titanium, and a titanium nitride layer or a titanium layer are stacked is preferable. Note that the gate electrode layer can be formed using a light-transmitting conductive film. As an example of a light-transmitting conductive film, a light-transmitting conductive oxide can be given.

Then, the gate insulating layer 102 is formed over the gate electrode layer 111.

The gate insulating layer 102 can be formed to have a single-layer or a stacked-layer structure including a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, or a hafnium oxide layer by a plasma CVD method, a sputtering method, or the like. In order to prevent the gate insulating layer 102 from including a large amount of hydrogen, the gate insulating layer 102 is preferably formed by a sputtering method. When a silicon oxide film is formed by a sputtering method, a silicon target or a quartz target is used as a target and oxygen or a mixed gas of oxygen and argon is used as a sputtering gas.

The gate insulating layer 102 can have a stacked-layer structure in which a silicon nitride layer and a silicon oxide layer are stacked over the gate electrode layer 111 in this order. For example, a gate insulating layer having a thickness of 100 nm is formed in such a manner that a silicon nitride layer ($SiN_y$ (y>0)) having a thickness of 50 nm to 200 nm inclusive is formed by a sputtering method as a first gate insulating layer, and a silicon oxide layer ($SiO_x$ (x>0)) having a thickness of 5 nm to 300 nm inclusive is formed as a second gate insulating layer over the first gate insulating layer. The thickness of the gate insulating layer may be set as appropriate depending on the desired characteristics of the thin film transistor. The thickness may be approximately 350 nm to 400 nm.

Further, in order that hydrogen, hydroxyl, and moisture may be contained in the gate insulating layer 102 and the oxide semiconductor film 120 as little as possible, it is preferable that the substrate 100 over which the gate electrode layer 111 is formed or the substrate 100 over which layers up to the gate insulating layer 102 are formed be preheated in a preheating chamber of a sputtering apparatus as pretreatment for film formation so that impurities such as hydrogen and moisture adsorbed to the substrate 100 is removed and exhausted. Note that the temperature of the preheating is 100° C. to 400° C. inclusive, preferably 150° C. to 300° C. inclusive. As an evacuation means provided for the preheating chamber, a cryopump is preferable. Note that this preheating treatment can be omitted. Further, this preheating may be similarly performed on the substrate 100 over which layers up to the source electrode layer 115a and the drain electrode layer 115b are formed, before the formation of the insulating layer 116 having defects.

Then, the oxide semiconductor film 120 having a thickness of 2 nm to 200 nm inclusive is formed over the gate insulating layer 102 (see FIG. 1A).

Note that before the oxide semiconductor film 120 is formed by a sputtering method, dust attached to a surface of the gate insulating layer 102 is preferably removed by reverse sputtering in which an argon gas is introduced and plasma is generated. The reverse sputtering refers to a method in which, without application of voltage to a target side, an RF power source is used for application of voltage to a substrate side in an argon atmosphere in order to generate plasma in the vicinity of the substrate to modify a surface. Note that instead of an argon atmosphere, nitrogen, helium, oxygen, or the like may be used.

The oxide semiconductor film 120 is formed by a sputtering method. As the oxide semiconductor film 120, an In—Ga—Zn—O-based film, an In—Sn—Zn—O-based oxide semiconductor film, an In—Al—Zn—O-based oxide semiconductor film, an Sn—Ga—Zn—O-based oxide semiconductor film, an Al—Ga—Zn—O-based oxide semiconductor film, an Sn—Al—Zn—O-based oxide semiconductor film, an In—Zn—O-based oxide semiconductor film, an Sn—Zn—O-based oxide semiconductor film, an Al—Zn—O-based oxide semiconductor film, an In—O-based oxide semiconductor film, an Sn—O-based oxide semiconductor film, or a Zn—O-based oxide semiconductor film is used. In this embodiment, the oxide semiconductor film 120 is formed by a sputtering method using an In—Ga—Zn—O-based metal oxide target. Further, the oxide semiconductor film 120 can be formed by a sputtering method in a rare gas (typically argon) atmosphere, an oxygen atmosphere, or an atmosphere of a rare gas (typically argon) and oxygen. In the case of film formation by a sputtering method, a target including $SiO_2$ at 2 wt % to 10 wt % inclusive may be used.

A sputtering gas used in the formation of the oxide semiconductor film 120 is preferably a high-purity gas in which impurities such as hydrogen, water, hydroxyl, or hydride are reduced to such a degree that the concentration thereof can be expressed by the unit ppm or ppb.

As a target for forming the oxide semiconductor film 120 by a sputtering method, a metal oxide target including zinc oxide as its main component can be used. Another example of a metal oxide target which can be used is a metal oxide target including In, Ga, and Zn (with a composition ratio of $In_2O_3:Ga_2O_3:ZnO=1:1:1$ [molar ratio]. As the metal oxide target including In, Ga, and Zn, a target having a composition ratio of $In_2O_3:Ga_2O_3:ZnO=1:1:2$ [molar ratio] or a target having a composition ratio of $In_2O_3:Ga_2O_3:ZnO=1:1:4$ [molar ratio] can be used. The filling factor of the metal oxide target is 90% to 100% inclusive, and preferably 95% to 99.9% inclusive. With the use of a metal oxide target with high filling factor, the formed oxide semiconductor film has high density.

The substrate is placed in a process chamber under reduced pressure, and is heated to a temperature lower than 400° C. While moisture remaining in the process chamber is removed, a sputtering gas from which hydrogen and moisture are removed is introduced to form the oxide semiconductor film 120 over the substrate 100 using metal oxide as a target. In order to remove moisture remaining in the process chamber, a capture-type vacuum pump is preferably used. For example, a cryopump, an ion pump, or a titanium sublimation pump is preferably used. An evacuation means may be a turbo pump provided with a cold trap. In the film-formation chamber which is evacuated with the cryopump, hydrogen atoms, a compound including a hydrogen atom such as $H_2O$, and a compound including a carbon atom, for example, are exhausted. Accordingly, the concentration of impurities included in the oxide semiconductor film formed in this film-formation chamber can be reduced.

For the formation of the oxide semiconductor film, not only in the process chamber for forming the oxide semiconductor film but also in the process chamber for steps before and after formation of films in contact with the oxide semiconductor film and steps before and after the formation of the oxide semiconductor film, an evacuation means such as a cryopump is preferably used in order to prevent impurities such as moisture remaining in the process chamber from being mixed into the oxide semiconductor film.

As an example of film formation conditions, the following condition is employed: the distance between the substrate and the target is 100 mm, the pressure is 0.6 Pa, the direct current (DC) power supply is 0.5 kW, and the atmosphere is an oxygen atmosphere (the proportion of the oxygen flow is 100%). A pulse direct current (DC) power supply is preferable because powder substances (also referred to as particles or dust) generated in the film formation can be reduced and the film thickness can be made uniform. The oxide semiconductor film preferably has a thickness of 5 nm to 30 nm inclusive. Note that an appropriate thickness of the oxide semiconductor film varies depending on the material; therefore, the thickness may be determined depending on the material.

By forming the oxide semiconductor film 120 as described above by a sputtering method, an oxide semiconductor film with a low hydrogen concentration can be obtained. The hydrogen concentration given in this specification is a quantified result obtained by secondary ion mass spectrometry (SIMS).

Examples of a sputtering method include an RF sputtering method in which a high-frequency power source is used for a sputtering power supply, a DC sputtering method in which a DC power source is used, and a pulsed DC sputtering method in which a bias is applied in a pulsed manner. An RF sputtering method is mainly used in the case where an insulating film is formed, and a DC sputtering method is mainly used in the case where a metal film is formed.

In addition, there is also a multi-source sputtering apparatus in which a plurality of targets of different materials can be set. With the multi-source sputtering apparatus, films of different materials can be formed to be stacked in the same chamber, or a film can be formed by electric discharge of plural kinds of materials at the same time in the same chamber.

In addition, there are a sputtering apparatus provided with a magnet system inside the chamber and used for a magnetron sputtering method, and a sputtering apparatus used for an ECR sputtering method in which plasma generated with the use of microwaves is used without using glow discharge.

Furthermore, as a film-formation method using a sputtering method, there are also a reactive sputtering method in which a target substance and a sputtering gas component are chemically reacted with each other during film formation to form a thin compound film thereof, and a bias sputtering method in which voltage is also applied to a substrate during film formation.

Figure 1B:
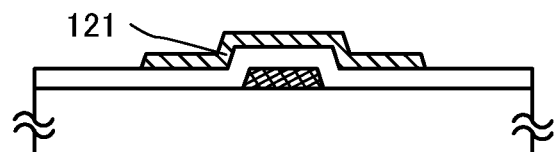
Figure 1C:
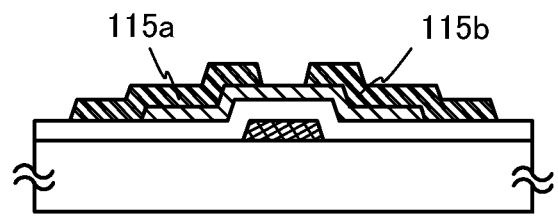
Figure 1D:
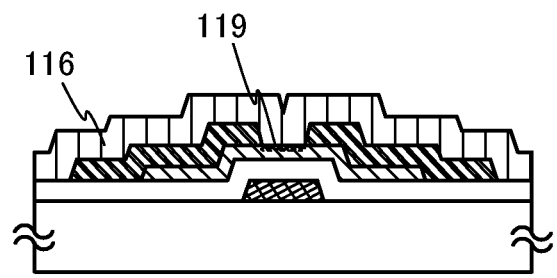

Then, the oxide semiconductor film is processed into an island-shaped oxide semiconductor layer 121 by a second photolithography step (see FIG. 1B). Note that a resist mask for forming the island-shaped oxide semiconductor layer 121 may be formed by an ink jetting method. The formation of the resist mask by an ink jetting method does not use a photomask; thus, manufacturing cost can be reduced.

In the case of forming a contact hole in the gate insulating layer 102, the step can be performed at the time of the formation of the oxide semiconductor layer 121.

The etching of the oxide semiconductor film 120 may be performed by dry etching, dry etching, or both wet etching and dry etching.

As an etching gas used for dry etching, a gas including chlorine (a chlorine-based gas such as chlorine ($Cl_2$), boron chloride ($BCl_3$), silicon chloride ($SiCl_4$), or carbon tetrachloride ($CCl_4$)) is preferably used.

Further, a gas including fluorine (a fluorine-based gas such as carbon tetrafluoride ($CF_4$), sulfur fluoride ($SF_6$), nitrogen fluoride ($NF_3$), or trifluoromethane ($CHF_3$)), hydrogen bromide (HBr), oxygen ($O_2$), any of these gases to which a rare gas such as helium (He) or argon (Ar) is added, or the like can be used.

As the dry etching method, a parallel plate reactive ion etching (RIE) method or an inductively coupled plasma (ICP) etching method can be used. In order to etch the film into a desired shape, the etching conditions (the amount of electric power applied to a coil-shaped electrode, the amount of electric power applied to an electrode on a substrate side, the temperature of the electrode on the substrate side, or the like) is adjusted as appropriate.

As an etchant used for wet etching, for example, a solution obtained by mixing phosphoric acid, acetic acid, and nitric acid, and an ammonia peroxide mixture (31 wt % hydrogen peroxide water:28 wt % ammonia water:water=5:2:2), or the like can be used. Further, ITO-07N (produced by KANTO CHEMICAL CO., INC.) may also be used.

The etchant after the wet etching is removed together with the material which is etched off by cleaning. The waste liquid including the etchant and the material which is etched off may be purified and the material may be reused. Materials such as indium included in the oxide semiconductor layer are collected from the waste liquid after the etching and reused, so that resources can be effectively used and manufacturing cost can be reduced.

The etching conditions (such as an etchant, etching time, and temperature) are adjusted as appropriate depending on the material so that the film can be etched into the desired shape.

Note that it is preferable that reverse sputtering be performed before formation of a conductive film in the subsequent step in order to remove a resist residue or the like attached on the surfaces of the oxide semiconductor layer 121 and the gate insulating layer 102.

Then, a conductive film is formed over the gate insulating layer 102 and the oxide semiconductor layer 121. The conductive film may be formed by a sputtering method or a vacuum evaporation method. As a material of the second conductive film, an element selected from aluminum (Al), chromium (Cr), copper (Cu), tantalum (Ta), titanium (Ti), molybdenum (Mo), and tungsten (W), an alloy containing any of these elements as a component, an alloy containing any of these the elements in combination, or the like can be given. Further, one or more materials selected from manganese (Mn), magnesium (Mg), zirconium (Zr), beryllium (Be), and thorium (Th) may be used. Further, the metal conductive film may have a single-layer structure or a stacked-layer structure of two or more layers. For example, a single-layer structure of an aluminum film including silicon, a two-layer structure in which a titanium film is stacked over an aluminum film, a three-layer structure in which a titanium film, an aluminum film, and a titanium film are stacked in this order can be given. Alternatively, a film, an alloy film, or a nitride film which contains aluminum (Al) and one or a plurality of elements selected from titanium (Ti), tantalum (Ta), tungsten (W), molybdenum (Mo), chromium (Cr), neodymium (Nd), and scandium (Sc) may be used.

By a third photolithography step, a resist mask is formed over the conductive film, and etching is selectively performed; thus, a source electrode layer 115a and a drain electrode layer 115b are formed. Then, the resist mask is removed (see FIG. 1C).

Ultraviolet, a KrF laser light, or an ArF laser light is used for light exposure for forming the resist mask in the third photolithography step. A channel length L of the thin film transistor to be formed later depends on a width of an interval between a bottom portion of the source electrode layer and a bottom portion of the drain electrode layer which are adjacent to each other over the oxide semiconductor layer 121. Note that when light exposure is performed for the channel length L of less than 25 nm, extreme ultraviolet with extremely short wavelengths of several nanometers to several tens of nanometers is used for light exposure for forming the resist mask in the third photolithography step. Light exposure with extreme ultraviolet leads to a high resolution and a large depth of field. Accordingly, the channel length L of the thin film transistor to be formed later can be set to 10 nm to 1000 nm inclusive. Thus, the operation speed of a circuit can be increased, and low power consumption can be achieved due to extremely small off-state current.

Note that each material and etching conditions are adjusted as appropriate so that the oxide semiconductor layer 121 should not removed by etching of the conductive film.

In this embodiment, a Ti film is used as the conductive film, an In—Ga—Zn—O-based is used as the oxide semiconductor layer 121, and an ammonia hydrogen peroxide (a mixture of ammonia, water, and hydrogen peroxide) is used as an etchant.

Note that in the third photolithography step, the oxide semiconductor layer 121 may be partly etched in some cases to be an oxide semiconductor layer having a groove (a depression portion). A resist mask for forming the source electrode layer 115a and the drain electrode layer 115b may be formed by an ink jetting method. The formation of the resist mask by an ink jetting method does not use a photomask; thus, manufacturing cost can be reduced.

Further, in order to reduce the number of photomasks used in the photolithography steps and reduce the number of photolithography steps, an etching step may be performed with the use of a multi-tone mask which is a light-exposure mask through which light is transmitted to have a plurality of intensities. A resist mask formed using a multi-tone mask has a plurality of thicknesses and further can be changed in shape by being etched, and thus can be used in a plurality of etching steps to provide different patterns. Therefore, a resist mask corresponding to at least two kinds of different patterns can be formed using one multi-tone mask. Thus, the number of light-exposure masks can be reduced and the number of corresponding photolithography steps can also be reduced, whereby simplification of the process can be realized.

Plasma treatment using a gas such as $N_2O$, $N_2$, or Ar may be performed to remove adsorbed water or the like of an exposed surface of the oxide semiconductor layer. Plasma treatment may be performed using a mixed gas of oxygen and argon.

Then, the insulating layer 116 having defects is formed over the oxide semiconductor layer 121 without exposure to air. In the formation of the insulating layer 116 having defects, the oxygen-excess mixed region 119 is formed between the oxide semiconductor layer 121 and the insulating layer 116 having defects (see FIG. 1D). In this embodiment, the insulating layer 116 having defects is formed to overlap with the oxide semiconductor layer 121, and the oxygen-excess mixed region 119 is provided therebetween in a region where the oxide semiconductor layer 121 does not overlap with the source electrode layer 115a or the drain electrode layer 115b.

The mixed region is a mixed region of materials included in the oxide semiconductor layer and in the overlying insulating layer having defects. By providing the mixed region, an interface between the oxide semiconductor layer and the insulating layer having defects is not clearly defined; thus, diffusion of hydrogen from the oxide semiconductor layer into the insulating layer having defects is facilitated. For example, when a silicon oxide layer is used as the insulating layer having defects, the mixed region includes oxygen, silicon, and at least one of the metal elements included in the oxide semiconductor layer.

As in this embodiment, in the case where a silicon oxide is used for the insulating layer 116 having defects and an In—Ga—Zn—O-based film is used as the oxide semiconductor, the mixed region 119 includes oxygen, silicon, and at least one metal element selected from In, Ga, and Zn. The metal in the oxide semiconductor can exist in a variety of states in the mixed region 119; referring to the metal included in the oxide semiconductor as M, the metal in the mixed region 119 can be expressed as M-OH, M-H, M-O—Si—H, and M-O—Si—OH, specifically, Zn—H, Zn—OH, and the like.

The mixed region 119 may have a thickness of 0.1 nm to 30 nm (preferably, 2 nm to 10 nm). The thickness of the mixed region 119 can be controlled by the film formation conditions of the sputtering method at the time of forming the insulating layer 116 having defects. If the power supply is set higher and the distance between the substrate and the target is set shorter in the sputtering method, the mixed region 119 can be formed thicker. When the sputtering method is conducted with higher power supply, water or the like adsorbed on a surface of the oxide semiconductor layer 121 can be removed.

The provision of the mixed region 119 between the oxide semiconductor layer 121 and the insulating layer 116 having defects facilitates diffusion of hydrogen atoms, a compound including a hydrogen atom such as $H_2O$, a compound including a carbon atom, and the like which are included in the oxide semiconductor layer 121 into the insulating layer 116 having defects.

The mixed region 119 needs to include excess oxygen and therefore is formed using a sputtering gas which includes much oxygen in order to provide an oxygen-excess region, and after the formation of the mixed region 119, the amount of oxygen in the sputtering gas may be adjusted for the formation of the insulating layer 116 having defects.

Instead of a silicon oxide layer, a silicon oxynitride layer, an aluminum oxide layer, an aluminum oxynitride layer, or the like can be used as the insulating layer 116 having defects. Further, a silicon nitride layer, a silicon nitride oxide layer, an aluminum nitride layer, an aluminum nitride oxide layer, or the like may be used as the insulating layer 116 having defects.

In this embodiment, to form an oxygen-excess mixed region and a silicon oxide layer, the substrate 100 over which layers up to the island-shaped oxide semiconductor layer 121, the source electrode layer 115a, and the drain electrode layer 115b are formed is heated to room temperature or a temperature lower than 100° C., a sputtering gas including high-purity oxygen from which hydrogen and moisture are removed is introduced, and a silicon target is used.

A sputtering gas used in the formation of the insulating layer 116 having defects is preferably a high-purity gas in which impurities such as hydrogen, water, hydroxyl, or hydride are reduced to such a degree that the concentration thereof can be expressed by the unit ppm or ppb.

For example, a silicon oxide film is formed by a pulsed DC sputtering method under the following condition: a boron-doped silicon target which has a purity of 6N (the resistivity is 0.01 Ωcm) is used; the distance between the substrate and the target (T-S distance) is 89 mm; the pressure is 0.4 Pa, the direct-current (DC) power source is 6 kW, and the atmosphere is oxygen (the proportion of the oxygen flow is 100%). The film thickness is 300 nm. Note that instead of a silicon target, quartz (preferably, synthetic quartz) can be used as the target for forming the silicon oxide film. As a sputtering gas, an oxygen gas or a mixed gas of oxygen and argon is used.

It is preferable that the mixed region 119 and the insulating layer 116 having defects be formed while moisture remaining in the process chamber is removed so that hydrogen, hydroxyl, or moisture should not be included in the oxide semiconductor layer 121, the mixed region 119, or the insulating layer 116 having defects.

Note that the mixed region 119 may be formed using silicon oxynitride, aluminum oxide, aluminum oxynitride, or the like, instead of silicon oxide.

Then, heat treatment is performed at 100° C. to 400° C., in a state where the insulating layer 116 having defects and the oxide semiconductor layer 121 are in contact with each other with the oxygen-excess mixed region 119 therebetween. This heat treatment can diffuse hydrogen or moisture included in the oxide semiconductor layer 121 into the oxygen-excess mixed region 119 and the insulating layer 116 having defects. Since the oxygen-excess mixed region 119 is provided between the insulating layer 116 having defects and the oxide semiconductor layer 121, impurities such as hydrogen, hydroxyl, or moisture included in the island-shaped oxide semiconductor layer 121 are diffused from the oxide semiconductor layer 121 into the oxygen-excess mixed region 119 or into the insulating layer 116 having defects through the oxygen-excess mixed region 119.

The mixed region 119 which is provided between the oxide semiconductor layer 121 and the insulating layer 116 having defects includes excess oxygen, and thus has many oxygen dangling bonds as defects and has high binding energy to impurities such as hydrogen, moisture, hydroxyl, or hydride. The provision of the oxygen-excess mixed region 119 facilitates diffusion and movement of impurities such as hydrogen, moisture, hydroxyl, or hydride included in the oxide semiconductor layer 121 into the insulating layer 116 having defects.

In addition, when the impurities which have been removed from the oxide semiconductor layer 121 and diffused into the insulating layer 116 having defects move back toward the oxide semiconductor layer 121, the oxygen-excess mixed region 119 functions as a protective layer (a barrier layer) which is bound to and stabilizes the impurities so as to prevent the impurities from entering the oxide semiconductor layer 121.

As described above, by removing impurities such as hydrogen, moisture, hydroxyl, or hydride which cause variation from the oxide semiconductor layer 121, the oxide semiconductor layer 112 with reduced impurities can be provided. Further, the oxygen-excess mixed region 119 which functions as a barrier layer prevents the impurities which have been diffused into the insulating layer 116 having defects from entering the oxide semiconductor layer 112 again; thus, the impurity concentration of the oxide semiconductor layer 112 can be kept low.

An oxygen-excess mixed region or an oxygen-excess oxide insulating layer, which is provided between an oxide semiconductor layer and an insulating layer having defects, includes excess oxygen, and thus has many oxygen dangling bonds as defects. Concerning diffusion of hydrogen from the oxide semiconductor layer into such an insulating layer having defects, it was calculated that in which of an oxide semiconductor layer (amorphous IGZO) and an insulating layer having defects (amorphous $SiO_x$), hydrogen atom are more likely to exist.

A binding energy E_bind of a hydrogen atom was defined as follows, so that stability of the hydrogen atom in an environment was evaluated.

$$E\_bind = \{E(\text{original structure}) + E(H)\} - E(\text{structure with H})$$

The larger this bound E_bind becomes, the more likely the hydrogen atom is to exist. E(original structure), E(H), and E(structure with H) respectively represent energy of the original structure, energy of the hydrogen atom, and energy of the structure with H. The binding energy of four samples was calculated: amorphous IGZO, amorphous $SiO_2$ without dangling bonds (hereinafter abbreviated to DB), and two kinds of amorphous $SiO_x$ with DB.

For calculation, CASTEP, which is a program for a density functional theory, was used. As a method for the density functional theory, a plane wave basis pseudopotential method was used. As a functional, LDA was used. Cut-off energy was 300 eV. A 2×2×2 grid K-point grid was used.

The calculated structures are described below. First, the original structure is described. A unit cell of amorphous IGZO includes 84 atoms in total: 12 In atoms, 12 Ga atoms, 12 Zn atoms, and 48 O atoms. A unit cell of amorphous $SiO_2$ without DB includes 48 atoms in total: 16 Si atoms and 32 O atoms. Amorphous $SiO_x$ with DB (1) has such a structure in which one O atom is removed from the amorphous $SiO_2$ without DB and one Si atom which has been bonded to the O atom is bonded to H; that is, it includes 48 atoms in total: 16 Si atoms, 31 O atoms, and 1H atom. Amorphous $SiO_x$ with DB (2) has such a structure in which one Si atom is removed from the amorphous $SiO_2$ without DB and three O atoms which have been bonded to the Si atom are each bonded to H atoms; that is, it includes 50 atoms in total: 15 Si atoms, 32 O atoms, and 3H atoms. The structure with H is a structure in which H was attached to each of the above four structures. Note that H was attached to an O atom in the amorphous IGZO, to a Si atom in the amorphous $SiO_2$ without DB, and to an atom that has DB in the amorphous $SiO_x$ with DB. The structure in which H was calculated includes one H atom in a unit cell. Note that the cell size of each structure is shown in Table 1.

TABLE 1

| structure | cell size (nm) angle |
|---|---|
| amorphous IGZO | 1.0197 × 1.0197 × 1.0197 |
| | α = β = γ = 90° |
| amorphous $SiO_2$ without DB | 0.9127 × 0.9127 × 0.9127 |
| amorphous SiOx(1) with DB | α = β = γ = 90° |
| amorphous SiOx(2) with DB | |
| Hydrogen atom | 1.0000 × 1.0000 × 1.0000 |
| | α = β = γ = 90° |

Calculation results are shown in Table 2.

TABLE 2

| | energy of structure with H atom in a unit cell (eV) | energy of original structure in a unit cell (eV) | energy of hydrogen atom (eV) | binding energy(eV) |
|---|---|---|---|---|
| amorphous IGZO | −84951.3359 | −84935.6442 | −13.0015 | 2.69 |
| amorphous SiO2 without DB | −15783.8101 | −15770.6279 | −13.0015 | 0.18 |
| amorphous SiOx(1) with DB | −15363.1459 | −15345.6884 | −13.0015 | 4.46 |
| amorphous SiOx(2) with DB | −15722.2053 | −15702.5905 | −13.0015 | 6.61 |

From the above, amorphous $SiO_x$ with DB (2) having a structure in which Si is removed from the amorphous $SiO_2$ without DB and three O atoms which have been bonded to the Si are each bonded to H has the highest binding energy, followed by $SiO_x$ (1) having a structure in which one O atom is removed from the amorphous $SiO_2$ without DB and one Si atom which has been bonded to the one O atom is bonded to H, amorphous IGZO, and amorphous $SiO_2$ without DB having the lowest binding energy. Therefore, hydrogen becomes the most stable when being bonded to DB in amorphous $SiO_x$ having DB which is caused by excess oxygen.

As a result, the following process can be assumed. There is a large amount of DBs in amorphous $SiO_x$. A hydrogen atom at the vicinity of the interface between amorphous IGZO and amorphous $SiO_x$ becomes stable by being bonded to the DB in the amorphous $SiO_x$. Thus, the hydrogen atom in the amorphous IGZO moves to the DB in the amorphous $SiO_x$.

Further, from the fact that the amorphous $SiO_x$ with DB (2) having the structure in which dangling bonds are formed by removal of Si has a higher binding energy than the $SiO_x$ with DB (1) having the structure in which a dangling bond is formed by removal of O, hydrogen atoms in $SiO_x$ are more stable when being bonded to O.

If the insulating layer having defects is an insulating layer having many oxygen dangling bonds as defects, its binding energy to hydrogen is high; accordingly, more hydrogen atoms or more impurities including hydrogen can be diffused from the oxide semiconductor layer into the insulating layer having defects. Therefore, the mixed region or the oxide insulating layer which is in contact with the oxide semiconductor layer preferably includes excess oxygen, and is preferably expressed by $SiO_{2+x}$ where x is equal to or greater than 0 and less than 3.

Figure 1E:
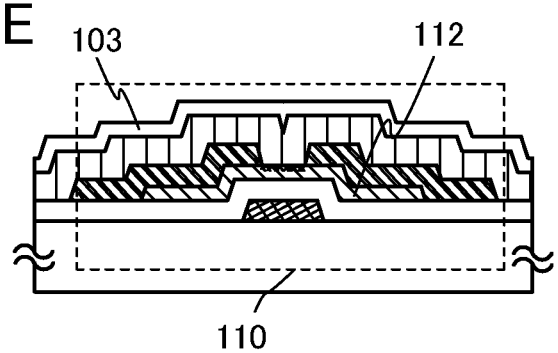

Through the above process, the thin film transistor 110 including the oxide semiconductor layer 112 in which the concentration of hydrogen and hydride is reduced can be formed (see FIG. 1E). By reducing the concentration of the impurities such as hydrogen or moisture, generation of parasitic channel on the back channel side, i.e., in a superficial portion of the oxide semiconductor layer can be suppressed.

In the thin film transistor 110, a channel formation region can be formed in the oxide semiconductor layer in which the hydrogen is set equal to or less than $5 \times 10^{19}/cm^3$, preferably equal to or less than $5 \times 10^{18}/cm^3$, and more preferably equal to or less than $5 \times 10^{17}/cm^3$; hydrogen or O—H group in the oxide semiconductor is removed; and the carrier concentration is equal to or less than $5 \times 10^{14}/cm^3$, preferably equal to or less than $5 \times 10^{12}/cm^3$.

The energy gap of the oxide semiconductor is set to be equal to or greater than 2 eV, preferably equal to or greater than 2.5 eV, more preferably equal to or greater than 3 eV to reduce as much impurities, such as hydrogen which form donors, as possible, and the carrier concentration of the oxide semiconductor is set to equal to or less than $1 \times 10^{14}/cm^3$, preferably equal to or less than $1 \times 10^{12}/cm^3$.

When the thus purified oxide semiconductor is used for a channel formation region of the thin film transistor 110, even in the case where the channel width is 10 mm, the drain current of equal to or less than $1 \times 10^{-13}$ A is obtained at drain voltages of 1 V and 10 V and gate voltages in the range of −5 V to −20 V.

As described above, by removing remaining moisture in the reaction atmosphere for the formation of the oxide semiconductor film, the concentration of hydrogen and hydride in the oxide semiconductor film can be reduced. In addition, by providing the insulating layer having defects over the oxide semiconductor layer with the oxygen-excess mixed region therebetween, impurities such as hydrogen or moisture in the oxide semiconductor layer are diffused into the insulating layer having defects, whereby the concentration of hydrogen and hydride in the oxide semiconductor layer can be reduced. Accordingly, the oxide semiconductor layer can be stabilized.

A protective insulating layer may be provided over the insulating layer having defects. In this embodiment, the protective insulating layer 103 is formed over the insulating layer 116 having defects. As the protective insulating layer 103, a silicon nitride film, a silicon nitride oxide film, an aluminum nitride film, or the like can be used.

As the protective insulating layer 103, a silicon nitride film is formed by heating the substrate 100 over which layers up to the insulating layer 116 having defects are formed, to a temperature of 100° C. to 400° C.; introducing a sputtering gas including high-purity nitrogen from which hydrogen and moisture are removed; and using a silicon target. In this step also, it is preferable that the protective insulating layer 103 be formed while moisture remaining in the process chamber is removed as in the case of the insulating layer 116 having defects.

In the case of forming the protective insulating layer 103, if the substrate 100 is heated to a temperature of 100° C. to 400° C. at the time of the formation of the protective insulating layer 103, impurities such as hydrogen or moisture included in the oxide semiconductor layer can be diffused into the insulating layer 116 having defects. In that case, heat treatment is not necessarily performed after the formation of the insulating layer 116 having defects.

In the case where a silicon oxide layer is formed as the insulating layer 116 having defects and a silicon nitride layer is formed thereover as the protective insulating layer 103, the silicon oxide layer and the silicon nitride layer can be formed in the same process chamber using a common silicon target. First, a sputtering gas including oxygen is introduced and a silicon oxide layer is formed using a silicon target placed inside the process chamber, and then the sputtering gas is switched to a sputtering gas including nitrogen and a silicon nitride layer is formed using the same silicon target. Since the silicon oxide layer and the silicon nitride layer can be formed in succession without exposure to air, impurities such as hydrogen or moisture can be prevented from being adsorbed on a surface of the silicon oxide layer. In that case, after the silicon oxide layer is formed as the insulating layer 116 having defects and the silicon nitride layer is formed thereover as the protective insulating layer 103, heat treatment (at a temperature of 100° C. to 400° C.) for diffusion of hydrogen or moisture in the oxide semiconductor layer into the insulating layer having defects is preferably performed.

After the formation of the protective insulating layer, heat treatment may be further performed at 100° C. to 200° C. inclusive in air for 1 hour to 30 hours inclusive. This heat treatment may be performed at a fixed heating temperature or the following change in the heating temperature may be conducted plural times repeatedly: the heating temperature is increased from room temperature to a temperature of 100° C. to 200° C. inclusive and then decreased to room temperature. Further, this heat treatment may be performed under reduced pressure before the formation of the protective insulating layer. Under reduced pressure, the heat treatment time can be shortened. With this heat treatment, a normally-off thin film transistor can be obtained. Accordingly, the reliability of the semiconductor device can be improved.

Even if impurities move back toward the oxide semiconductor layer 112 due to the heat treatment after being diffused into the insulating layer 116 having defects, the oxygen-excess mixed region 119 functioning as a barrier layer prevents the impurities from entering the oxide semiconductor layer 112. Thus, the impurity concentration of the oxide semiconductor layer 112 can be kept low.

The above process can be used for manufacturing a backplane (a substrate over which a thin film transistor is formed) of a liquid crystal display panel, an electroluminescent display panel, a display device using electronic ink, and the like. Since the above process can be performed at a temperature equal to or less than 400° C., the process can be preferably applied to a manufacturing process using a glass substrate having a side longer than 1 m and a thickness less than or equal to 1 mm.

As described above, a highly reliable semiconductor device with stable electric characteristics including a thin film transistor including an oxide semiconductor layer can be provided.

Embodiment 2

In this embodiment, another example of a thin film transistor which can be applied to a semiconductor device disclosed in this specification will be described. The same portion as or a portion having a function similar to those in the above embodiment can be formed in a manner similar to that described in the above embodiment, and also the steps similar to those in the above embodiment can be performed in a manner similar to that described in the above embodiment, and repetitive description is omitted. In addition, detailed description of the same portions is not repeated.

FIGS. 2A to 2D illustrate an example of a cross-sectional structure of a semiconductor device. A thin film transistor 130 illustrated in FIGS. 2A to 2D has one type of a bottom-gate structure and is also referred to as an inverted staggered thin film transistor.

The thin film transistor 130 illustrated in FIGS. 2A to 2D includes, over the substrate 100 having an insulating surface, the gate electrode layer 111, the gate insulating layer 102, an oxide semiconductor layer 132, the source electrode layer 115a, and the drain electrode layer 115b. In addition, an oxygen-excess oxide insulating layer 139 which covers the thin film transistor 130 and is in contact with the oxide semiconductor layer 132 is provided, and the insulating layer 116 having defects is formed over the oxygen-excess oxide insulating layer 139. In addition, the protective insulating layer 103 is formed over the insulating layer 116 having defects.

Since the oxygen-excess oxide insulating layer 139 and the insulating layer 116 having defects have a high binding energy to hydrogen or moisture (a hydrogen atom or a compound including a hydrogen atom such as $H_2O$) and these impurities are stabilized in the oxygen-excess oxide insulating layer 139 and the insulating layer 116 having defects, these impurities can be diffused from the oxide semiconductor layer 132 into the oxygen-excess oxide insulating layer 139 and the insulating layer 116 having defects, whereby these impurities can be removed from the oxide semiconductor layer 132. Further, the oxygen-excess oxide insulating layer 139 functions as a barrier layer against impurities which have been diffused into the insulating layer 116 having defects to prevent the impurities from entering the oxide semiconductor layer 132 again; thus, the impurity concentration of the oxide semiconductor layer 132 can be kept low. Accordingly, the thin film transistor 130 including the oxide semiconductor layer 132 in which impurities such as hydrogen, moisture, hydroxyl, or hydride (also referred to as a hydrogen compound) which cause variation are reduced is a highly reliable thin film transistor with stable electric characteristics.

As the oxygen-excess oxide insulating layer 139, a silicon oxide layer ($SiO_{2+x}$, where x is preferably equal to or greater than 0 and less than 3) can be used. The oxygen-excess oxide insulating layer 139 may have a thickness of 0.1 nm to 30 nm (preferably, 2 nm to 10 nm).

Although the thin film transistor 130 is described as a single-gate thin film transistor, a multi-gate thin film transistor including a plurality of channel formation regions can be formed if needed.

Hereinafter, a process for manufacturing the thin film transistor 130 over the substrate 100 will be described with reference to FIGS. 2A to 2D.

First, a conductive film is formed over the substrate 100 having an insulating surface, and then the gate electrode layer 111 is formed by a first photolithography step.

Then, the gate insulating layer 102 is formed over the gate electrode layer 111. The gate insulating layer 102 can have a stacked-layer structure in which a silicon nitride layer and a silicon oxide layer are stacked over the gate electrode layer 111 in this order.

Then, an oxide semiconductor film is formed over the gate insulating layer 102 and processed into an island-shaped oxide semiconductor layer 121 by a second photolithography step. In this embodiment, the oxide semiconductor film is formed by a sputtering method using an In—Ga—Zn—O-based metal oxide target.

Then, a conductive film is formed over the gate insulating layer 102 and the oxide semiconductor layer 121. By a third photolithography step, a resist mask is formed over the conductive film, and selective etching is performed; thus, the source electrode layer 115a and the drain electrode layer 115b are formed. Then, the resist mask is removed (see FIG. 2A).

Figure 2A:
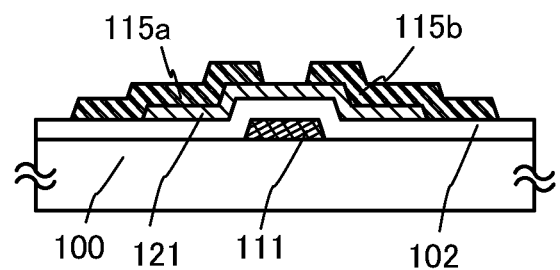
FIGS. 2A to 2D illustrate a semiconductor device and a manufacturing method thereof.
Figure 2B:
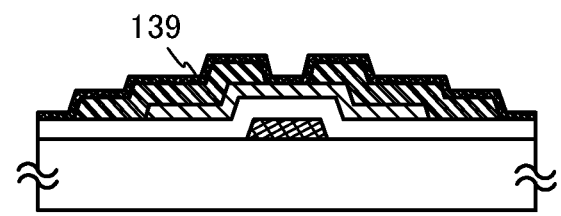
Figure 2C:
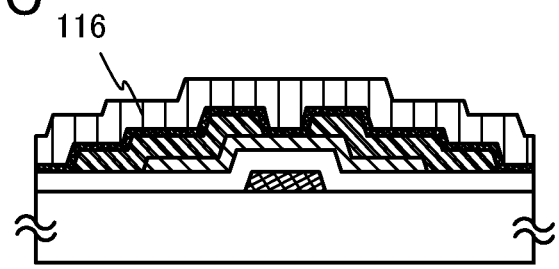

Then, the oxygen-excess oxide insulating layer 139 is formed over the gate insulating layer 102, the oxide semiconductor layer 121, the source electrode layer 115a, and the drain electrode layer 115b (see FIG. 2B). In this embodiment, the oxygen-excess oxide insulating layer 139 is formed to be in contact with the oxide semiconductor layer 121 in a region where the oxide semiconductor layer 121 does not overlap with the source electrode layer 115a or the drain electrode layer 115b.

In this embodiment, to form a silicon oxide layer ($SiO_{2+x}$, where x is preferably equal to or greater than 0 and less than 3) as the oxygen-excess oxide insulating layer 139, the substrate 100 over which layers up to the source electrode layer 115a and the drain electrode layer 115b are formed is heated to room temperature or a temperature lower than 100° C., a sputtering gas including high-purity oxygen from which hydrogen and moisture are removed is introduced, and a silicon target is used. The thickness of the oxygen-excess oxide insulating layer 139 may be 0.1 nm to 30 nm (preferably, 2 nm to 10 nm).

A sputtering gas used in the formation of the oxygen-excess oxide insulating layer 139 is preferably a high-purity gas in which impurities such as hydrogen, water, hydroxyl, or hydride are reduced to such a degree that the concentration thereof can be expressed by the unit ppm or ppb.

For example, a silicon oxide layer is formed by a pulsed DC sputtering method under the following condition: a boron-doped silicon target which has a purity of 6N (the resistivity is 0.01 Ωcm) is used; the distance between the substrate and the target (S-T distance) is 89 mm; the pressure is 0.4 Pa, the direct-current (DC) power source is 6 kW, and the atmosphere is oxygen (the proportion of the oxygen flow is 100%). Note that instead of a silicon target, quartz (preferably, synthetic quartz) can be used as the target for forming the silicon oxide layer. As a sputtering gas, an oxygen gas or a mixed gas of oxygen and argon is used.

Note that instead of a silicon oxide layer, a silicon oxynitride layer, an aluminum oxide layer, an aluminum oxynitride layer, or the like can be used as the oxygen-excess oxide insulating layer 139.

Then the insulating layer 116 having defects is formed over the oxygen-excess oxide insulating layer 139 without exposure to air.

In this embodiment, to form the insulating layer 116 having defects, the substrate 100 over which layers up to the island-shaped oxide semiconductor layer 121, the source electrode layer 115a, the drain electrode layer 115b, and the oxygen-excess oxide insulating layer 139 are formed is heated to room temperature or a temperature lower than 100° C., a sputtering gas including high-purity oxygen from which hydrogen and moisture are removed is introduced, and a silicon target is used. The oxygen-excess oxide insulating layer 139 and the insulating layer 116 having defects may be formed in the same process chamber using the same target.

A sputtering gas used in the formation of the insulating layer 116 having defects is preferably a high-purity gas in which impurities such as hydrogen, water, hydroxyl, or hydride are reduced to such a degree that the concentration thereof can be expressed by the unit ppm or ppb.

It is preferable that oxygen-excess oxide insulating layer 139 and the insulating layer 116 having defects be formed while moisture remaining in the process chamber where the oxygen-excess oxide insulating layer 139 and the insulating layer 116 having defects are formed is removed so that hydrogen, hydroxyl, or moisture should not be included in the oxide semiconductor layer 121, the oxygen-excess oxide insulating layer 139, or the insulating layer 116 having defects.

The insulating layer 116 having defects may be any insulating layer having many defects and a silicon oxynitride layer, an aluminum oxide layer, an aluminum oxynitride layer, or the like can be used instead of the silicon oxide layer. Further, a silicon nitride layer, a silicon nitride oxide layer, an aluminum nitride layer, an aluminum nitride oxide layer, or the like may be used as the insulating layer 116 having defects.

Then, heat treatment is performed at 100° C. to 400° C., in a state where the insulating layer 116 having defects and the oxide semiconductor layer 121 are in contact with each other with the oxygen-excess oxide insulating layer 139 therebetween. This heat treatment can diffuse hydrogen or moisture included in the oxide semiconductor layer 121 into the oxygen-excess oxide insulating layer 139 and the insulating layer 116 having defects. Since the oxygen-excess oxide insulating layer 139 is provided between the insulating layer 116 having defects and the oxide semiconductor layer 121, impurities such as hydrogen, hydroxyl, or moisture included in the island-shaped oxide semiconductor layer 121 are diffused from the oxide semiconductor layer 121 into the oxygen-excess oxide insulating layer 139 or into the insulating layer 116 having defects through the oxygen-excess oxide insulating layer 139.

The oxide insulating layer 139, which is provided between the oxide semiconductor layer 121 and the insulating layer 116 having defects, includes excess oxygen, and thus has many oxygen dangling bonds as defects and has high binding energy to impurities such as hydrogen, moisture, hydroxyl, or hydride. The provision of the oxygen-excess oxide insulating layer 139 facilitates diffusion and movement of impurities such as hydrogen, moisture, hydroxyl, or hydride included in the oxide semiconductor layer 121 into the insulating layer 116 having defects.

In addition, when the impurities which have been removed from the oxide semiconductor layer 121 and diffused into the insulating layer 116 having defects move back toward the oxide semiconductor layer, the oxygen-excess oxide insulating layer 139 functions as a protective layer (a barrier layer) which is bound to and stabilizes the impurities so as to prevent the impurities from entering the oxide semiconductor layer.

As described above, by removing impurities such as hydrogen, moisture, hydroxyl, or hydride which cause variation from the oxide semiconductor layer, the oxide semiconductor layer 121 with reduced impurities can be provided. Further, the oxygen-excess oxide insulating layer 139 which functions as a barrier layer prevents the impurities which have been diffused into the insulating layer 116 having defects from entering the oxide semiconductor layer 121 again; thus, the impurity concentration of the oxide semiconductor layer 121 can be kept low.

Then, the protective insulating layer 103 is formed over the insulating layer 116 having defects. As the protective insulating layer 103, a silicon nitride layer, a silicon nitride oxide layer, an aluminum nitride layer, an aluminum nitride oxide layer, or the like can be used. In this embodiment, as the protective insulating layer 103, a silicon nitride layer is formed by heating the substrate 100 over which layers up to the insulating layer 116 having defects are formed, to a temperature of 100° C. to 400° C.; introducing a sputtering gas including high-purity nitrogen from which hydrogen and moisture are removed; and using a silicon target.

Impurities such as hydrogen or moisture are removed and the concentration of those impurities is kept very low in the above process, whereby generation of a parasitic channel on the back channel side in a superficial portion of the oxide semiconductor layer can be suppressed.

Figure 2D:
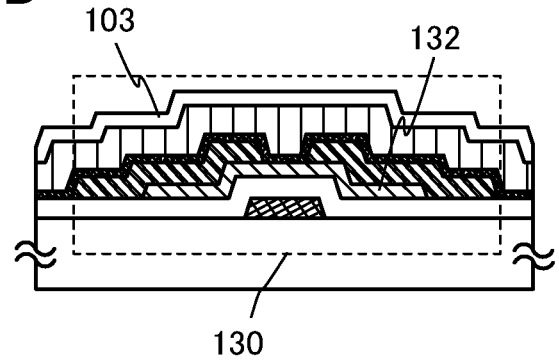

Thus, the thin film transistor 130 including the oxide semiconductor layer 132 in which the concentration of impurities such as hydrogen and hydride is reduced can be formed (see FIG. 2D).

Even if impurities move back toward the oxide semiconductor layer due to heat treatment in the steps after being diffused into the insulating layer 116 having defects, the oxygen-excess oxide insulating layer 139 functioning as a barrier layer prevents the impurities from entering the oxide semiconductor layer 132. Thus, the impurity concentration of the oxide semiconductor layer 132 can be kept low.

In the thin film transistor 130, a channel formation region can be formed in the oxide semiconductor layer in which the hydrogen is set equal to or less than $5 \times 10^{19}/cm^3$, preferably equal to or less than $5 \times 10^{18}/cm^3$, and more preferably equal to or less than $5 \times 10^{17}/cm^3$; hydrogen or O—H group in the oxide semiconductor is removed; and the carrier concentration is equal to or less than $5 \times 10^{14}/cm^3$, preferably equal to or less than $5 \times 10^{12}/cm^3$.

The energy gap of the oxide semiconductor is set to be equal to or greater than 2 eV, preferably equal to or greater than 2.5 eV, more preferably equal to or greater than 3 eV to reduce as much impurities, such as hydrogen which form donors, as possible, and the carrier concentration of the oxide semiconductor is set to be equal to or less than $1 \times 10^{14}/cm^3$, preferably equal to or less than $1 \times 10^{12}/cm^3$.

When the thus purified oxide semiconductor is used for a channel formation region of the thin film transistor 130, even in the case where the channel width is 10 mm, the drain current of equal to or less than $1 \times 10^{-13}$ A is obtained at drain voltages of 1 V and 10 V and gate voltages in the range of −5 V to −20 V.

As described above, a highly reliable semiconductor device with stable electric characteristics including a thin film transistor including an oxide semiconductor layer can be provided.

Embodiment 3

In this embodiment, another example of a thin film transistor which can be applied to a semiconductor device disclosed in this specification will be described.

A semiconductor device and a manufacturing method thereof in this embodiment will be described with reference to FIGS. 3A to 3E.

FIGS. 3A to 3E illustrate an example of a cross-sectional structure of a semiconductor device. A thin film transistor 160 illustrated in FIGS. 3A to 3E has one type of a bottom-gate structure called a channel-protective structure (also referred to as a channel-stop structure) and is also referred to as an inverted staggered thin film transistor.

Although the thin film transistor 160 is described as a single-gate thin film transistor, a multi-gate thin film transistor including a plurality of channel formation regions can be formed if needed.

Hereinafter, a process for manufacturing the thin film transistor 160 over the substrate 150 will be described with reference to FIGS. 3A to 3D.

First, a conductive film is formed over the substrate 150 having an insulating surface, and then the gate electrode layer 151 is formed by a first photolithography step. Note that a resist mask may be formed by an ink jetting method. The formation of the resist mask by an ink jetting method does not use a photomask; thus, manufacturing cost can be reduced.

The gate electrode layer 151 can be formed to have a single-layer or a stacked-layer structure using a metal material such as molybdenum, titanium, chromium, tantalum, tungsten, aluminum, copper, neodymium, or scandium, or an alloy material which includes any of these materials as its main component.

Then, a gate insulating layer 152 is formed over the gate electrode layer 151.

In this embodiment, a silicon oxynitride layer having a thickness of 100 nm is formed by a plasma CVD method as the gate insulating layer 152.

Then, an oxide semiconductor film is formed over the gate insulating layer 152 and processed into an island-shaped oxide semiconductor layer 171 by a second photolithography step. In this embodiment, the oxide semiconductor film is formed by a sputtering method using an In—Ga—Zn—O-based metal oxide target.

The substrate is placed in a process chamber under reduced pressure, and is heated to a temperature lower than 400° C. While moisture remaining in the process chamber is removed, a sputtering gas from which hydrogen and moisture are removed is introduced to form the oxide semiconductor film over the substrate 150 using metal oxide as a target. In order to remove moisture remaining in the process chamber, a capture-type vacuum pump is preferably used. For example, a cryopump, an ion pump, or a titanium sublimation pump is preferably used. An evacuation means may be a turbo pump provided with a cold trap. In the film-formation chamber which is evacuated with the cryopump, hydrogen atoms, a compound including a hydrogen atom such as $H_2O$, a compound including a carbon atom, and the like are exhausted. Accordingly, the concentration of impurities included in the oxide semiconductor film formed in this film-formation chamber can be reduced.

As an example of film formation conditions, the following condition is employed: the distance between the substrate and the target is 100 mm, the pressure is 0.6 Pa, the direct current (DC) power supply is 0.5 kW, and the atmosphere is an oxygen atmosphere (the proportion of the oxygen flow is 100%). A pulse direct current (DC) power supply is preferable because powder substances (also referred to as particles or dust) generated in the film formation can be reduced and the film thickness can be made uniform. The oxide semiconductor film preferably has a thickness of 5 nm to 30 nm inclusive. Note that an appropriate thickness of the oxide semiconductor film varies depending on the material; therefore, the thickness may be determined as appropriate depending on the material.

Then, the insulating layer 173 having defects is formed over the gate insulating layer 152 and the oxide semiconductor layer 171. In the formation of the insulating layer 173 having defects, the oxygen-excess mixed region 179 is formed between the oxide semiconductor layer 171 and the insulating layer 173 having defects (see FIG. 3B).

The mixed region 179 is a mixed region of materials included in the oxide semiconductor layer 171 and in the overlying insulating layer 173 having defects. By providing the mixed region, an interface between the oxide semiconductor layer 171 and the insulating layer 173 having defects is not clearly defined; thus, diffusion of hydrogen from the oxide semiconductor layer into the insulating layer having defects is facilitated. For example, when a silicon oxide layer is used as the insulating layer 173 having defects, the mixed region 179 includes oxygen, silicon, and at least one of the metal elements included in the oxide semiconductor layer.

As in this embodiment, in the case where a silicon oxide is used for the insulating layer 173 having defects and an In—Ga—Zn—O-based film is used as the oxide semiconductor, the mixed region 179 includes oxygen, silicon, and at least one metal element selected from In, Ga, and Zn.

The mixed region 179 may have a thickness of 0.1 nm to 30 nm (preferably, 2 nm to 10 nm). The thickness of the mixed region 179 can be controlled by the film formation conditions of the sputtering method at the time of forming the insulating layer 173 having defects. If the power supply is set higher and the distance between the substrate and the target is set shorter in the sputtering method, the mixed region 179 can be formed thicker. When the sputtering method is conducted with higher power supply, water or the like adsorbed on a surface of the oxide semiconductor layer 171 can be removed.

The provision of the mixed region 179 between the oxide semiconductor layer 171 and the insulating layer 173 having defects promotes diffusion of hydrogen atoms, a compound including a hydrogen atom such as $H_2O$, a compound including a carbon atom, and the like which are included in the oxide semiconductor layer 171 into the insulating layer 173 having defects, and facilitates movement thereof.

The mixed region 179 needs to include excess oxygen and therefore is formed using a sputtering gas which includes much oxygen, and after the formation of the mixed region 179, the amount of oxygen in the sputtering gas may be adjusted for the formation of the insulating layer 173 having defects.

The insulating layer 173 having defects may be any insulating layer having many defects and a silicon oxynitride layer, an aluminum oxide layer, an aluminum oxynitride layer, or the like can be used instead of the silicon oxide layer. Further, a silicon nitride layer, a silicon nitride oxide layer, an aluminum nitride layer, an aluminum nitride oxide layer, or the like may be used as the insulating layer 173 having defects.

In this embodiment, to form an oxygen-excess mixed region and a silicon oxide layer, the substrate 100 over which layers up to the island-shaped oxide semiconductor layer 171 are formed is heated to room temperature or a temperature lower than 100° C., a sputtering gas including high-purity oxygen from which hydrogen and moisture are removed is introduced, and a silicon target is used.

A sputtering gas used in the formation of the insulating layer 173 having defects is preferably a high-purity gas in which impurities such as hydrogen, water, hydroxyl, or hydride are reduced to such a degree that the concentration thereof can be expressed by the unit ppm or ppb.

For example, a silicon oxide film is formed by a pulsed DC sputtering method under the following condition: a boron-doped silicon target which has a purity of 6N (the resistivity is 0.01 Ωcm) is used; the distance between the substrate and the target (T-S distance) is 89 mm; the pressure is 0.4 Pa, the direct-current (DC) power source is 6 kW, and the atmosphere is oxygen (the proportion of the oxygen flow is 100%). The film thickness is 300 nm. Note that instead of a silicon target, quartz (preferably, synthetic quartz) can be used as the target for forming the silicon oxide film. As a sputtering gas, an oxygen gas or a mixed gas of oxygen and argon is used.

It is preferable that the mixed region 179 and the insulating layer 173 having defects be formed while moisture remaining in the process chamber is removed so that hydrogen, hydroxyl, or moisture should not be included in the oxide semiconductor layer 171, the mixed region 179, or the insulating layer 173 having defects.

Note that the mixed region 179 may be formed using silicon oxynitride, aluminum oxide, aluminum oxynitride, or the like, instead of silicon oxide.

Then, heat treatment is performed at 100° C. to 400° C., in a state where the insulating layer 173 having defects and the oxide semiconductor layer 171 are in contact with each other with the oxygen-excess mixed region 179 therebetween. This heat treatment can diffuse hydrogen or moisture included in the oxide semiconductor layer 171 into the oxygen-excess mixed region 179 and the insulating layer 173 having defects. Since the oxygen-excess mixed region 179 is provided between the insulating layer 173 having defects and the oxide semiconductor layer 171, impurities such as hydrogen, hydroxyl, or moisture included in the island-shaped oxide semiconductor layer 171 are diffused from the oxide semiconductor layer 171 into the oxygen-excess mixed region 179 or into the insulating layer 173 having defects through the oxygen-excess mixed region 179.

The mixed region 179, which is provided between the oxide semiconductor layer 171 and the insulating layer 173 having defects, includes excess oxygen, and thus has many oxygen dangling bonds as defects and has high binding energy to impurities such as hydrogen, moisture, hydroxyl, or hydride. The provision of the oxygen-excess mixed region 179 facilitates movement and diffusion impurities such as hydrogen, moisture, hydroxyl, or hydride included in the oxide semiconductor layer 171 into the insulating layer 173 having defects.

In addition, when the impurities which have been removed from the oxide semiconductor layer 171 and diffused into the insulating layer 173 having defects move back toward the oxide semiconductor layer, the oxygen-excess mixed region 179 functions as a protective layer (a barrier layer) which is bound to and stabilizes the impurities so as to prevent the impurities from entering the oxide semiconductor layer.

As described above, by removing impurities such as hydrogen, moisture, hydroxyl, or hydride which cause variation from the oxide semiconductor layer, an oxide semiconductor layer 162 with reduced impurities can be provided. Further, the oxygen-excess mixed region 179 which functions as a barrier layer prevents the impurities which have been diffused into the insulating layer 173 having defects from entering the oxide semiconductor layer 162 again; thus, the impurity concentration of the oxide semiconductor layer 162 can be kept low.

Through the above process, the oxide semiconductor layer 162 in which the concentration of hydrogen and hydride is reduced can be formed.

As in Embodiment 2, an oxygen-excess oxide insulating layer may be provided instead of the oxygen-excess mixed region. An oxygen-excess oxide insulating layer produces an effect similar to the effect of the oxygen-excess mixed region.

A resist mask is formed over the insulating layer 173 having defects in a third photolithography step, and selective etching is performed to form an insulating layer 166 having defects. Then, the resist mask is removed (see FIG. 3C).

Then, a conductive film is formed over the gate insulating layer 152, the oxide semiconductor layer 162, and the insulating layer 166 having defects. After that, by a fourth photolithography step, a resist mask is formed, and selective etching is performed to form a source electrode layer 165a and a drain electrode layer 166b. Then, the resist mask is removed.

As a material of the source electrode layer 165a and the drain electrode layer 165b, an element selected from Al, Cr, Cu, Ta, Ti, Mo, and W, an alloy containing any of these elements as a component, an alloy containing any of these the elements in combination, or the like can be given. Further, the metal conductive film may have a single-layer structure or a stacked-layer structure of two or more layers.

Figure 3A:
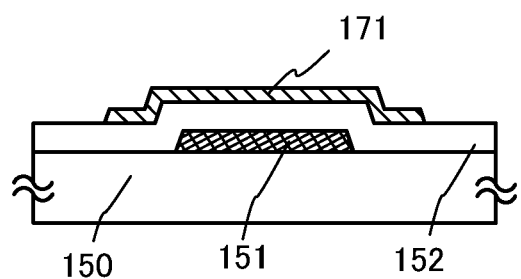
FIGS. 3A to 3E illustrate a semiconductor device and a manufacturing method thereof.
Figure 3B:
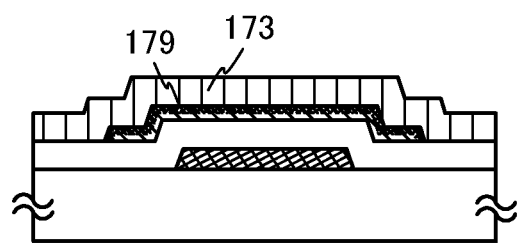
Figure 3C:
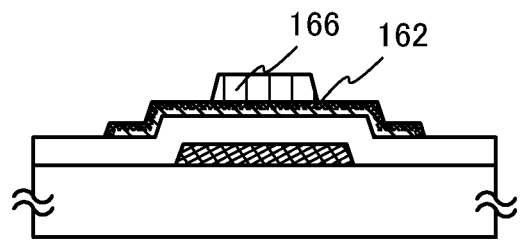
Figure 3D:
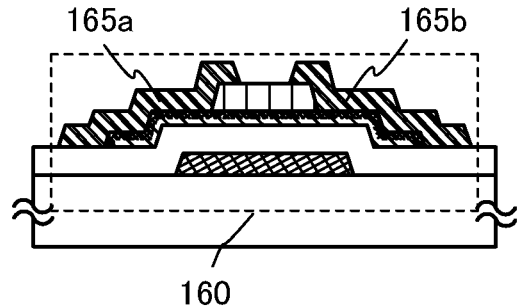
Figure 3E:
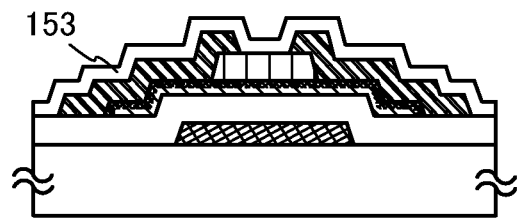

Through the above process, the thin film transistor 160 including the oxide semiconductor layer 162 in which the concentration of hydrogen and hydride is reduced can be formed (see FIG. 3D).

As described above, by removing remaining moisture in the reaction atmosphere at the time of the formation of the oxide semiconductor film, the concentration of hydrogen and hydride in the oxide semiconductor film can be reduced. In addition, by providing the insulating layer having defects over the oxide semiconductor layer with the oxygen-excess mixed region therebetween, impurities such as hydrogen or moisture in the oxide semiconductor layer are diffused into the insulating layer having defects, whereby the concentration of hydrogen and hydride in the oxide semiconductor layer can be reduced. Accordingly, the oxide semiconductor layer can be stabilized.

Even if impurities move back toward the oxide semiconductor layer 162 due to heat treatment in the steps after being diffused into the insulating layer 173 having defects, the oxygen-excess mixed region 179 functioning as a barrier layer prevents the impurities from entering the oxide semiconductor layer 162. Thus, the impurity concentration of the oxide semiconductor layer 162 can be kept low.

A protective insulating layer may be provided over the insulating layer having defects. In this embodiment, a protective insulating layer 153 is formed over the insulating layer 166 having defects, the source electrode layer 165a, and the drain electrode layer 165b. As the protective insulating layer 153, a silicon nitride film, a silicon nitride oxide film, an aluminum nitride film, or the like can be used. In this embodiment, the protective insulating layer 153 is formed using a silicon nitride film (see FIG. 3E).

Note that an oxide insulating layer may be further formed over the source electrode layer 165a, the drain electrode layer 165b, and the insulating layer 166 having defects, and the protective insulating layer 153 may be formed over the oxide insulating layer. Further, a planarization insulating layer may be formed over the protective insulating layer 153.

This embodiment can be implemented in appropriate combination with another embodiment.

As described above, a highly reliable semiconductor device with stable electric characteristics including a thin film transistor including an oxide semiconductor layer can be provided.

Embodiment 4

In this embodiment, another example of a thin film transistor which can be applied to a semiconductor device disclosed in this specification will be described.

A semiconductor device and a manufacturing method thereof in this embodiment will be described with reference to FIGS. 4A to 4C.

Although a thin film transistor 190 is described as a single-gate thin film transistor, a multi-gate thin film transistor including a plurality of channel formation regions can be formed if needed.

Hereinafter, a process for manufacturing the thin film transistor 190 over a substrate 140 will be described with reference to FIGS. 4A to 4C.

First, a conductive film is formed over the substrate 140 having an insulating surface, and then the gate electrode layer 181 is formed by a first photolithography step. In this embodiment, a tungsten film having a thickness of 150 nm is formed by a sputtering method as the gate electrode layer 181.

Then, a gate insulating layer 142 is formed over the gate electrode layer 181. In this embodiment, a silicon oxynitride layer having a thickness of 100 nm is formed by a plasma CVD method as the gate insulating layer 142.

Then, a conductive film is formed over the gate insulating layer 142. By a second photolithography step, a resist mask is formed over the conductive film, and selective etching is performed; thus, a source electrode layer 195a and a drain electrode layer 195b are formed. Then, the resist mask is removed.

Figure 4A:
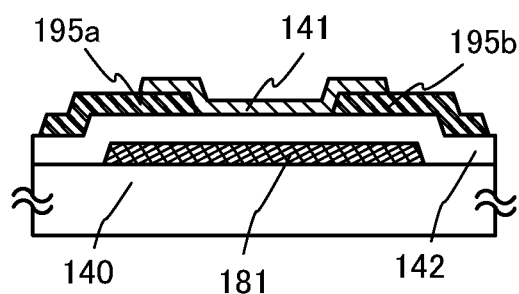
FIGS. 4A to 4C illustrate a semiconductor device and a manufacturing method thereof.
Figure 4B:
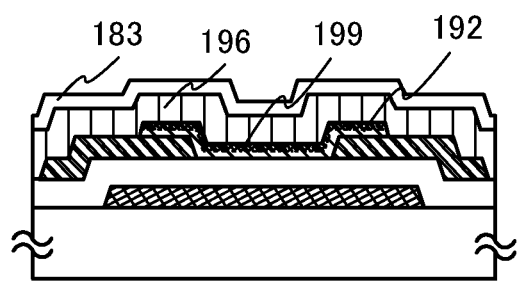

Then, an oxide semiconductor film is formed and processed into an island-shaped oxide semiconductor layer 141 by a third photolithography step (see FIG. 4A). In this embodiment, the oxide semiconductor film is formed by a sputtering method using an In—Ga—Zn—O-based metal oxide target.

The substrate is placed in a process chamber under reduced pressure, and is heated to a temperature lower than 400° C. While moisture remaining in the process chamber is removed, a sputtering gas from which hydrogen and moisture are removed is introduced to form the oxide semiconductor film over the substrate 140 using metal oxide as a target. In order to remove moisture remaining in the process chamber, a capture-type vacuum pump is preferably used. For example, a cryopump, an ion pump, or a titanium sublimation pump is preferably used. An evacuation means may be a turbo pump provided with a cold trap. In the film-formation chamber which is evacuated with the cryopump, hydrogen atoms, a compound including a hydrogen atom such as $H_2O$, a compound including a carbon atom, and the like are exhausted. Accordingly, the concentration of impurities included in the oxide semiconductor film formed in this film-formation chamber can be reduced.

As an example of film formation conditions, the following condition is employed: the distance between the substrate and the target is 100 mm, the pressure is 0.6 Pa, the direct current (DC) power supply is 0.5 kW, and the atmosphere is an oxygen atmosphere (the proportion of the oxygen flow is 100%). A pulse direct current (DC) power supply is preferable because powder substances (also referred to as particles or dust) generated in the film formation can be reduced and the film thickness can be made uniform. The oxide semiconductor film preferably has a thickness of 5 nm to 30 nm inclusive. Note that an appropriate thickness of the oxide semiconductor film varies depending on the material; therefore, the thickness may be determined as appropriate depending on the material.

Then, an insulating layer 196 having defects is formed over the gate insulating layer 142, the oxide semiconductor layer 141, the source electrode layer 195a, and the drain electrode layer 195b. In the formation of the insulating layer 196 having defects, the oxygen-excess mixed region 199 is formed between the oxide semiconductor layer 141 and the insulating layer 196 having defects.

The mixed region is a mixed region of materials included in the oxide semiconductor layer and in the overlying insulating layer having defects. By providing the mixed region, an interface between the oxide semiconductor layer and the insulating layer having defects is not clearly defined; thus, diffusion of hydrogen from the oxide semiconductor layer into the insulating layer having defects is facilitated. For example, when a silicon oxide layer is used as the insulating layer having defects, the mixed region includes oxygen, silicon, and at least one of the metal elements included in the oxide semiconductor layer.

As in this embodiment, in the case where a silicon oxide is used for the insulating layer 196 having defects and In—Ga—Zn—O-based oxide is used as the oxide semiconductor, the mixed region 199 includes oxygen, silicon, and at least one metal element selected from In, Ga, and Zn.

The mixed region 199 may have a thickness of 0.1 nm to 30 nm (preferably, 2 nm to 10 nm). The thickness of the mixed region 199 can be controlled by the film formation conditions of the sputtering method at the time of forming the insulating layer 196 having defects. If the power supply is set higher and the distance between the substrate and the target is set shorter in the sputtering method, the mixed region 199 can be formed thicker. When the sputtering method is conducted with higher power supply, water or the like adsorbed on a surface of the oxide semiconductor layer 141 can be removed.

The provision of the mixed region 199 between the oxide semiconductor layer 141 and the insulating layer 196 having defects promotes diffusion of hydrogen atoms, a compound including a hydrogen atom such as $H_2O$, a compound including a carbon atom, and the like which are included in the oxide semiconductor layer 141 into the insulating layer 196 having defects, and facilitates movement thereof.

The mixed region 199 needs to include excess oxygen and therefore is formed using a sputtering gas which includes much oxygen, and after the formation of the mixed region 199, the amount of oxygen in the sputtering gas may be adjusted for the formation of the insulating layer 196 having defects.

The insulating layer 196 having defects may be any insulating layer having many defects and a silicon oxynitride layer, an aluminum oxide layer, an aluminum oxynitride layer, or the like can be used instead of the silicon oxide layer. Further, a silicon nitride layer, a silicon nitride oxide layer, an aluminum nitride layer, an aluminum nitride oxide layer, or the like may be used as the insulating layer 196 having defects.

In this embodiment, to form an oxygen-excess mixed region and a silicon oxide layer, the substrate 140 over which layers up to the island-shaped oxide semiconductor layer 141, the source electrode layer 195a, and the drain electrode layer 195b are formed is heated to room temperature or a temperature lower than 100° C., a sputtering gas including high-purity oxygen from which hydrogen and moisture are removed is introduced, and a silicon target is used.

A sputtering gas used in the formation of the insulating layer 196 having defects is preferably a high-purity gas in which impurities such as hydrogen, water, hydroxyl, or hydride are reduced to such a degree that the concentration thereof can be expressed by the unit ppm or ppb.

For example, a silicon oxide film is formed by a pulsed DC sputtering method under the following condition: a boron-doped silicon target which has a purity of 6N (the resistivity is 0.01 Ωcm) is used; the distance between the substrate and the target (T-S distance) is 89 mm; the pressure is 0.4 Pa, the direct-current (DC) power source is 6 kW, and the atmosphere is oxygen (the proportion of the oxygen flow is 100%). The film thickness is 300 nm. Note that instead of a silicon target, quartz (preferably, synthetic quartz) can be used as the target for forming the silicon oxide film. As a sputtering gas, an oxygen gas or a mixed gas of oxygen and argon is used.

It is preferable that the mixed region 199 and the insulating layer 196 having defects be formed while moisture remaining in the process chamber is removed so that hydrogen, hydroxyl, or moisture should not be included in the oxide semiconductor layer 141, the insulating layer 173 having defects, or the mixed region 179.

Note that the mixed region 199 may be formed using silicon oxynitride, aluminum oxide, aluminum oxynitride, or the like, instead of silicon oxide.

Then, the protective insulating layer 183 is formed over the insulating layer 196 having defects. As the protective insulating layer 183, a silicon nitride film, a silicon nitride oxide film, an aluminum nitride film, or the like is used. As the protective insulating layer 183, a silicon nitride film is formed by heating the substrate 140 over which layers up to the insulating layer 196 having defects are formed, to a temperature of 100° C. to 400° C.; introducing a sputtering gas including high-purity nitrogen from which hydrogen and moisture are removed; and using a silicon target.

In this embodiment, heat treatment at 100° C. to 400° C. is performed on the substrate 140 in the formation of the protective insulating layer 183.

This heat treatment can diffuse hydrogen or moisture included in the oxide semiconductor layer 141 into the oxygen-excess mixed region 199 and the insulating layer 196 having defects. Since the oxygen-excess mixed region 199 is provided between the island-shaped oxide semiconductor layer 141 and the oxide insulating layer 196, impurities such as hydrogen, hydroxyl, or moisture included in the island-shaped oxide semiconductor layer 141 are diffused from the oxide semiconductor layer 141 into the oxygen-excess mixed region 199 or into the oxide insulating layer 196 through the oxygen-excess mixed region 199.

The mixed region 199, which is provided between the oxide semiconductor layer 141 and the insulating layer 196 having defects, includes excess oxygen, and thus has many oxygen dangling bonds as defects and has high binding energy to impurities such as hydrogen, moisture, hydroxyl, or hydride. The provision of the oxygen-excess mixed region 199 facilitates diffusion and movement of impurities such as hydrogen, moisture, hydroxyl, or hydride included in the oxide semiconductor layer 141 into the insulating layer 196 having defects.

In addition, when the impurities which have been removed from the oxide semiconductor layer 141 and diffused into the insulating layer 196 having defects move back toward the oxide semiconductor layer, the oxygen-excess mixed region 199 functions as a protective layer (a barrier layer) which is bound to and stabilizes the impurities so as to prevent the impurities from entering the oxide semiconductor layer.

As described above, by removing impurities such as hydrogen, moisture, hydroxyl, or hydride which cause variation from the oxide semiconductor layer, an oxide semiconductor layer 192 with reduced impurities can be provided. Further, the oxygen-excess mixed region 199 which functions as a barrier layer prevents the impurities which have been diffused into the insulating layer 196 having defects from entering the oxide semiconductor layer 192 again; thus, the impurity concentration of the oxide semiconductor layer 192 can be kept low.

Figure 4C:
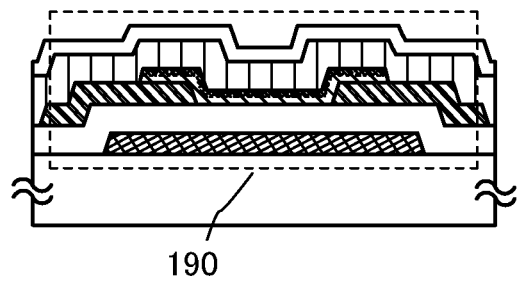

Through the above process, the thin film transistor 190 including the oxide semiconductor layer 192 in which the concentration of hydrogen and hydride is reduced can be formed (see FIG. 4C).

As in Embodiment 2, an oxygen-excess oxide insulating layer may be provided instead of the oxygen-excess mixed region. An oxygen-excess oxide insulating layer produces an effect similar to the effect of the oxygen-excess mixed region.

As described above, by removing remaining moisture in the reaction atmosphere at the time of the formation of the oxide semiconductor film, the concentration of hydrogen and hydride in the oxide semiconductor film can be reduced. In addition, by providing the insulating layer having defects over the oxide semiconductor layer with the oxygen-excess mixed region therebetween, impurities such as hydrogen or moisture in the oxide semiconductor layer are diffused into the insulating layer having defects, whereby the concentration of hydrogen and hydride in the oxide semiconductor layer can be reduced. Accordingly, the oxide semiconductor layer can be stabilized.

Even if impurities move back toward the oxide semiconductor layer 192 due to heat treatment in the steps after being diffused into the insulating layer 196 having defects, the oxygen-excess mixed region 199 functioning as a barrier layer prevents the impurities from entering the oxide semiconductor layer 192. Thus, the impurity concentration of the oxide semiconductor layer 192 can be kept low.

This embodiment can be implemented in appropriate combination with another embodiment.

As described above, a highly reliable semiconductor device with stable electric characteristics including a thin film transistor including an oxide semiconductor layer can be provided.

Embodiment 5

In this embodiment, another example of a thin film transistor which can be applied to a semiconductor device disclosed in this specification will be described. The same portion as or a portion having a function similar to those in the above embodiment can be formed in a manner similar to that described in the above embodiment, and also the steps similar to those in the above embodiment can be performed in a manner similar to that described in the above embodiment, and repetitive description is omitted. In addition, detailed description of the same portions is not repeated.

A semiconductor device and a manufacturing method thereof in this embodiment will be described with reference to FIGS. 5A to 5E.

FIGS. 5A to 5E illustrate an example of a cross-sectional structure of a semiconductor device. A thin film transistor 310 illustrated in FIGS. 5A to 5E has one type of a bottom-gate structure and is also referred to as an inverted staggered thin film transistor.

Although the thin film transistor 310 is described as a single-gate thin film transistor, a multi-gate thin film transistor including a plurality of channel formation regions can be formed if needed.

Hereinafter, a process for manufacturing the thin film transistor 310 over a substrate 300 will be described with reference to FIGS. 5A to 5E.

First, a conductive film is formed over the substrate 300 having an insulating surface, and then a gate electrode layer 311 is formed by a first photolithography step. Note that a resist mask may be formed by an ink jetting method. The formation of the resist mask by an ink jetting method does not use a photomask; thus, manufacturing cost can be reduced.

Although there is no particular limitation on a substrate which can be used as the substrate 300 having an insulating surface, it is necessary that the substrate have at least enough heat resistance to withstand heat treatment performed later. A glass substrate formed of barium borosilicate glass, aluminoborosilicate glass or the like can be used.

As a glass substrate, if the temperature of the heat treatment to be performed later is high, a glass substrate whose strain point is 730° C. or higher is preferably used. As a glass substrate, a glass material such as aluminosilicate glass, aluminoborosilicate glass, or barium borosilicate glass is used, for example. Note that by containing a larger amount of barium oxide (BaO) than boron oxide, a glass substrate which is heat-resistant and more practical can be obtained. Therefore, a glass substrate containing more BaO than $B_2O_3$ is preferably used.

Note that a substrate formed of an insulator such as a ceramic substrate, a quartz substrate, or a sapphire substrate may be used instead of the above glass substrate. Alternatively, crystallized glass or the like may be used.

An insulating film functioning as a base film may be provided between the substrate 300 and the gate electrode layer 311. The base film has a function of preventing diffusion of impurity elements from the substrate 300, and can be formed to have a single-layer or stacked-layer structure including one or more of a silicon nitride layer, a silicon oxide layer, a silicon nitride oxide layer, and a silicon oxynitride layer.

The gate electrode layer 311 can be formed to have a single-layer or a stacked-layer structure using a metal material such as molybdenum, titanium, chromium, tantalum, tungsten, aluminum, copper, neodymium, or scandium, or an alloy material which includes any of these materials as its main component.

For example, as a two-layer structure of the gate electrode layer 311, a two-layer structure in which a molybdenum layer is formed over an aluminum layer, a two-layer structure in which a molybdenum layer is formed over a copper layer, a two-layer structure in which a titanium nitride layer or a tantalum nitride layer is formed over a copper layer, a two-layer structure in which a molybdenum layer is formed over a titanium nitride layer, or a two-layer structure in which a tungsten layer is formed over a tungsten nitride layer is preferable. As a three-layer structure, a stacked-layer structure in which a tungsten layer or a tungsten nitride layer, a layer of an alloy of aluminum and silicon or alloy of aluminum and titanium, and a titanium nitride layer or a titanium layer are stacked is preferable.

Then, a gate insulating layer 302 is formed over the gate electrode layer 311.

The gate insulating layer 302 can be formed to have a single-layer or a stacked-layer structure including a silicon oxide layer, a silicon nitride layer, a silicon oxynitride layer, a silicon nitride oxide layer, an aluminum oxide layer, or a hafnium oxide layer by a plasma CVD method, a sputtering method, or the like. For example, a silicon oxynitride layer may be formed using a deposition gas containing $SiH_4$, oxygen, and nitrogen by a plasma CVD method. The gate insulating layer 302 has a thickness of 100 nm to 500 nm inclusive. In the case of a stacked-layer structure, the first gate insulating layer with a thickness of 50 nm to 200 nm inclusive and the second gate insulating layer with a thickness of 5 nm to 300 nm inclusive are stacked in this order.

In this embodiment, a silicon oxynitride layer having a thickness of 100 nm is formed by a plasma CVD method as the gate insulating layer 302.

Then, the oxide semiconductor film 330 having a thickness of 2 nm to 200 nm inclusive is formed over the gate insulating layer 302.

Note that before the oxide semiconductor film 330 is formed by a sputtering method, dust attached to a surface of the gate insulating layer 302 is preferably removed by reverse sputtering in which an argon gas is introduced and plasma is generated. Note that instead of an argon atmosphere, nitrogen, helium, oxygen, or the like may be used.

Figure 5A:
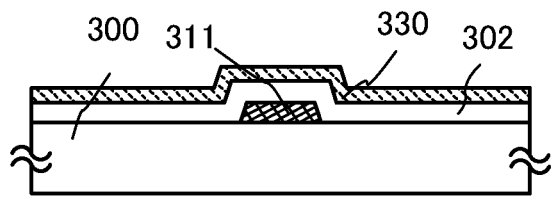
FIGS. 5A to 5E illustrate a semiconductor device and a manufacturing method thereof.
Figure 5B:
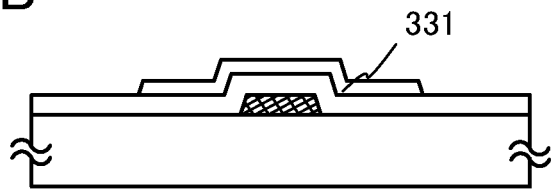
Figure 5C:
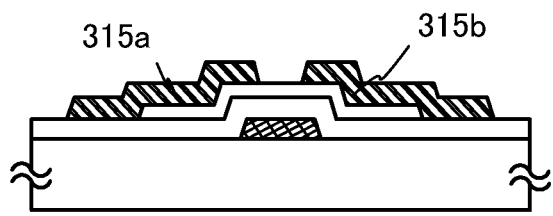
Figure 5D:
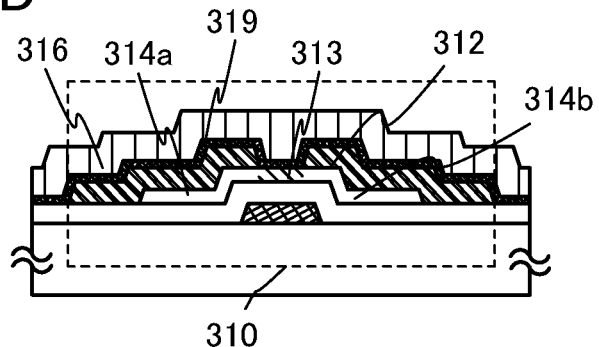
Figure 5E:
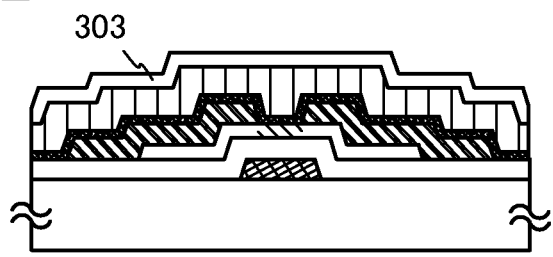
Figure 6A:
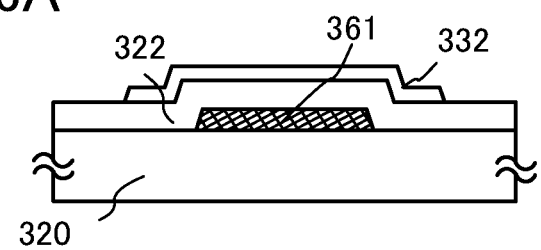
FIGS. 6A to 6D illustrate a semiconductor device and a manufacturing method thereof.
Figure 6B:
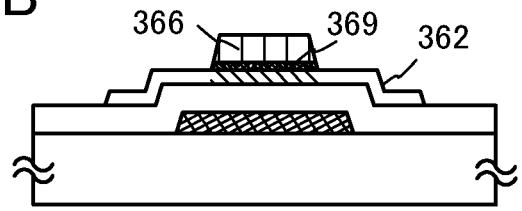
Figure 6C:
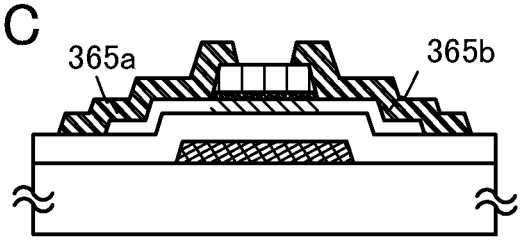
Figure 6D:
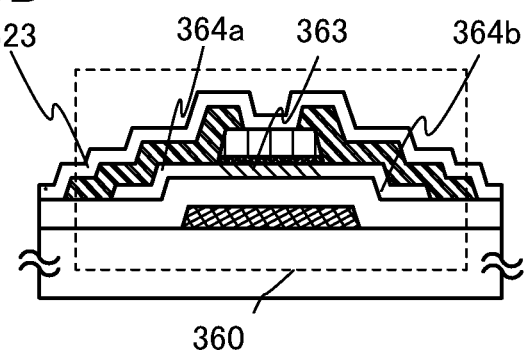

As the oxide semiconductor film 330, an In—Ga—Zn—O-based film, an In—Sn—Zn—O-based oxide semiconductor film, an In—Al—Zn—O-based oxide semiconductor film, an Sn—Ga—Zn—O-based oxide semiconductor film, an Al—Ga—Zn—O-based oxide semiconductor film, an Sn—Al—Zn—O-based oxide semiconductor film, an In—Zn—O-based oxide semiconductor film, an Sn—Zn—O-based oxide semiconductor film, an Al—Zn—O-based oxide semiconductor film, an In—O-based oxide semiconductor film, an Sn—O-based oxide semiconductor film, or a Zn—O-based oxide semiconductor film is used. In this embodiment, the oxide semiconductor film 330 is formed by a sputtering method using an In—Ga—Zn—O-based metal oxide target. A cross-sectional view at this stage is shown in FIG. 5A. Further, the oxide semiconductor film 330 can be formed by a sputtering method in a rare gas (typically argon) atmosphere, an oxygen atmosphere, or an atmosphere of a rare gas (typically argon) and oxygen. In the case of film formation by a sputtering method, a target including $SiO_2$ at 2 wt % to 10 wt % inclusive may be used.

As a target for forming the oxide semiconductor film 330 by a sputtering method, a metal oxide target including zinc oxide as its main component can be used. Another example of a metal oxide target which can be used is a metal oxide target including In, Ga, and Zn (with a composition ratio of $In_2O_3:Ga_2O_3:ZnO=1:1:1$ [molar ratio]). As the metal oxide target including In, Ga, and Zn, a target having a composition ratio of $In_2O_3:Ga_2O_3:ZnO=1:1:2$ [molar ratio] or a target having a composition ratio of $In_2O_3:Ga_2O_3:ZnO=1:1:4$ [molar ratio] can be used. The filling factor of the metal oxide target is 90% to 100% inclusive, and preferably 95% to 99.9% inclusive. With the use of a metal oxide target with high filling factor, the formed oxide semiconductor film has high density.

A sputtering gas used in the formation of the oxide semiconductor film 330 is preferably a high-purity gas in which impurities such as hydrogen, water, hydroxyl, or hydride are reduced to such a degree that the concentration thereof can be expressed by the unit ppm or ppb.

The substrate is placed in a process chamber under reduced pressure, and the substrate temperature is set to 100° C. to 600° C. inclusive, preferably 200° C. to 400° C. inclusive. By forming the oxide semiconductor film while the substrate is heated, the impurity concentration of the formed oxide semiconductor film can be reduced. In addition, damage by sputtering can be reduced. While moisture remaining in the process chamber is removed, a sputtering gas from which hydrogen and moisture are removed is introduced to form the oxide semiconductor film 330 over the substrate 300 using metal oxide as a target. In order to remove moisture remaining in the process chamber, a capture-type vacuum pump is preferably used. For example, a cryopump, an ion pump, or a titanium sublimation pump is preferably used. An evacuation means may be a turbo pump provided with a cold trap. In the film-formation chamber which is evacuated with the cryopump, hydrogen atoms and a compound including a hydrogen atom such as water ($H_2O$) (and preferably, a compound including a carbon atom), for example, are exhausted. Accordingly, the concentration of impurities included in the oxide semiconductor film formed in this film-formation chamber can be reduced.

As an example of film formation conditions, the following condition is employed: the distance between the substrate and the target is 100 mm, the pressure is 0.6 Pa, the direct current (DC) power supply is 0.5 kW, and the atmosphere is an oxygen atmosphere (the proportion of the oxygen flow is 100%). A pulse direct current (DC) power supply is preferable because powder substances (also referred to as particles or dust) generated in the film formation can be reduced and the film thickness can be made uniform. The oxide semiconductor film preferably has a thickness of 5 nm to 30 nm inclusive. Note that an appropriate thickness of the oxide semiconductor film varies depending on the material; therefore, the thickness may be determined as appropriate depending on the material.

Then, the oxide semiconductor film 330 is processed into an island-shaped oxide semiconductor layer by a second photolithography step. Note that a resist mask for forming the island-shaped oxide semiconductor layer may be formed by an ink jetting method. The formation of the resist mask by an ink jetting method does not use a photomask; thus, manufacturing cost can be reduced.

Then, first heat treatment is performed on the oxide semiconductor layer. By this first heat treatment, dehydration or dehydrogenation of the oxide semiconductor layer can be performed. The first heat treatment is performed at a temperature of 400° C. to 750° C. inclusive, preferably, equal to or greater than 400° C. and lower than a strain point of the substrate. Here, the substrate is introduced into an electric furnace which is one of heat treatment apparatuses, and heat treatment is performed on the oxide semiconductor layer in a nitrogen atmosphere at 450° C. for one hour. After that, the oxide semiconductor layer is prevented from being exposed to air and from again including water or hydrogen; thus the oxide semiconductor layer 331 is obtained (see FIG. 5B).

Note that the heat treatment apparatus is not limited to an electric furnace, and an apparatus may be provided with a device for heating an object by heat conduction or thermal radiation from a heater such as a resistance heater. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus with which an object is heated by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for heat treatment using a high-temperature gas. As the gas, an inert gas which does not react with the object by heat treatment, for example, nitrogen or a rare gas such as argon, is used.

For example, as the first heat treatment, GRTA in which the substrate is moved into an inert gas heated to a temperature as high as 650° C. to 700° C., heated for several minutes, and moved out of the inert gas heated to the high temperature may be performed. With GRTA, high-temperature heat treatment for a short period of time can be achieved.

Note that in the first heat treatment, it is preferable that moisture, hydrogen, or the like be not contained in nitrogen or a rare gas such as helium, neon, or argon. Alternatively, nitrogen or a rare gas such as helium, neon, or argon which is introduced into a heat treatment apparatus preferably has a purity of 6N (99.9999%) or higher, more preferably 7N (99.99999%) or higher (that is, the impurity concentration is 1 ppm or lower, preferably 0.1 ppm or lower).

Further, depending on conditions of the first heat treatment or a material of the oxide semiconductor layer, the oxide semiconductor layer may be crystallized to be a microcrystalline film or a polycrystalline film. For example, the oxide semiconductor layer may crystallize to become a microcrystalline oxide semiconductor film having a crystallinity of 90% or more, or 80% or more. Further, depending on conditions of the first heat treatment or a material of the oxide semiconductor layer, the oxide semiconductor layer may become an amorphous oxide semiconductor layer containing no crystalline component. The oxide semiconductor layer may become an oxide semiconductor film in which a microcrystalline portion (with a grain diameter of 1 nm to 20 nm inclusive, typically 2 nm to 4 nm inclusive) is mixed into an amorphous oxide semiconductor.

The first heat treatment of the oxide semiconductor layer can be performed on the oxide semiconductor film 330 before being processed into the island-shaped oxide semiconductor layer. In that case, after the first heat treatment, the substrate is taken out of the heat treatment apparatus and subjected to the photolithography step.

The heat treatment having an effect of dehydration or dehydrogenation on the oxide semiconductor layer may be performed at any of the following timings: after the oxide semiconductor layer is formed; after a source electrode layer and a drain electrode layer are formed over the oxide semiconductor layer; and after a protective insulating layer is formed over the source electrode layer and the drain electrode layer.

Further, in the case where a contact hole is formed in the gate insulating layer 302, the formation of the contact hole may be performed before or after the dehydration or dehydrogenation of the oxide semiconductor film 330.

Note that the etching of the oxide semiconductor film is not limited to wet etching and may be dry etching.

The etching conditions (such as an etchant, etching time, and temperature) are adjusted as appropriate depending on the material so that the film can be etched into the desired shape.

Then, a conductive film is formed over the gate insulating layer 302 and the oxide semiconductor layer 331. The conductive film may be formed by a sputtering method or a vacuum evaporation method. As a material of the second conductive film, an element selected from aluminum (Al), chromium (Cr), copper (Cu), tantalum (Ta), titanium (Ti), molybdenum (Mo), and tungsten (W), an alloy containing any of these elements as a component, an alloy containing any of these the elements in combination, or the like can be given. Further, one or more materials selected from manganese (Mn), magnesium (Mg), zirconium (Zr), beryllium (Be), and thorium (Th) may be used. Further, the conductive film may have a single-layer structure or a stacked-layer structure of two or more layers. For example, a single-layer structure of an aluminum film including silicon, a two-layer structure in which a titanium film is stacked over an aluminum film, a three-layer structure in which a titanium film, an aluminum film, and a titanium film are stacked in this order can be given. Alternatively, a film, an alloy film, or a nitride film which contains aluminum (Al) and one or a plurality of elements selected from titanium (Ti), tantalum (Ta), tungsten (W), molybdenum (Mo), chromium (Cr), neodymium (Nd), and scandium (Sc) may be used.

In the case where heat treatment is performed after the formation of the conductive film, the conductive film preferably has heat resistance enough to withstand the heat treatment.

By a third photolithography step, a resist mask is formed over the conductive film, and selective etching is performed; thus, a source electrode layer 315a and a drain electrode layer 315b are formed. Then, the resist mask is removed (see FIG. 5C).

Ultraviolet, a KrF laser light, or an ArF laser light is used for light exposure for forming the resist mask in the third photolithography step. A channel length L of the thin film transistor to be formed later depends on a width of an interval between a bottom portion of the source electrode layer and a bottom portion of the drain electrode layer which are adjacent to each other over the oxide semiconductor layer 331. Note that when light exposure is performed for the channel length L of less than 25 nm, extreme ultraviolet with extremely short wavelengths of several nanometers to several tens of nanometers is used for light exposure for forming the resist mask in the third photolithography step. Light exposure with extreme ultraviolet leads to a high resolution and a large depth of field. Accordingly, the channel length L of the thin film transistor to be formed later can be set to 10 nm to 1000 nm inclusive. Thus, the operation speed of a circuit can be increased, and low power consumption can be achieved due to extremely small off-state current.

Note that each material and etching conditions are adjusted as appropriate so that the oxide semiconductor layer 331 should not removed by etching of the conductive film.

In this embodiment, a Ti film is used as the conductive film, an In—Ga—Zn—O-based oxide semiconductor is used as the oxide semiconductor layer 331, and an ammonia hydrogen peroxide (a mixture of ammonia, water, and hydrogen peroxide) is used as an etchant.

Note that in the third photolithography step, the oxide semiconductor layer 331 may be partly etched in some cases to be an oxide semiconductor layer having a groove (a depression portion). A resist mask for forming the source electrode layer 315a and the drain electrode layer 315b may be formed by an ink jetting method. The formation of the resist mask by an ink jetting method does not use a photomask; thus, manufacturing cost can be reduced.

Further, an oxide conductive layer may be formed between the oxide semiconductor layer 331 and the source electrode layer 315a and the drain electrode layer 315b. The oxide conductive layer and the metal layer for forming the source and drain electrode layers can be formed successively. The oxide conductive layer can function as a source region and a drain region.

When the oxide conductive layer is provided as the source region or the drain region between the oxide semiconductor layer 331 and the source electrode layer 315a or the drain electrode layer 315b, the source region and the drain region can have lower resistance and the transistor can operate at high speed.

Further, in order to reduce the number of photomasks used in the photolithography steps and reduce the number of photolithography steps, an etching step may be performed with the use of a multi-tone mask which is a light-exposure mask through which light is transmitted to have a plurality of intensities. A resist mask formed using a multi-tone mask has a plurality of thicknesses and further can be changed in shape by being etched, and therefore, can be used in a plurality of etching steps to provide different patterns. Therefore, a resist mask corresponding to at least two kinds of different patterns can be formed using one multi-tone mask. Thus, the number of light-exposure masks can be reduced and the number of corresponding photolithography steps can also be reduced, whereby simplification of the process can be realized.

Then, plasma treatment using a gas such as $N_2O$, $N_2$, or Ar is performed. By this plasma treatment, adsorbed water or the like of an exposed surface of the oxide semiconductor layer is removed. Plasma treatment may be performed using a mixed gas of oxygen and argon.

Then, an oxygen-excess oxide insulating layer 319 is formed over the gate insulating layer 302, the oxide semiconductor layer 331, the source electrode layer 315a, and the drain electrode layer 315b. In this embodiment, the oxygen-excess oxide insulating layer 319 is formed to be in contact with the oxide semiconductor layer 331 in a region where the oxide semiconductor layer 331 does not overlap with the source electrode layer 315a or the drain electrode layer 315b.

In this embodiment, to form a silicon oxide layer ($SiO_{2+x}$, where x is preferably equal to or greater than 0 and less than 3) as the oxygen-excess oxide insulating layer 319, the substrate 300 over which layers up to the source electrode layer 315a and the drain electrode layer 315b are formed is heated to room temperature or a temperature lower than 100° C., a sputtering gas including high-purity oxygen from which hydrogen and moisture are removed is introduced, and a silicon target is used. The thickness of the oxygen-excess oxide insulating layer 319 may be 0.1 nm to 30 nm (preferably, 2 nm to 10 nm).

A sputtering gas used in the formation of the oxygen-excess oxide insulating layer 319 is preferably a high-purity gas in which impurities such as hydrogen, water, hydroxyl, or hydride are reduced to such a degree that the concentration thereof can be expressed by the unit ppm or ppb.

For example, a silicon oxide layer is formed by a pulsed DC sputtering method under the following condition: a boron-doped silicon target which has a purity of 6N (the resistivity is 0.01 Ωcm) is used; the distance between the substrate and the target (T-S distance) is 89 mm; the pressure is 0.4 Pa, the direct-current (DC) power source is 6 kW, and the atmosphere is oxygen (the proportion of the oxygen flow is 100%). Note that instead of a silicon target, quartz (preferably, synthetic quartz) can be used as the target for forming the silicon oxide layer. As a sputtering gas, an oxygen gas or a mixed gas of oxygen and argon is used.

Note that instead of a silicon oxide layer, a silicon oxynitride layer, an aluminum oxide layer, an aluminum oxynitride layer, or the like can be used as the oxygen-excess oxide insulating layer 319.

Then an insulating layer 316 having defects is formed over the oxygen-excess oxide insulating layer 319 without exposure to air. The oxygen-excess oxide insulating layer 319 and the insulating layer 316 having defects may be formed in the same process chamber using the same target.

In this embodiment, a 200-nm-thick silicon oxide layer is formed as the insulating layer 316 having defects by a sputtering method. The substrate temperature in film formation may be room temperature to 300° C. inclusive. In this embodiment, the substrate temperature is 100° C. Formation of a silicon oxide film by a sputtering method can be performed in a rare gas (typically, argon) atmosphere, an oxygen atmosphere, or an atmosphere of a rare gas (typically, argon) and oxygen. As a target, a silicon oxide target or a silicon target can be used. For example, a silicon oxide layer can be formed by a sputtering method in an atmosphere of oxygen and nitrogen using a silicon target.

The insulating layer 316 having defects may be any insulating layer having many defects, but is preferably an inorganic insulating film which does not include impurities such as moisture, hydrogen ions, or OH and which prevents the entry of them from the outside. Instead of the silicon oxide layer, a silicon oxynitride layer, an aluminum oxide layer, an aluminum oxynitride layer, or the like can be typically used. Further, a silicon nitride layer, a silicon nitride oxide layer, an aluminum nitride layer, an aluminum nitride oxide layer, or the like may be used as the insulating layer 316 having defects.

It is preferable that the insulating layer 316 having defects be formed while moisture remaining in the process chamber is removed so that hydrogen, hydroxyl, or moisture should not be included in the oxide semiconductor layer 331 or the insulating layer 316 having defects.

In order to remove moisture remaining in the process chamber, a capture-type vacuum pump is preferably used. For example, a cryopump, an ion pump, or a titanium sublimation pump is preferably used. An evacuation means may be a turbo pump provided with a cold trap. In the film-formation chamber which is evacuated with the cryopump, hydrogen atoms and a compound including a hydrogen atom such as water ($H_2O$), for example, are exhausted. Accordingly, the concentration of impurities included in the insulating layer 316 having defects formed in this film-formation chamber can be reduced.

A sputtering gas used in the formation of the insulating layer 316 having defects is preferably a high-purity gas in which impurities such as hydrogen, water, hydroxyl, or hydride are reduced to such a degree that the concentration thereof can be expressed by the unit ppm or ppb.

Then, second heat treatment (preferably, at 200° C. to 400° C. inclusive, for example, at 250° C. to 350° C. inclusive) is performed in an inert gas atmosphere or in an oxygen gas atmosphere. For example, the second heat treatment is performed at 250° C. for one hour in a nitrogen atmosphere. In the second heat treatment, a portion of the oxide semiconductor layer (a channel formation region) is heated while being in contact with the oxide insulating layer 319.

This heat treatment can diffuse hydrogen or moisture included in the oxide semiconductor layer 331 into the oxygen-excess oxide insulating layer 319 and the insulating layer 316 having defects. Since the oxygen-excess oxide insulating layer 319 is provided between the oxide semiconductor layer 331 and the insulating layer 316 having defects, impurities such as hydrogen, hydroxyl, or moisture included in the island-shaped oxide semiconductor layer 331 are diffused from the oxide semiconductor layer 331 into the oxygen-excess oxide insulating layer 319 or into the insulating layer 316 having defects through the oxygen-excess oxide insulating layer 319.

The oxide insulating layer 319, which is provided between the oxide semiconductor layer 331 and the insulating layer 316 having defects, includes excess oxygen, and thus has many oxygen dangling bonds as defects and has high binding energy to impurities such as hydrogen, moisture, hydroxyl, or hydride. The provision of the oxygen-excess oxide insulating layer 319 facilitates diffusion and movement of impurities such as hydrogen, moisture, hydroxyl, or hydride included in the oxide semiconductor layer 331 into the insulating layer 316 having defects.

In addition, when the impurities which have been removed from the oxide semiconductor layer 331 and diffused into the insulating layer 316 having defects move back toward the oxide semiconductor layer, the oxygen-excess oxide insulating layer 319 functions as a protective layer (a barrier layer) which is bound to and stabilizes the impurities so as to prevent the impurities from entering the oxide semiconductor layer.

As described above, by removing impurities such as hydrogen, moisture, hydroxyl, or hydride which cause variation from the oxide semiconductor layer, an oxide semiconductor layer 312 with reduced impurities can be provided. Further, the oxygen-excess oxide insulating layer 319 which functions as a barrier layer prevents the impurities which have been diffused into the insulating layer 316 having defects from entering the oxide semiconductor layer again; thus, the impurity concentration of the oxide semiconductor layer 312 can be kept low.

Note that the heat treatment for diffusion of impurities such as hydrogen from the oxide semiconductor layer into the insulating layer having defects is not necessarily combined with the second heat treatment and may be performed separately.

In the above steps, the heat treatment for dehydration or dehydrogenation is performed on the formed oxide semiconductor film, whereby the oxide semiconductor film is brought into an oxygen-deficient state and reduced in resistance that is, becomes an n-type layer, and then the oxide insulating layer is formed in contact with the oxide semiconductor layer, which brings part of the oxide semiconductor layer into an oxygen-excess state. As a result, the channel formation region 313 which overlaps with the gate electrode layer 311 becomes an i-type region. At that time, a high-resistance source region 314a which has a carrier concentration higher than at least the channel formation region 313 and overlaps with the source electrode layer 315a, and a high-resistance drain region 314b which has a carrier concentration higher than at least the channel formation region 313 and overlaps with the drain electrode layer 315b are formed in a self-aligned manner. Through the above steps, the thin film transistor 310 is formed (see FIG. 5D).

Although an example in which an oxygen-excess oxide insulating layer is formed is described in this embodiment, an oxygen-excess mixed region may be provided instead of the oxygen-excess oxide insulating layer as in Embodiment 1. An oxygen-excess mixed region produces an effect similar to the effect of the oxygen-excess oxide insulating layer.

Heat treatment may be further performed at 100° C. to 200° C. inclusive in air for 1 hour to 30 hours inclusive. In this embodiment, the heat treatment is performed at 150° C. for 10 hours. This heat treatment may be performed at a fixed heating temperature. Alternatively, the following change in the heating temperature may be conducted plural times repeatedly: the heating temperature is increased from room temperature to a temperature of 100° C. to 200° C. inclusive and then decreased to room temperature. Further, this heat treatment may be performed under reduced pressure before the formation of the insulating layer having defects. Under reduced pressure, the heat treatment time can be shortened. With this heat treatment, hydrogen is introduced from the oxide semiconductor layer to the insulating layer having defects; thus, a normally-off thin film transistor can be obtained. Accordingly, the reliability of the semiconductor device can be improved.

By forming the high-resistance drain region 314b (or the high-resistance source region 314a) in part of the oxide semiconductor layer which overlaps with the drain electrode layer 315b (or the source electrode layer 315a), the reliability of the thin film transistor can be improved. Specifically, by forming the high-resistance drain region 314b, the conductivity can vary stepwise from the drain electrode layer 315b to the high-resistance drain region 314b and the channel formation region 313. Therefore, in the case where the thin film transistor operates with the drain electrode layer 315b connected to a wiring for supplying a high power supply potential VDD, the high-resistance drain region functions as a buffer and a high electric field is not applied locally even if a high electric field is applied between the gate electrode layer 311 and the drain electrode layer 315b; thus, the breakdown voltage of the transistor can be improved.

Further, the high-resistance source region or the high-resistance drain region in the oxide semiconductor layer is formed in the entire thickness direction in the case where the thickness of the oxide semiconductor layer is equal to or less than 15 nm. In the case where the thickness of the oxide semiconductor layer is as thick as 30 nm to 50 nm inclusive, in part of the oxide semiconductor layer, that is, in a region in the oxide semiconductor layer which is in contact with the source electrode layer or the drain electrode layer and the vicinity thereof, resistance is reduced and a high-resistance source region or a high-resistance drain region is formed, while a region in the oxide semiconductor layer which is close to the gate insulating film can be made to be an i-type region.

A protective insulating layer may be additionally provided over the insulating layer 316 having defects. For example, a silicon nitride film is formed by an RF sputtering method. Since an RF sputtering method has high productivity, it is preferably used as a film formation method of the protective insulating layer. The protective insulating layer is formed using an inorganic insulating film which does not include impurities such as moisture, a hydrogen ion, and OH and which prevents the entry of them from the outside; for example, a silicon nitride film, an aluminum nitride film, a silicon nitride oxide film, an aluminum nitride oxide film, or the like is used. In this embodiment, the protective insulating layer 303 is formed as the protective insulating layer using a silicon nitride film (see FIG. 5E).

In this embodiment, as the protective insulating layer 303, a silicon nitride film is formed by heating the substrate 300 over which layers up to the insulating layer 316 having defects are formed, to a temperature of 100° C. to 400° C.; introducing a sputtering gas including high-purity nitrogen from which hydrogen and moisture are removed; and using a silicon target. In this step also, it is preferable that the protective insulating layer 303 be formed while moisture remaining in the process chamber is removed as in the case of the insulating layer 316 having defects.

A planarization insulating layer for planarization may be provided over the protective insulating layer 303.

As described above, by removing remaining moisture in the reaction atmosphere at the time of the formation of the oxide semiconductor film, the concentration of hydrogen and hydride in the oxide semiconductor film can be reduced. In addition, by providing the insulating layer having defects over the oxide semiconductor layer with the oxygen-excess mixed region therebetween, impurities such as hydrogen or moisture in the oxide semiconductor layer are diffused into the insulating layer having defects, whereby the concentration of hydrogen and hydride in the oxide semiconductor layer can be reduced. Accordingly, the oxide semiconductor layer can be stabilized.

Even if impurities move back toward the oxide semiconductor layer 312 due to heat treatment in the steps after being diffused into the insulating layer 316 having defects, the oxygen-excess oxide insulating layer 319 functioning as a barrier layer prevents the impurities from entering the oxide semiconductor layer 312. Thus, the impurity concentration of the oxide semiconductor layer 312 can be kept low.

This embodiment can be implemented in appropriate combination with another embodiment.

As described above, a highly reliable semiconductor device with stable electric characteristics including a thin film transistor including an oxide semiconductor layer can be provided.

Embodiment 6

In this embodiment, another example of a thin film transistor which can be applied to a semiconductor device disclosed in this specification will be described. The same portion as or a portion having a function similar to those in the above embodiment can be formed in a manner similar to that described in the above embodiment, and also the steps similar to those in the above embodiment can be performed in a manner similar to that described in the above embodiment, and repetitive description is omitted. In addition, detailed description of the same portions is not repeated.

A semiconductor device and a manufacturing method thereof in this embodiment will be described with reference to FIGS. 6A to 6D.

FIGS. 6A to 6D illustrate an example of a cross-sectional structure of a semiconductor device. A thin film transistor 360 illustrated in FIGS. 6A to 6D has one type of a bottom-gate structure called a channel-protective structure (also referred to as a channel-stop structure) and is also referred to as an inverted staggered thin film transistor.

Although the thin film transistor 360 is described as a single-gate thin film transistor, a multi-gate thin film transistor including a plurality of channel formation regions can be formed if needed.

Hereinafter, a process for manufacturing the thin film transistor 360 over a substrate 320 will be described with reference to FIGS. 6A to 6D.

First, a conductive film is formed over the substrate 320 having an insulating surface, and then the gate electrode layer 361 is formed by a first photolithography step. Note that a resist mask may be formed by an ink jetting method. The formation of the resist mask by an ink jetting method does not use a photomask; thus, manufacturing cost can be reduced.

The gate electrode layer 361 can be formed to have a single-layer or a stacked-layer structure using a metal material such as molybdenum, titanium, chromium, tantalum, tungsten, aluminum, copper, neodymium, or scandium, or an alloy material which includes any of these materials as its main component.

Then, a gate insulating layer 322 is formed over the gate electrode layer 361.

In this embodiment, a silicon oxynitride layer having a thickness of 100 nm is formed by a plasma CVD method as the gate insulating layer 322.

Then, an oxide semiconductor film having a thickness of 2 nm to 200 nm inclusive is formed over the gate insulating layer 322 and processed into an island-shaped oxide semiconductor layer by a second photolithography step. In this embodiment, the oxide semiconductor film is formed by a sputtering method using an In—Ga—Zn—O-based metal oxide target.

It is preferable that oxide semiconductor film be formed while moisture remaining in the process chamber is removed so that hydrogen, hydroxyl, or moisture should not be included in the oxide semiconductor film.

In order to remove moisture remaining in the process chamber, a capture-type vacuum pump is preferably used. For example, a cryopump, an ion pump, or a titanium sublimation pump is preferably used. An evacuation means may be a turbo pump provided with a cold trap. In the film-formation chamber which is evacuated with the cryopump, hydrogen atoms and a compound including a hydrogen atom such as water ($H_2O$), for example, are exhausted. Accordingly, the concentration of impurities included in the oxide semiconductor film formed in this film-formation chamber can be reduced.

A sputtering gas used in the formation of the oxide semiconductor film is preferably a high-purity gas in which impurities such as hydrogen, water, hydroxyl, or hydride are reduced to such a degree that the concentration thereof can be expressed by the unit ppm or ppb.

Then, dehydration or dehydrogenation of the oxide semiconductor layer is performed. The temperature of first heat treatment for dehydration or dehydrogenation is 400° C. to 750° C. inclusive, preferably, equal to or greater than 400° C. and lower than a strain point of the substrate. Here, the substrate is introduced into an electric furnace which is one of heat treatment apparatuses, and heat treatment is performed on the oxide semiconductor layer in a nitrogen atmosphere at 450° C. for one hour. After that, the oxide semiconductor layer is prevented from being exposed to air and from again including water or hydrogen; thus the oxide semiconductor layer 332 is obtained (see FIG. 6A).

Then, plasma treatment using a gas such as $N_2O$, $N_2$, or Ar is performed. By this plasma treatment, adsorbed water or the like of an exposed surface of the oxide semiconductor layer is removed. Plasma treatment may be performed using a mixed gas of oxygen and argon.

Then, an oxygen-excess oxide insulating layer is formed over the gate insulating layer 322 and the oxide semiconductor layer 332.

In this embodiment, a silicon oxide layer ($SiO_{2+x}$, where x is preferably equal to or greater than 0 and less than 3) is formed as an oxygen-excess oxide insulating layer 369 using a sputtering gas including high-purity oxygen from which hydrogen and moisture are removed and a silicon target. The thickness of the oxygen-excess oxide insulating layer may be 0.1 nm to 30 nm (preferably, 2 nm to 10 nm).

Note that instead of a silicon oxide layer, a silicon oxynitride layer, an aluminum oxide layer, an aluminum oxynitride layer, or the like can be used as the oxygen-excess oxide insulating layer.

Then an insulating layer having defects is formed over the oxygen-excess oxide insulating layer without exposure to air. The oxygen-excess oxide insulating layer and the insulating layer having defects may be formed in the same process chamber using the same target.

In this embodiment, a 200-nm-thick silicon oxide layer is formed as the insulating layer having defects by a sputtering method.

It is preferable that the oxygen-excess oxide insulating layer and the insulating layer having defects be formed while moisture remaining in the process chamber is removed so that hydrogen, hydroxyl, or moisture should not be included in the oxide semiconductor layer 332, the oxygen-excess oxide insulating layer, or the insulating layer 366 having defects.

In order to remove moisture remaining in the process chamber, a capture-type vacuum pump is preferably used. For example, a cryopump, an ion pump, or a titanium sublimation pump is preferably used. An evacuation means may be a turbo pump provided with a cold trap. In the film-formation chamber which is evacuated with the cryopump, hydrogen atoms and a compound including a hydrogen atom such as water ($H_2O$), for example, are exhausted. Accordingly, the concentration of impurities included in the insulating layer 366 having defects formed in this film-formation chamber can be reduced.

A sputtering gas used in the formation of the oxygen-excess oxide insulating layer and the insulating layer having defects is preferably a high-purity gas in which impurities such as hydrogen, water, hydroxyl, or hydride are reduced to such a degree that the concentration thereof can be expressed by the unit ppm or ppb.

Then, heat treatment is performed at 100° C. to 400° C., in a state where the insulating layer having defects and the oxide semiconductor layer are in contact with each other with the oxygen-excess oxide insulating layer therebetween. This heat treatment can diffuse hydrogen or moisture included in the oxide semiconductor layer 332 into the oxygen-excess oxide insulating layer and the insulating layer having defects. Since the oxygen-excess oxide insulating layer is provided between the insulating layer having defects and the oxide semiconductor layer, impurities such as hydrogen, hydroxyl, or moisture included in the island-shaped oxide semiconductor layer are diffused from the oxide semiconductor layer into the oxygen-excess oxide insulating layer or into the insulating layer having defects through the oxygen-excess oxide insulating layer.

The oxide insulating layer, which is provided between the oxide semiconductor layer and the insulating layer having defects, includes excess oxygen, and thus has many oxygen dangling bonds as defects and has high binding energy to impurities such as hydrogen, moisture, hydroxyl, or hydride. The provision of the oxygen-excess oxide insulating layer facilitates diffusion and movement of impurities such as hydrogen, moisture, hydroxyl, or hydride included in the oxide semiconductor layer into the insulating layer having defects.

In addition, when the impurities which have been removed from the oxide semiconductor layer and diffused into the insulating layer having defects move back toward the oxide semiconductor layer, the oxygen-excess oxide insulating layer functions as a protective layer (a barrier layer) which is bound to and stabilizes the impurities so as to prevent the impurities from entering the oxide semiconductor layer.

By a third photolithography step, a resist mask is formed over the oxygen-excess oxide insulating layer and the insulating layer having defects, and selective etching is performed; thus, the oxygen-excess oxide insulating layer 369 and the insulating layer 366 having defects are formed. Then, the resist mask is removed.

As described above, by removing impurities such as hydrogen, moisture, hydroxyl, or hydride which cause variation from the oxide semiconductor layer, an oxide semiconductor layer 362 with reduced impurities can be provided. Further, the oxygen-excess oxide insulating layer 369 which functions as a barrier layer prevents the impurities which have been diffused into the insulating layer 366 having defects from entering the oxide semiconductor layer again; thus, the impurity concentration of the oxide semiconductor layer 362 can be kept low.

Although an example in which an oxygen-excess oxide insulating layer is formed is described in this embodiment, an oxygen-excess mixed region may be provided instead of the oxygen-excess oxide insulating layer as in Embodiment 1 or 3. The oxygen-excess mixed region produces an effect similar to the effect of the oxygen-excess oxide insulating layer.

Then, second heat treatment (preferably, at 200° C. to 400° C. inclusive, for example, at 250° C. to 350° C. inclusive) may be performed in an inert gas atmosphere or in an oxygen gas atmosphere. For example, the second heat treatment is performed at 250° C. for one hour in a nitrogen atmosphere. In the second heat treatment, a portion of the oxide semiconductor layer (a channel formation region) is heated while being in contact with the oxide insulating layer 369. Note that the heat treatment for diffusion of impurities such as hydrogen from the oxide semiconductor layer into the insulating layer having defects may be combined with the second heat treatment.

In this embodiment, the oxide semiconductor layer over which the oxide insulating layer 369 and the insulating layer 366 having defects are formed and which is partly exposed is further subjected to heat treatment in nitrogen or an inert gas atmosphere, or under reduced pressure. By the heat treatment in nitrogen or an inert gas atmosphere, or under reduced pressure, an exposed region of the oxide semiconductor layer which is not covered with the oxide insulating layer 369 or the insulating layer 366 having defects is brought into an oxygen-deficient state and reduced in resistance, that is, the exposed region can be an n-type region. For example, the heat treatment is performed at 250° C. for one hour in a nitrogen atmosphere.

By the heat treatment on the oxide semiconductor layer 332 over which the oxide insulating layer 369 and the insulating layer 366 having defects are formed in a nitrogen atmosphere, the resistance of the exposed region of the oxide semiconductor layer is reduced; thus, an oxide semiconductor layer 362 including regions with different resistances (indicated as a shaded region and a white region in FIG. 6B) is formed.

Then, a conductive film is formed over the gate insulating layer 322, the oxide semiconductor layer 362, the oxide insulating layer 369, and the insulating layer 366 having defects. After that, by a fourth photolithography step, a resist mask is formed, and selective etching is performed to form a source electrode layer 365a and a drain electrode layer 365b. Then, the resist mask is removed (see FIG. 6C).

As a material of the source electrode layer 365a and the drain electrode layer 365b, an element selected from Al, Cr, Cu, Ta, Ti, Mo, and W, an alloy containing any of these elements as a component, an alloy containing any of these the elements in combination, or the like can be given. Further, the metal conductive film may have a single-layer structure or a stacked-layer structure of two or more layers.

In the above steps, the heat treatment for dehydration or dehydrogenation is performed on the formed oxide semiconductor film, whereby the oxide semiconductor film is brought into an oxygen-deficient state and reduced in resistance, and then the oxide insulating layer is formed in contact with the oxide semiconductor film, which selectively brings part of the oxide semiconductor film into an oxygen-excess state. As a result, the channel formation region 363 which overlaps with the gate electrode layer 361 becomes an i-type region. At that time, a source region 364a which has lower resistance than the channel formation region 363 and overlaps with the source electrode layer 365a, and a drain region 364b which has lower resistance than the channel formation region 363 and overlaps with the drain electrode layer 365b are formed in a self-aligned manner. Through the above steps, the thin film transistor 360 is formed.

Heat treatment may be further performed at 100° C. to 200° C. inclusive in air for 1 hour to 30 hours inclusive. In this embodiment, the heat treatment is performed at 150° C. for 10 hours. This heat treatment may be performed at a fixed heating temperature. Alternatively, the following change in the heating temperature may be conducted plural times repeatedly: the heating temperature is increased from room temperature to a temperature of 100° C. to 200° C. inclusive and then decreased to room temperature. Further, this heat treatment may be performed under reduced pressure before the formation of the oxide insulating film. Under reduced pressure, the heat treatment time can be shortened. With this heat treatment, hydrogen is introduced from the oxide semiconductor layer to the insulating layer having defects; thus, a normally-off thin film transistor can be obtained. Accordingly, the reliability of the semiconductor device can be improved.

By forming the high-resistance drain region 364b (or the high-resistance source region 364a) which overlaps with the drain electrode layer 365b (or the source electrode layer 365a) in the oxide semiconductor layer, the reliability of the thin film transistor can be improved. Specifically, by forming the high-resistance drain region 364b, the conductivity can vary stepwise from the drain electrode layer to the high-resistance drain region 364b and the channel formation region 363. Therefore, in the case where the thin film transistor operates with the drain electrode layer 365b connected to a wiring for supplying a high power supply potential VDD, the high-resistance drain region functions as a buffer and a high electric field is not applied locally even if a high electric field is applied between the gate electrode layer 361 and the drain electrode layer 365b; thus, the breakdown voltage of the transistor can be improved.

A protective insulating layer 323 is formed over the source electrode layer 365a, drain electrode layer 365b, the oxide insulating layer 369, and the insulating layer 366 having defects. In this embodiment, the protective insulating layer 323 is formed using a silicon nitride layer (see FIG. 6D).

Note that an oxide insulating layer may be further formed over the source electrode layer 365a, the drain electrode layer 365b, the oxide insulating layer 369, and the insulating layer 366 having defects, and the protective insulating layer 323 may be formed over the oxide insulating layer.

As described above, by removing remaining moisture in the reaction atmosphere at the time of the formation of the oxide semiconductor film, the concentration of hydrogen and hydride in the oxide semiconductor film can be reduced. In addition, by providing the insulating layer having defects over the oxide semiconductor layer with the oxygen-excess mixed region therebetween, impurities such as hydrogen or moisture in the oxide semiconductor layer are diffused into the insulating layer having defects, whereby the concentration of hydrogen and hydride in the oxide semiconductor layer can be reduced. Accordingly, the oxide semiconductor layer can be stabilized.

Even if impurities move back toward the oxide semiconductor layer 362 due to heat treatment in the steps after being diffused into the insulating layer 366 having defects, the oxide insulating layer 369 functioning as a barrier layer prevents the impurities from entering the oxide semiconductor layer 362. Thus, the impurity concentration of the oxide semiconductor layer 362 can be kept low.

This embodiment can be implemented in appropriate combination with another embodiment.

As described above, a highly reliable semiconductor device with stable electric characteristics including a thin film transistor including an oxide semiconductor layer can be provided.

Embodiment 7

In this embodiment, another example of a thin film transistor which can be applied to a semiconductor device disclosed in this specification will be described. A thin film transistor 380 in this embodiment can be used as the thin film transistor 110 in Embodiment 1.

Figure 7:
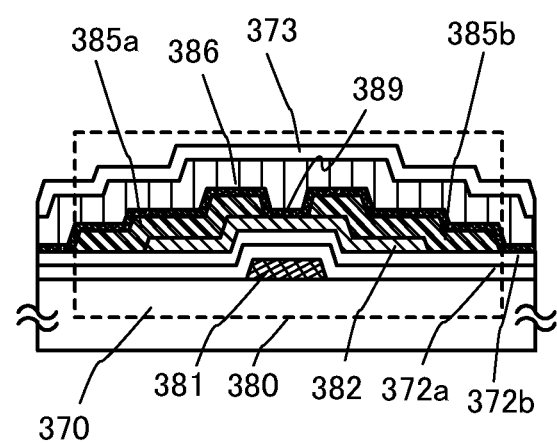
FIG. 7 illustrates a semiconductor device.

In this embodiment, FIG. 7 shows an example of a thin film transistor whose manufacturing process is partly different from that of Embodiment 5. FIG. 7 is the same as FIGS. 5A to 5E except for part of the steps. Thus, the same parts as in FIGS. 5A to 5E are denoted by the same reference numerals and detailed description on the parts is omitted.

In accordance with Embodiment 5, a gate electrode layer 381 is formed over a substrate 370, and a first gate insulating layer 372a and a second gate insulating layer 372b are stacked. In this embodiment, the gate insulating layer has a two-layer structure: a nitride insulating layer is used as the first gate insulating layer 372a and an oxide insulating layer is used as the second gate insulating layer 372b.

As the oxide insulating layer, a silicon oxide layer, a silicon oxynitride layer, an aluminum oxide layer, an aluminum oxynitride layer, a hafnium oxide layer or the like can be used. As the nitride insulating layer, a silicon nitride layer, a silicon nitride oxide layer, an aluminum nitride layer, an aluminum nitride oxide layer, or the like can be used.

In this embodiment, a silicon nitride layer and a silicon oxide layer are stacked over the gate electrode layer 381 in this order. A gate insulating layer having a thickness of 150 nm is formed in such a manner that a silicon nitride layer ($SiN_y$ (y>0)) having a thickness of 50 nm to 200 nm inclusive (in this embodiment, 50 nm) is formed by a sputtering method as a first gate insulating layer 372a, and then a silicon oxide layer ($SiO_x$ (x>0)) having a thickness of 5 nm to 300 nm (in this embodiment, 100 nm) inclusive is formed as a second gate insulating layer 372b over the first gate insulating layer 372a.

Then, an oxide semiconductor film is formed and processed into an island-shaped oxide semiconductor layer by a photolithography step. In this embodiment, the oxide semiconductor film is formed by a sputtering method using an In—Ga—Zn—O-based metal oxide target.

It is preferable that oxide semiconductor film be formed while moisture remaining in the process chamber is removed so that hydrogen, hydroxyl, or moisture should not be included in the oxide semiconductor film.

In order to remove moisture remaining in the process chamber, a capture-type vacuum pump is preferably used. For example, a cryopump, an ion pump, or a titanium sublimation pump is preferably used. An evacuation means may be a turbo pump provided with a cold trap. In the film-formation chamber which is evacuated with the cryopump, hydrogen atoms, a compound including a hydrogen atom such as water ($H_2O$), and the like are exhausted. Accordingly, the impurity concentration of the oxide semiconductor film formed in this film-formation chamber can be reduced.

A sputtering gas used in the formation of the oxide semiconductor film is preferably a high-purity gas in which impurities such as hydrogen, water, hydroxyl, or hydride are reduced to such a degree that the concentration thereof can be expressed by the unit ppm or ppb.

Then, dehydration or dehydrogenation of the oxide semiconductor layer is performed. The temperature of first heat treatment for dehydration or dehydrogenation is 400° C. to 750° C. inclusive, preferably, equal to or greater than 425° C. and lower than a strain point of the substrate. Note that in the case of the temperature of equal to or greater than 425° C., the heat treatment time may be one hour or shorter, whereas in the case of the temperature lower than 425° C., the heat treatment time is longer than one hour. Here, the substrate is introduced into an electric furnace which is one of heat treatment apparatuses, and heat treatment is performed on the oxide semiconductor layer in a nitrogen atmosphere. After that, the oxide semiconductor layer is prevented from being exposed to air and from again including water or hydrogen. After that, a high-purity oxygen gas, a high-purity $N_2O$ gas, or an ultra-dry air (with a dew point of equal to or less than −40° C., preferably equal to or less than −60° C.) is introduced into the same furnace and cooling is performed. It is preferable that the oxygen gas and the $N_2O$ gas do not include water, hydrogen, or the like. Alternatively, the oxygen gas or the $N_2O$ gas which is introduced into the heat treatment apparatus preferably has a purity of 6N (99.9999%) or higher, more preferably 7N (99.99999%) or higher (that is, the impurity concentration of the oxygen gas or the $N_2O$ gas is 1 ppm or lower, preferably 0.1 ppm or lower).

Note that the heat treatment apparatus is not limited to an electric furnace. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus with which an object is heated by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. In addition, the LRTA apparatus may be provided with not only a lamp but also a device which heats an object by heat conduction or heat radiation from a heater such as a resistance heater. GRTA is a method of heat treatment using a high-temperature gas. As the gas, an inert gas which does not react with the object by heat treatment, for example, nitrogen or a rare gas such as argon, is used. The heat treatment may be performed at 600° C. to 750° C. for several minutes by an RTA method.

Further, after the first heat treatment for dehydration or dehydrogenation, heat treatment may be performed at 200° C. to 400° C. inclusive, preferably 200° C. to 300° C. inclusive, in an atmosphere of an oxygen gas or an $N_2O$ gas.

The first heat treatment of the oxide semiconductor layer can be performed on the oxide semiconductor film before being processed into the island-shaped oxide semiconductor layer. In that case, after the first heat treatment, the substrate is taken out of the heat treatment apparatus and subjected to the photolithography step.

Through the above process, the entire oxide semiconductor film is placed in an oxygen-excess state to have higher resistance, that is, to be an i-type oxide semiconductor film. Thus, an oxide semiconductor layer 382 whose entire region is i-type is formed.

Then, by a photolithography step, a resist mask is formed over the oxide semiconductor layer 382, and selective etching is performed to form a source electrode layer 385a and a drain electrode layer 385b.

In this embodiment, a silicon oxide layer ($SiO_{2+x}$, where x is preferably equal to or greater than 0 and less than 3) is formed as an oxygen-excess oxide insulating layer 389 using a sputtering gas including high-purity oxygen from which hydrogen and moisture are removed and a silicon target. The thickness of the oxygen-excess oxide insulating layer 389 may be 0.1 nm to 30 nm (preferably, 2 nm to 10 nm).

Note that instead of a silicon oxide layer, a silicon oxynitride layer, an aluminum oxide layer, an aluminum oxynitride layer, or the like can be used as the oxygen-excess oxide insulating layer 389.

Then an insulating layer 386 having defects is formed over the oxygen-excess oxide insulating layer 389 without exposure to air. The oxygen-excess oxide insulating layer 389 and the insulating layer 386 having defects may be formed in the same process chamber using the same target.

In this embodiment, a 200-nm-thick silicon oxide layer is formed as the insulating layer 386 having defects by a sputtering method.

It is preferable that the oxygen-excess oxide insulating layer 389 and the insulating layer 386 having defects be formed while moisture remaining in the process chamber is removed so that hydrogen, hydroxyl, or moisture should not be included in the oxide semiconductor layer 382, the oxygen-excess oxide insulating layer 389, or the insulating layer 386 having defects.

In order to remove moisture remaining in the process chamber, a capture-type vacuum pump is preferably used. For example, a cryopump, an ion pump, or a titanium sublimation pump is preferably used. An evacuation means may be a turbo pump provided with a cold trap. In the film-formation chamber which is evacuated with the cryopump, hydrogen atoms and a compound including a hydrogen atom such as water ($H_2O$), for example, are exhausted. Accordingly, the concentration of impurities included in the insulating layer 386 having defects formed in this film-formation chamber can be reduced.

A sputtering gas used in the formation of the oxygen-excess oxide insulating layer 389 and the insulating layer 386 having defects is preferably a high-purity gas in which impurities such as hydrogen, water, hydroxyl, or hydride are reduced to such a degree that the concentration thereof can be expressed by the unit ppm or ppb.

Then, heat treatment is performed at 100° C. to 400° C., in a state where the insulating layer 386 having defects and the oxide semiconductor layer are in contact with each other with the oxygen-excess oxide insulating layer 389 therebetween. This heat treatment can diffuse hydrogen or moisture included in the oxide semiconductor layer into the oxygen-excess oxide insulating layer 389 and the insulating layer 386 having defects. Since the oxygen-excess oxide insulating layer 389 is provided between the insulating layer 386 having defects and the oxide semiconductor layer 382, impurities such as hydrogen, hydroxyl, or moisture included in the island-shaped oxide semiconductor layer are diffused from the oxide semiconductor layer into the oxygen-excess oxide insulating layer 389 or into the insulating layer 386 having defects through the oxygen-excess oxide insulating layer 389.

The oxide insulating layer 389, which is provided between the oxide semiconductor layer and the insulating layer 386 having defects, includes excess oxygen, and thus has many oxygen dangling bonds as defects and has high binding energy to impurities such as hydrogen, moisture, hydroxyl, or hydride. The provision of the oxygen-excess oxide insulating layer 389 facilitates movement and diffusion of impurities such as hydrogen, moisture, hydroxyl, or hydride included in the oxide semiconductor layer into the insulating layer 386 having defects.

In addition, when the impurities which have been removed from the oxide semiconductor layer and diffused into the insulating layer 386 having defects move back toward the oxide semiconductor layer, the oxygen-excess oxide insulating layer 389 functions as a protective layer (a barrier layer) which is bound to and stabilizes the impurities so as to prevent the impurities from entering the oxide semiconductor layer.

As described above, by removing impurities such as hydrogen, moisture, hydroxyl, or hydride which cause variation from the oxide semiconductor layer, the oxide semiconductor layer 382 with reduced impurities can be provided. Further, the oxygen-excess oxide insulating layer 389 which functions as a barrier layer prevents the impurities which have been diffused into the insulating layer 386 having defects from entering the oxide semiconductor layer again; thus, the impurity concentration of the oxide semiconductor layer 382 can be kept low.

Through the above process, the thin film transistor 380 can be formed.

Then, in order to reduce variation in electric characteristics of the thin film transistor, heat treatment (equal to or greater than 150° C. and lower than 350° C.) may be performed in an inert gas atmosphere or in a nitrogen gas atmosphere. For example, the heat treatment is performed at 250° C. for one hour in a nitrogen atmosphere. Note that the heat treatment for diffusion of impurities such as hydrogen from the oxide semiconductor layer into the insulating layer having defects may be combined with this heat treatment.

Heat treatment may be further performed at 100° C. to 200° C. inclusive in air for 1 hour to 30 hours inclusive. In this embodiment, the heat treatment is performed at 150° C. for 10 hours. This heat treatment may be performed at a fixed heating temperature. Alternatively, the following change in the heating temperature may be conducted plural times repeatedly: the heating temperature is increased from room temperature to a temperature of 100° C. to 200° C. inclusive and then decreased to room temperature. Further, this heat treatment may be performed under reduced pressure before the formation of the oxide insulating layer. Under reduced pressure, the heat treatment time can be shortened. With this heat treatment, hydrogen is introduced from the oxide semiconductor layer to the oxide insulating layer; thus, a normally-off thin film transistor can be obtained. Accordingly, the reliability of the semiconductor device can be improved.

A protective insulating layer 373 is formed over the insulating layer 386 having defects. In this embodiment, a 100-nm-thick silicon nitride layer is formed as the protective insulating layer 373 by a sputtering method.

The protective insulating layer 373 and the first gate insulating layer 372a which are formed using a nitride insulating layer do not include impurities such as moisture, hydrogen, hydride, or hydroxide and prevent the entry of them from the outside.

Therefore, in a manufacturing process after the formation of the protective insulating layer 373, entry of impurities such as moisture from the outside can be prevented. Further, even after a device is completed as a semiconductor device such as a liquid crystal display device, entry of impurities such as moisture from the outside can be prevented in the long term; therefore, the long-term reliability of the device can be improved.

Further, the insulating layer provided between the protective insulating layer 373 which is formed using a nitride insulating layer and the first gate insulating layer 372a may be removed so that the protective insulating layer 373 and the first gate insulating layer 372a are in contact with each other.

Accordingly, impurities such as moisture, hydrogen, hydride, and hydroxide in the oxide semiconductor layer are reduced as much as possible and reentry of such impurities is prevented, so that the impurity concentration of the oxide semiconductor layer can be kept low.

A planarization insulating layer for planarization may be provided over the protective insulating layer 373.

As described above, by removing remaining moisture in the reaction atmosphere at the time of the formation of the oxide semiconductor film, the concentration of hydrogen and hydride in the oxide semiconductor film can be reduced. In addition, by providing the insulating layer having defects over the oxide semiconductor layer with the oxygen-excess mixed region therebetween, impurities such as hydrogen or moisture in the oxide semiconductor layer are diffused into the insulating layer having defects, whereby the concentration of hydrogen and hydride in the oxide semiconductor layer can be reduced. Accordingly, the oxide semiconductor layer can be stabilized.

Even if impurities move back toward the oxide semiconductor layer 382 due to heat treatment in the steps after being diffused into the insulating layer 386 having defects, the oxygen-excess oxide insulating layer 389 functioning as a barrier layer prevents the impurities from entering the oxide semiconductor layer 382. Thus, the impurity concentration of the oxide semiconductor layer 382 can be kept low.

This embodiment can be implemented in appropriate combination with another embodiment.

As described above, a highly reliable semiconductor device with stable electric characteristics including a thin film transistor including an oxide semiconductor layer can be provided.

Embodiment 8

In this embodiment, an example of a thin film transistor which can be applied to a semiconductor device disclosed in this specification will be described.

In this embodiment, an example of using a light-transmitting conductive material for a gate electrode layer, a source electrode layer, and a drain electrode layer will be described. Except those, the thin film transistor can be formed in a manner similar to that in the above embodiments; accordingly, repetitive description of the same components or components having functions similar to those of above embodiment and repetitive description of similar process will be omitted. Further, detailed description of the same parts will also be omitted.

For example, as materials of the gate electrode layer, the source electrode layer, and the drain electrode layer, a conductive material that transmits visible light can be used. For example, In—Sn—O-based metal oxide, In—Sn—Zn—O-based metal oxide, In—Al—Zn—O-based metal oxide, Sn—Ga—Zn—O-based metal oxide, Al—Ga—Zn—O-based metal oxide, Sn—Al—Zn—O-based metal oxide, In—Zn—O-based metal oxide, Sn—Zn—O-based metal oxide, Al—Zn—O-based metal oxide, In—O-based metal oxide, Sn—O-based metal oxide, or a Zn—O-based metal oxide can be employed. The thickness thereof is set as appropriate in the range of from 50 nm to 300 nm inclusive. As a film-formation method of the metal oxide used for the gate electrode layer, the source electrode layer, and the drain electrode layer, a sputtering method, a vacuum evaporation method (an electron beam evaporation method or the like), an arc discharge ion plating method or a spray method is used. In the case of film formation by a sputtering method, a target including $SiO_2$ at 2 wt % to 10 wt % inclusive may be used.

Note that the unit of the percentage of components in the light-transmitting conductive film is atomic percent, and the percentage of components is evaluated by analysis using an electron probe X-ray microanalyzer (EPMA).

In the pixel provided with the thin film transistor, when a pixel electrode layer, another electrode layer such as a capacitor electrode layer, or another wiring layer such as a capacitor wiring layer is formed using a conductive film that transmits visible light, a display device having high aperture ratio is realized. Needless to say, it is preferable that a gate insulating layer, an oxide insulating layer, a protective insulating layer, and a planarization insulating layer be each formed using a film that transmits visible light.

In this specification, a film that transmits visible light refers to a film having such a thickness as to have visible light transmittance of 75% to 100%. In the case where the film has conductivity, the film is referred to as a transparent conductive film. Further, a conductive film which is semi-transparent to visible light may be used as metal oxide for the gate electrode layer, the source electrode layer, the drain electrode layer, the pixel electrode layer, another electrode layer, or another wiring layer. The conductive film which is semi-transparent to visible light means a film having visible light transmittance of 50% to 75%.

When a thin film transistor has a light-transmitting property, the aperture ratio can be increased. For small liquid crystal display panels of 10 inches or smaller in particular, a high aperture ratio can be achieved even when the size of pixels is decreased in order to realize higher resolution of display images by increasing the number of gate wirings, for example. Further, by using a film having a light-transmitting property for components of a thin film transistor, a high aperture ratio can be achieved even when one pixel is divided into a plurality of sub-pixels in order to realize a wide viewing angle. That is, a high aperture ratio can be realized even when a group of thin film transistors are densely arranged, and thus the display region can have a sufficient area. For example, in the case where one pixel includes two to four sub-pixels, the aperture ratio can be improved because the thin film transistor has a light-transmitting property. Further, when a storage capacitor is formed using the same steps and the same materials as those of the thin film transistor, the storage capacitor can also have a light-transmitting property; therefore, the aperture ratio can be further increased.

This embodiment can be implemented in appropriate combination with another embodiment.

Embodiment 9

In this embodiment, an example of a thin film transistor which can be applied to a semiconductor device disclosed in this specification will be described.

Figure 18:
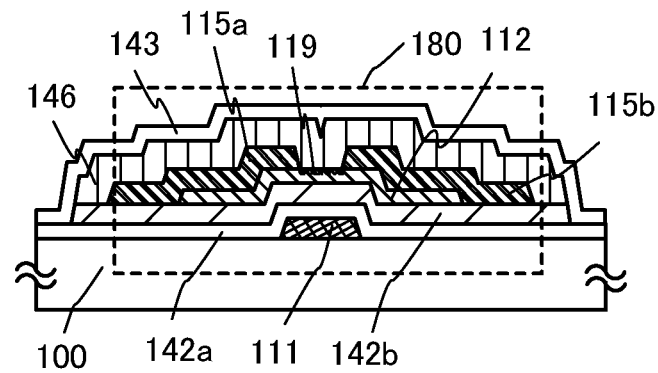
FIG. 18 illustrates a semiconductor device.

In this embodiment, FIG. 18 illustrates an example in which an oxide semiconductor layer is surrounded by nitride insulating films in a cross section. FIG. 18 is the same as FIGS. 1A to 1E except the top surface shape and the position of the end portion of an oxide insulating layer and the structure of a gate insulating layer; therefore, the same portions are denoted by the same reference numerals, and detailed description of the same portions is omitted.

A thin film transistor 180 in FIG. 18 is a bottom-gate thin film transistor and includes, over the substrate 100 having an insulating surface, the gate electrode layer 111, a gate insulating layer 142a formed using a nitride insulating layer, a gate insulating layer 142b formed using an oxide insulating layer, the oxide semiconductor layer 112, the oxygen-excess mixed region 119, the source electrode layer 115a, and the drain electrode layer 115b. In addition, an insulating layer 146 having defects which covers the thin film transistor 180 and overlaps with the oxide semiconductor layer 112 with the mixed region 119 therebetween is provided. A protective insulating layer 143 formed using a nitride insulating layer is additionally provided over the insulating layer 146 having defects. The protective insulating layer 143 is in contact with the gate insulating layer 142a, which is a nitride insulating layer.

Since the oxygen-excess mixed region 119 has a high binding energy to hydrogen or moisture (a hydrogen atom or a compound including a hydrogen atom such as $H_2O$) and these impurities are stabilized in the oxygen-excess mixed region 119 and the insulating layer 146 having defects, these impurities can be diffused from the oxide semiconductor layer into the oxygen-excess mixed region and the insulating layer 146 having defects, whereby these impurities can be removed from the oxide semiconductor layer. Further, the oxygen-excess mixed region 119 functions as a barrier layer against impurities which have been diffused into the insulating layer 146 having defects to prevent the impurities from entering the oxide semiconductor layer 112 again; thus, the impurity concentration of the oxide semiconductor layer 112 can be kept low. Accordingly, the thin film transistor 180 including the oxide semiconductor layer 112 in which impurities such as hydrogen, moisture, hydroxyl, or hydride (also referred to as a hydrogen compound) which cause variation are reduced is a highly reliable thin film transistor with stable electric characteristics.

In the thin film transistor 180 of this embodiment, the gate insulating layer has a stacked structure in which a nitride insulating layer and an oxide insulating layer are stacked over the gate electrode layer. Further, before the protective insulating layer 143 formed using a nitride insulating layer is formed, the insulating layer 146 having defects and the gate insulating layer 142b are selectively removed so as to expose the gate insulating layer 142a formed using a nitride insulating layer.

At least the area of the top surface of the insulating layer 146 having defects and that of the top surface of the gate insulating layer 142b are larger than that of the top surface of the oxide semiconductor layer 112, and preferably the insulating layer 146 having defects covers the thin film transistor 180.

Further, the protective insulating layer 143 is formed using a nitride insulating layer to cover the top surface of the insulating layer 146 having defects and the side surfaces of the insulating layer 146 having defects and the gate insulating layer 142b, and to be in contact with the gate insulating layer 142a formed using a nitride insulating layer.

For the protective insulating layer 143 and the first gate insulating layer 142a which are each formed using a nitride insulating layer, an inorganic insulating film which does not include impurities such as moisture, a hydrogen ion, and OH and which prevents the entry of them from the outside is used: for example, a silicon nitride film, a silicon oxynitride film, an aluminum nitride film, or an aluminum oxynitride film obtained by a sputtering method or a plasma CVD method is used.

In this embodiment, as the protective insulating layer 143 formed using a nitride insulating film, a 100-nm-thick silicon nitride layer is formed by an RF sputtering method to cover the top surface and side surfaces of the oxide semiconductor layer 112.

With the structure illustrated in FIG. 18, an impurity such as hydrogen, moisture, hydroxyl, or hydride in the oxide semiconductor layer is reduced due to the gate insulating layer 142b and the insulating layer 146 having defects which are provided to surround and be in contact with the oxide semiconductor layer, and the entry of moisture from the outside in a manufacturing process after the formation of the protective insulating layer 143 can be prevented because the oxide semiconductor layer is further surrounded by the gate insulating layer 142a and the protective insulating layer 143 which are each formed using a nitride insulating layer. Moreover, the entry of moisture from the outside can be prevented in the long term even after the device is completed as a semiconductor device, for example, as a display device; thus, the long-term reliability of the device can be improved.

In this embodiment, one thin film transistor is surrounded by nitride insulating layers; however, the embodiment of the present invention is not limited to this structure. A plurality of thin film transistors may be surrounded by nitride insulating layers, or a plurality of thin film transistors in a pixel portion may be surrounded by nitride insulating layers. A region where the protective insulating layer 143 and the gate insulating layer 142a are in contact with each other may be formed so as to surround a pixel portion of the active matrix substrate.

This embodiment can be implemented in appropriate combination with another embodiment.

Embodiment 10

In this embodiment, an example of manufacturing an active matrix light-emitting display device using a thin film transistor and a light-emitting element using electroluminescence, in the semiconductor device according to any of Embodiments 1 to 9 will be described.

Light-emitting elements utilizing electroluminescence are classified according to whether the light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. Then, those carriers (i.e., electrons and holes) are recombined, and light is emitted. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that a description is made here using an organic EL element as a light-emitting element.

Figure 9:
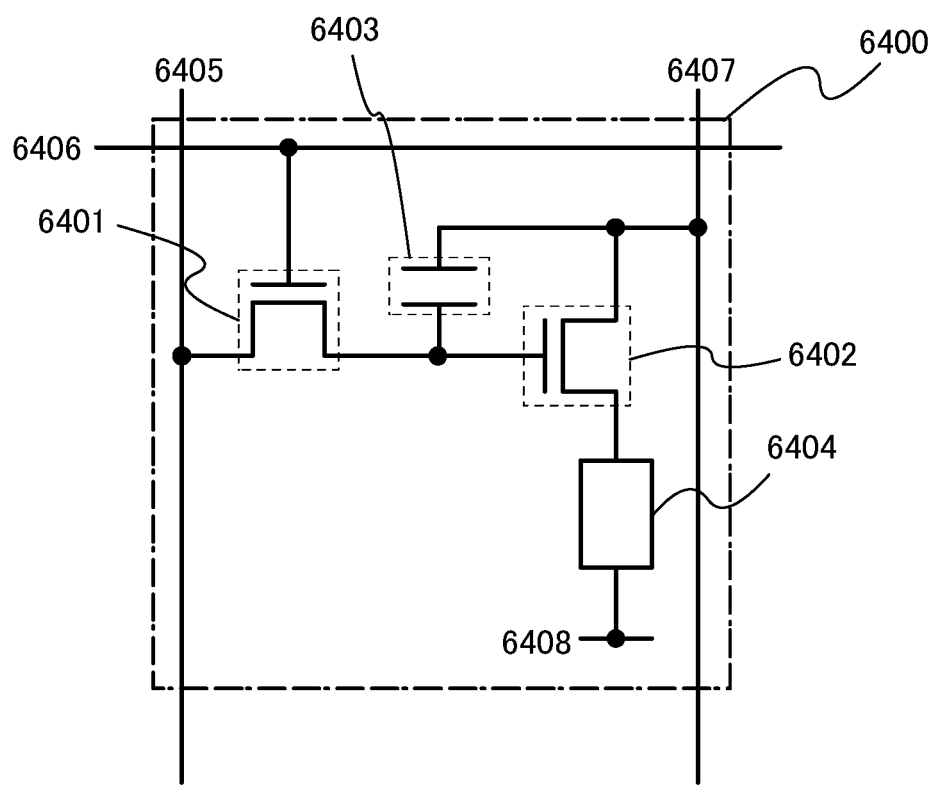
FIG. 9 is a pixel equivalent circuit diagram of a semiconductor device.

FIG. 9 illustrates an example of a pixel structure as an example of a semiconductor device which can be driven by a digital time grayscale method.

A structure and operation of a pixel which can be driven by a digital time grayscale driving can be applied will be described. In this example, one pixel includes two n-channel transistors each of which includes an oxide semiconductor layer as a channel formation region.

A pixel 6400 includes a switching transistor 6401, a driver transistor 6402, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the driver transistor 6402. The gate of the driver transistor 6402 is connected to a power supply line 6407 via the capacitor 6403, a first electrode of the driver transistor 6402 is connected to the power supply line 6407, and a second electrode of the driver transistor 6402 is connected to a first electrode (pixel electrode) of the light-emitting element 6404. A second electrode of the light-emitting element 6404 corresponds to a common electrode 6408. The common electrode 6408 is electrically connected to a common potential line provided over the same substrate.

Note that the second electrode (the common electrode 6408) of the light-emitting element 6404 is set to a low power supply potential. Note that the low power supply potential is a potential lower than a high power supply potential which is supplied to the power supply line 6407. For example, GND or 0 V may be set as the low power supply potential. A potential difference between the high power supply potential and the low power supply potential is applied to the light-emitting element 6404 so that current flows through the light-emitting element 6404, whereby the light-emitting element 6404 emits light. Thus, each potential is set so that the difference between the high power supply potential and the low power supply potential is greater than or equal to a forward threshold voltage of the light-emitting element 6404.

When the gate capacitance of the driver transistor 6402 is used as a substitute for the capacitor 6403, the capacitor 6403 can be omitted. The gate capacitance of the driver transistor 6402 may be formed between a channel region and a gate electrode.

Here, in the case of employing a voltage-input voltage driving method, a video signal is input to the gate of the driver transistor 6402 to make the driver transistor 6402 completely turn on or off. That is, the driver transistor 6402 operates in a linear region, and thus, a voltage higher than the voltage of the power supply line 6407 is applied to the gate of the driver transistor 6402. Note that a voltage greater than or equal to the sum of the power supply line voltage and $V_{th}$ of the driver transistor 6402 is applied to the signal line 6405.

In the case of employing an analog grayscale method instead of the digital time grayscale method, the same pixel structure as in FIG. 9 can be employed by inputting signals in a different way.

In the case of employing the analog grayscale method, a voltage greater than or equal to voltage which is the sum of forward voltage of the light-emitting element 6404 and $V_{th}$ of the driver transistor 6402 is applied to the gate of the driver transistor 6402. The forward voltage of the light-emitting element 6404 refers to a voltage to obtain a desired luminance, and is larger than at least a forward threshold voltage. By inputting a video signal to enable the driver transistor 6402 to operate in a saturation region, current can be supplied to the light-emitting element 6404. In order that the driver transistor 6402 may operate in the saturation region, the potential of the power supply line 6407 is set higher than a gate potential of the driver transistor 6402. When an analog video signal is used, it is possible to feed current to the light-emitting element 6404 in accordance with the video signal and perform analog grayscale driving.

Note that the pixel structure is not limited to that illustrated in FIG. 9. For example, the pixel in FIG. 9 can further include a switch, a resistor, a capacitor, a transistor, a logic circuit, or the like.

Next, structures of the light-emitting element will be described with reference to FIGS. 10A to 10C. Here, a cross-sectional structure of a pixel will be described using an example where a driver TFT is an n-channel TFT. Driver TFTs 7011, 7021, and 7001 which are used for the semiconductor devices illustrated in FIGS. 10A to 10C can be manufactured in a manner similar to that of the thin film transistor described in any of Embodiments 1-8 and are light-transmitting thin film transistors each including an oxide semiconductor layer.

In order to extract light emitted from the light-emitting element, at least one of an anode and a cathode should be transparent. There are following structures of a light-emitting element which is formed over the same substrate as a thin film transistor: a top-emission structure in which light is extracted through the surface opposite to the substrate, a bottom-emission structure in which light is extracted through the surface of the substrate, and a dual-emission structure in which light is extracted through the surface opposite to the substrate and the surface of the substrate. The pixel structure can be applied to a light-emitting element having any of these emission structures.

A light-emitting element having a bottom emission structure will be described with reference to FIG. 10A.

A cross-sectional view of a pixel in the case where the driver TFT 7011 is an n-channel TFT and light is emitted from a light-emitting element 7012 to a first electrode 7013 side. In FIG. 10A, the first electrode 7013 of the light-emitting element 7012 is formed over a light-transmitting conductive film 7017 which is electrically connected a drain electrode layer to the driver TFT 7011, and an EL layer 7014 and a second electrode 7015 are stacked in that order over the first electrode 7013.

As the light-transmitting conductive film 7017, a light-transmitting conductive film of, for example, indium oxide containing tungsten oxide, indium zinc oxide containing tungsten oxide, indium oxide containing titanium oxide, indium tin oxide containing titanium oxide, indium tin oxide, indium zinc oxide, or indium tin oxide to which silicon oxide is added can be used.

Any of a variety of materials can be used for the first electrode 7013 of the light-emitting element. For example, in the case where the first electrode 7013 is used as a cathode, the first electrode 7013 is preferably formed using, for example, a material having a low work function such as an alkali metal such as Li or Cs; an alkaline earth metal such as Mg, Ca, or Sr; an alloy containing any of these metals (e.g., Mg:Ag or Al:Li); or a rare earth metal such as Yb or Er. In FIG. 10A, the thickness of the first electrode 7013 is set so that light can be transmitted (preferably, about 5 nm to 30 nm). For example, an aluminum film having a thickness of 20 nm is used as the first electrode 7013.

Note that the light-transmitting conductive film and the aluminum film may be stacked and then selectively etched to form the light-transmitting conductive film 7017 and the first electrode 7013; in this case, the light-transmitting conductive film 7017 and the first electrode 7013 can be etched using the same mask, which is preferable.

The peripheral portion of the first electrode 7013 is covered with a partition 7019. The partition 7019 is formed using an organic resin film of polyimide, acrylic, polyamide, epoxy, or the like; an inorganic insulating film; or organic polysiloxane. It is particularly preferable that the partition 7019 be formed using a photosensitive resin material to have an opening over the first electrode 7013 and a sidewall of the opening be formed as an inclined surface with a continuous curvature. In the case where a photosensitive resin material is used for the partition 7019, a step of forming a resist mask can be omitted.

The EL layer 7014 which is formed over the first electrode 7013 and the partition 7019 may include at least a light-emitting layer and nay be formed as a single layer or a stack of plural layers. When the EL layer 7014 is formed as a stack of plural layers, the EL layer 7014 is formed by stacking an electron-injection layer, an electron-transport layer, a light-emitting layer, a hole-transport layer, and a hole-injection layer in that order over the first electrode 7013 which functions as a cathode. Note that not all of these layers need to be provided.

The stacking order is not limited to the above stacking order. The first electrode 7013 may be used as an anode, and a hole-injection layer, a hole-transport layer, a light-emitting layer, an electron-transport layer, and an electron-injection layer may be stacked in that order over the first electrode 7013. However, from a power consumption standpoint, it is preferable that the first electrode 7013 be used as a cathode and an electron-injection layer, an electron-transport layer, a light-emitting layer, a hole-transport layer, and a hole-injection layer be stacked in that order over the first electrode 7013 because voltage rise in a driver circuit portion can be suppressed and power consumption can be reduced.

As the second electrode 7015 formed over the EL layer 7014, various materials can be employed. For example, in the case where the second electrode 7015 is used as an anode, the second electrode 7015 is preferably formed using, for example, a material having a high work function such as ZrN, Ti, W, Ni, Pt, or Cr; or a light-transmitting conductive material such as ITO, IZO, or ZnO. Further, a blocking film 7016, for example, a metal which blocks light or a metal which reflects light is provided over the second electrode 7015. In this embodiment, an ITO film is used as the second electrode 7015, and a Ti film is used as the blocking film 7016.

The light-emitting element 7012 corresponds to a region where the EL layer 7014 including a light-emitting layer is sandwiched between the first electrode 7013 and the second electrode 7015. In the element structure illustrated in FIG. 10A, light is emitted from the light-emitting element 7012 to the first electrode 7013 side as indicated by an arrow.

Figure 10A:
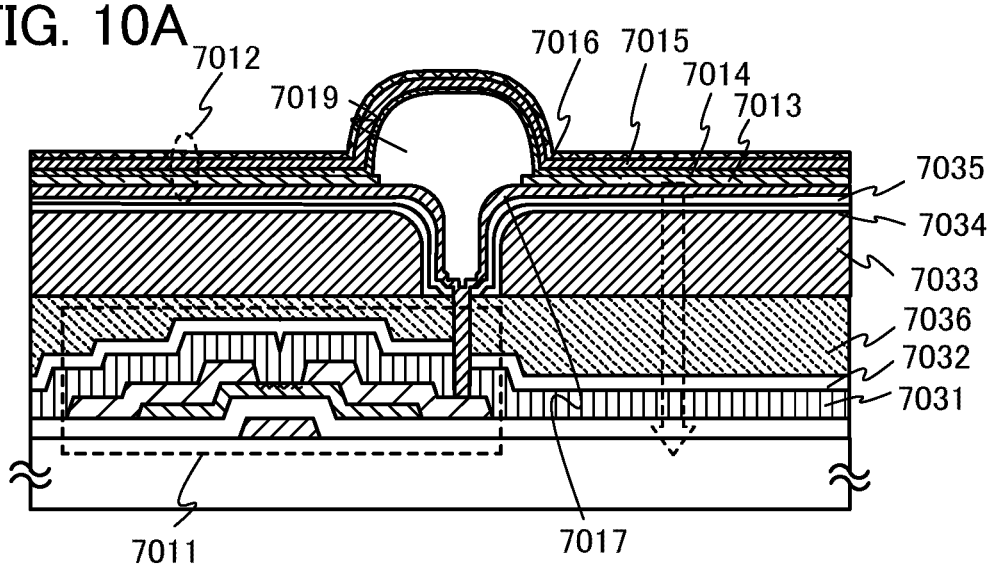
FIGS. 10A to 10C each illustrate a semiconductor device

Note that in an example illustrated in FIG. 10A, a light-transmitting conductive film is used as a gate electrode layer, and a light-transmitting this film is used for the source electrode layer and the drain electrode layer; thus, light emitted from the light-emitting element 7012 passes through the color filter layer 7033 and the substrate to be emitted outside.

The color filter layer 7033 is formed by a droplet discharge method such as an ink jetting method, a printing method, an etching method using a photolithography technique, or the like.

The color filter layer 7033 is covered with the overcoat layer 7034, and further covered with the protective insulating layer 7035. Note that although the overcoat layer 7034 has a small thickness in FIG. 10A, the overcoat layer 7034 has a function to planarize roughness due to the color filter layer 7033.

The contact hole which is formed in the protective insulating layer 7035, the insulating layer 7032, and the insulating layer 7031 and reaches the drain electrode is positioned to overlap with the partition 7019.

Next, a light-emitting element having a dual emission structure will be described with reference to FIG. 10B.

Figure 10B:
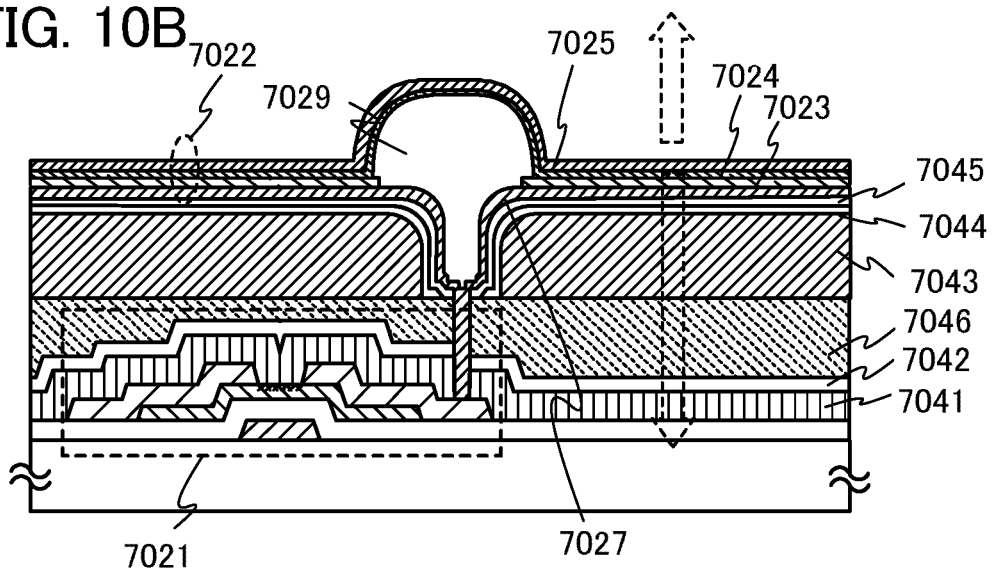

In FIG. 10B, a first electrode 7023 of a light-emitting element 7022 is formed over a light-transmitting conductive film 7027 which is electrically connected a drain electrode layer to the driver TFT 7021, and an EL layer 7024 and a second electrode 7025 are stacked in that order over the first electrode 7023.

As the light-transmitting conductive film 7027, a light-transmitting conductive film of, for example, indium oxide containing tungsten oxide, indium zinc oxide containing tungsten oxide, indium oxide containing titanium oxide, indium tin oxide containing titanium oxide, indium tin oxide, indium zinc oxide, or indium tin oxide to which silicon oxide is added can be used.

Any of a variety of materials can be used for the first electrode 7023. For example, in the case where the first electrode 7023 is used as a cathode, the first electrode 7023 is preferably formed using, for example, a material having a low work function such as an alkali metal such as Li or Cs; an alkaline earth metal such as Mg, Ca, or Sr; an alloy containing any of these metals (e.g., Mg:Ag or Al:Li); or a rare earth metal such as Yb or Er. In this embodiment, the first electrode 7023 is used as a cathode and the thickness of the first electrode 7023 is set so that light can be transmitted (preferably, about 5 nm to 30 nm). For example, an aluminum film having a thickness of 20 nm is used as the first electrode.

Note that the light-transmitting conductive film and the aluminum film may be stacked and then selectively etched to form the light-transmitting conductive film 7027 and the first electrode 7023; in this case, the light-transmitting conductive film 7027 and the first electrode 7023 can be etched using the same mask, which is preferable.

The peripheral portion of the first electrode 7023 is covered with a partition 7029. The partition 7029 is formed using an organic resin film of polyimide, acrylic, polyamide, epoxy, or the like; an inorganic insulating film; or organic polysiloxane. It is particularly preferable that the partition 7029 be formed using a photosensitive resin material to have an opening over the first electrode 7023 and a sidewall of the opening be formed as an inclined surface with a continuous curvature. In the case where a photosensitive resin material is used for the partition 7029, a step of forming a resist mask can be omitted.

The EL layer 7024 which is formed over the first electrode 7023 and the partition 7029 may include a light-emitting layer and nay be formed as a single layer or a stack of plural layers. When the EL layer 7024 is formed as a stack of plural layers, the EL layer 7024 is formed by stacking an electron-injection layer, an electron-transport layer, a light-emitting layer, a hole-transport layer, and a hole-injection layer in that order over the first electrode 7023 which functions as a cathode. Note that not all of these layers need to be provided.

The stacking order is not limited to the above stacking order. The first electrode 7023 may be used as an anode, and a hole-injection layer, a hole-transport layer, a light-emitting layer, an electron-transport layer, and an electron-injection layer may be stacked in that order over the anode. However, from a power consumption standpoint, it is preferable that the first electrode 7023 be used as a cathode and an electron-injection layer, an electron-transport layer, a light-emitting layer, a hole-transport layer, and a hole-injection layer be stacked in that order over the cathode because power consumption can be reduced.

As the second electrode 7025 formed over the EL layer 7024, various materials can be employed. For example, in the case where the second electrode 7025 is used as an anode, the second electrode 7025 is preferably formed using a material having a high work function, for example, a light-transmitting conductive material such as ITO, IZO, or ZnO. In this embodiment, the second electrode 7026 is used as an anode and an ITO film including silicon oxide is formed.

The light-emitting element 7022 corresponds to a region where the EL layer 7024 including a light-emitting layer is sandwiched between the first electrode 7023 and the second electrode 7025. In the element structure illustrated in FIG. 10B, light is emitted from the light-emitting element 7022 to both the second electrode 7025 side and the first electrode 7023 side as indicated by arrows.

Note that in an example illustrated in FIG. 10B, a light-transmitting conductive film is used as a gate electrode layer, and a light-transmitting this film is used for the source electrode layer and the drain electrode layer; thus, light emitted from the light-emitting element 7022 to the first electrode 7023 side passes through the color filter layer 7043 and the substrate to be emitted outside.

The color filter layer 7043 is formed by a droplet discharge method such as an ink jetting method, a printing method, an etching method using a photolithography technique, or the like.

The color filter layer 7043 is covered with the overcoat layer 7044, and further covered with the protective insulating layer 7045.

The contact hole which is formed in the protective insulating layer 7045, the insulating layer 7042, and the insulating layer 7042 and reaches the drain electrode is positioned to overlap with the partition 7029.

Note that when a light-emitting element having a dual emission structure is used and full color display is performed on both display surfaces, light emitted from the second electrode 7025 side does not pass through the color filter layer 7043; therefore, a sealing substrate provided with another color filter layer is preferably provided over the second electrode 7025.

A light-emitting element having a top emission structure will be described with reference to FIG. 10C.

Figure 10C:
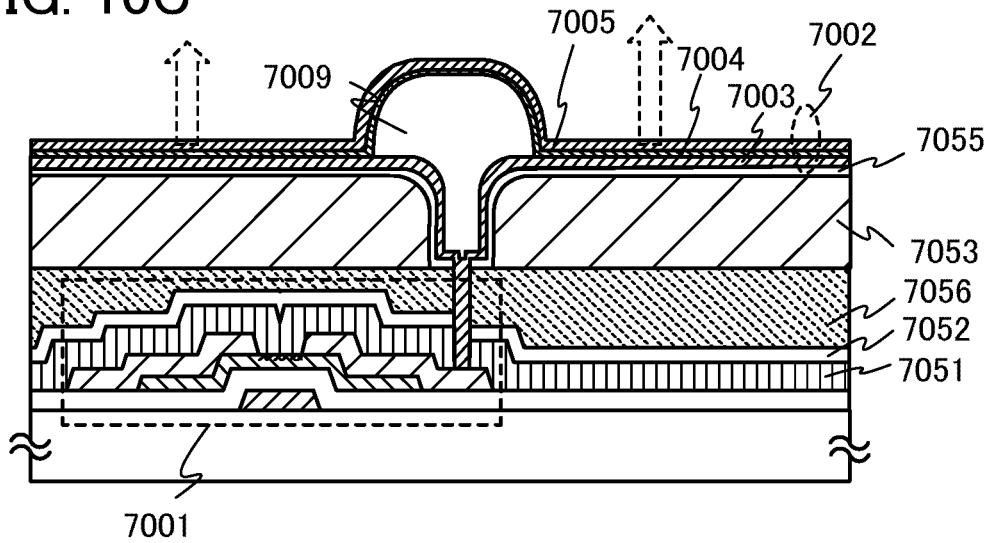

FIG. 10C illustrates a cross-sectional view of a pixel in the case where the driver TFT 7001 is an n-channel TFT and light is emitted from a light-emitting element 7002 to a first second electrode 7005 side. In FIG. 10C, a drain electrode layer of the driver TFT 7001 and a first electrode 7003 are in contact with each other, and the driver TFT 7001 and the first electrode 7003 of the light-emitting element 7002 are electrically connected to each other. An EL layer 7004 and a second electrode 7005 are stacked over the first electrode 7003 in this order.

Any of a variety of materials can be used for the first electrode 7003 of the light-emitting element. For example, in the case where the first electrode 7003 is used as a cathode, the first electrode 7003 is preferably formed using, for example, a material having a low work function such as an alkali metal such as Li or Cs; an alkaline earth metal such as Mg, Ca, or Sr; an alloy containing any of these metals (e.g., Mg:Ag or Al:Li); or a rare earth metal such as Yb or Er.

The peripheral portion of the first electrode 7003 is covered with a partition 7009. The partition 7009 is formed using an organic resin film of polyimide, acrylic, polyamide, epoxy, or the like; an inorganic insulating film; or organic polysiloxane. It is particularly preferable that the partition 7009 be formed using a photosensitive resin material to have an opening over the first electrode 7003 and a sidewall of the opening be formed as an inclined surface with a continuous curvature. In the case where a photosensitive resin material is used for the partition 7009, a step of forming a resist mask can be omitted.

The EL layer 7004 which is formed over the first electrode 7003 and the partition 7009 may include at least a light-emitting layer and nay be formed as a single layer or a stack of plural layers. When the EL layer 7004 is formed as a stack of plural layers, the EL layer 7004 is formed by stacking an electron-injection layer, an electron-transport layer, a light-emitting layer, a hole-transport layer, and a hole-injection layer in that order over the first electrode 7003 which is used as a cathode. Note that not all of these layers need to be provided.

The stacking order is not limited to the above stacking order. A hole-injection layer, a hole-transport layer, a light-emitting layer, an electron-transport layer, and an electron-injection layer may be stacked in that order over the first electrode 7003 which is used as an anode.

In FIG. 10C, a hole-injection layer, a hole-transport layer, a light-emitting layer, an electron-transport layer, and an electron-injection layer are stacked in that order over a stacked film in which a Ti film, an aluminum film, and a Ti film are stacked in that order, and a stacked layer of a Mg:Ag alloy thin film and ITO is formed thereover.

In the case where the driver TFT 7001 is an n-channel TFT, it is preferable that an electron-injection layer, an electron-transport layer, a light-emitting layer, a hole-transport layer, and a hole-injection layer be stacked in that order over the first electrode 7003 because voltage rise in a driver circuit can be suppressed and power consumption can be reduced.

The second electrode 7005 is formed using a light-transmitting conductive material which transmits light, and for example, a light-transmitting conductive film of indium oxide containing tungsten oxide, indium zinc oxide containing tungsten oxide, indium oxide containing titanium oxide, indium tin oxide containing titanium oxide, indium tin oxide, indium zinc oxide, indium tin oxide to which silicon oxide is added, or the like may be used.

The light-emitting element 7002 corresponds to a region where the EL layer 7004 including a light-emitting layer is sandwiched between the first electrode 7003 and the second electrode 7005. In the element structure illustrated in FIG. 10C, light is emitted from the light-emitting element 7002 to the second electrode 7005 side as indicated by an arrow.

In FIG. 10C, the drain electrode layer of the driver TFT 7001 is electrically connected to the first electrode 7003 through the contact hole formed in an insulating layer 7051 having defects, a protective insulating layer 7052, a planarization insulating layer 7056, a planarization insulating layer 7053, and an insulating layer 7055. For the planarization insulating layers 7036, 7046, 7053, and 7056, a resin material such as polyimide, acrylic, benzocyclobutene, polyamide, or epoxy can be used. As an alternative to such resin materials, it is possible to use a low-dielectric constant material (a low-k material), a siloxane-based resin, phosphosilicate glass (PSG), borophosphosilicate glass (BPSG), or the like. Note that the planarization insulating layers 7036, 7046, 7053, and 7056 may be formed by stacking a plurality of insulating films formed of these materials. There is no particular limitation on the method for forming the planarization insulating layers 7036, 7046, 7053, and 7056. Depending on the material, the planarization insulating layer 7036, 7046, 7053, and 7056 can be formed by a method such as sputtering method, an SOG method, a spin coating method, a dipping method, a spray coating method, or a droplet discharge method (e.g., an ink jetting method, screen printing, or offset printing), or by using a tool (apparatus) such as a doctor knife, a roll coater, a curtain coater, a knife coater, or the like.

The partition 7009 is provided so as to insulate the first electrode 7003 and a first electrode of an adjacent pixel. The partition 7009 is formed using an organic resin film of polyimide, an acrylic resin, polyamide, an epoxy resin, or the like; an inorganic insulating film; or organic polysiloxane. It is particularly preferable that the partition 7009 be formed using a photosensitive resin material to have an opening over the first electrode 7003 and a sidewall of the opening be formed as an inclined surface with a continuous curvature. In the case where a photosensitive resin material is used for the partition 7009, a step of forming a resist mask can be omitted.

In the structure of FIG. 10C, when full color display is performed, for example, the light-emitting element 7002 is used as a green light-emitting element, one of adjacent light-emitting elements is used as a red light-emitting element, and the other is used as a blue light-emitting element. Alternatively, a light-emitting display device capable of full color display may be manufactured using four kinds of light-emitting elements, which include white light-emitting elements as well as three kinds of light-emitting elements.

In the structure of FIG. 10C, a light-emitting display device capable of full color display may be manufactured in such a way that all of a plurality of light-emitting elements which is arranged is white light-emitting elements and a sealing substrate having a color filter or the like is provided over the light-emitting element 7002. When a material which exhibits a single color such as white is formed and then combined with a color filter or a color conversion layer, full color display can be performed.

Any of the thin film transistors in Embodiments 1 to 9 can be used as appropriate as the driver TFTs 7001, 7011, and 7021 used for the semiconductor devices, and the driver TFTs 7001, 7011, and 7021 can be formed using steps and materials similar to those for the thin film transistors in Embodiments 1 to 9. The driver TFTs 7001, 7011, and 7021 include an oxygen-excess mixed region between the oxide semiconductor layer and the insulating layer 7051, 7031, or 7041 having defects. As in Embodiment 2, an oxygen-excess oxide insulating layer may be provided instead of the oxygen-excess mixed region. An oxygen-excess oxide insulating layer produces an effect similar to the effect of the oxygen-excess mixed region.

Since the oxygen-excess mixed region and insulating layer 7031, 7041, and 7051 having defects have a high binding energy to hydrogen or moisture (a hydrogen atom or a compound including a hydrogen atom such as $H_2O$) and these impurities are stabilized in the oxygen-excess mixed region and the insulating layer having many defects, these impurities can be diffused from the oxide semiconductor layer into the oxygen-excess mixed region and the insulating layers 7031, 7041, and 7051 having defects, whereby these impurities can be removed from the oxide semiconductor layer. Further, the oxygen-excess mixed region functions as a barrier layer against impurities which have been diffused into the insulating layer 7031, 7041, and 7051 having defects to prevent the impurities from entering the oxide semiconductor layer again; thus, the impurity concentration of the oxide semiconductor layer can be kept low. Accordingly, the driver TFTs 7001, 7011, and 7021 including the oxide semiconductor layer in which impurities such as hydrogen, moisture, hydroxyl, or hydride (also referred to as a hydrogen compound) which cause variation are reduced are highly reliable thin film transistors with stable electric characteristics.

Needless to say, display with single color light emission can also be performed. For example, a lighting system may be formed with the use of white light emission, or an area-color light-emitting device may be formed with the use of a single color light emission.

If necessary, an optical film such as a polarizing film including a circularly polarizing plate may be provided.

Although an organic EL element is described here as a light-emitting element, an inorganic EL element can alternatively be provided as a light-emitting element.

Although the example in which a thin film transistor (a driver TFT) which controls the driving of a light-emitting element is electrically connected to the light-emitting element has been described, a structure may be employed in which a TFT for controlling current is connected between the driver TFT and the light-emitting element.

This embodiment can be implemented in appropriate combination with another embodiment.

Embodiment 11

In this embodiment, an appearance and a cross section of a light-emitting display panel (also referred to as a light-emitting panel) will be described with reference to FIGS. 11A and 11B. FIG. 11A is a plan view of a panel in which thin film transistors and a light-emitting element which are formed over a first substrate are sealed between the first substrate and a second substrate with a sealant. FIG. 11B is a cross-sectional view taken along line H-I in FIG. 11A.

A sealant 4505 is provided so as to surround a pixel portion 4502, signal line driver circuits 4503*a* and 4503*b*, and scan line driver circuits 4504*a* and 4504*b*, which are provided over a first substrate 4501. In addition, a second substrate 4506 is provided over the pixel portion 4502, the signal line driver circuits 4503*a* and 4503*b*, and the scan line driver circuits 4504*a* and 4504*b*. Accordingly, the pixel portion 4502, the signal line driver circuits 4503*a* and 4503*b*, and the scan line driver circuits 4504*a* and 4504*b* are sealed together with a filler 4507, by the first substrate 4501, the sealant 4505, and the second substrate 4506. It is preferable that a panel be thus packaged (sealed) with a protective film (such as a bonding film or an ultraviolet curable resin film) or a cover material with high air-tightness and little degasification so that the pixel portion 4502, the signal line driver circuits 4503*a* and 4503*b*, the scan line driver circuits 4504*a* and 4504*b* are not exposed to air.

The pixel portion 4502, the signal line driver circuits 4503*a* and 4503*b*, and the scan line driver circuits 4504*a* and 4504*b* which are formed over the first substrate 4501 each include a plurality of thin film transistors. A thin film transistor 4510 included in the pixel portion 4502 and a thin film transistor 4509 included in the signal line driver circuit 4503*a* are illustrated as an example in FIG. 11B.

Any of the thin film transistors in Embodiments 1 to 9 can be used as appropriate as the thin film transistors 4509 and 4510, and they can be formed using steps and materials similar to those for the thin film transistors in Embodiments 1 to 9. The thin film transistors 4509 and 4510 include an oxygen-excess mixed region (not shown) between an oxide semiconductor layer and the insulating layer 4542 having defects. As in Embodiment 2, an oxygen-excess oxide insulating layer may be provided instead of the oxygen-excess mixed region. An oxygen-excess oxide insulating layer produces an effect similar to the effect of the oxygen-excess mixed region.

Since the oxygen-excess mixed region and the insulating layer having many defects have a high binding energy to hydrogen or moisture (a hydrogen atom or a compound including a hydrogen atom such as $H_2O$) and these impurities are stabilized in the oxygen-excess mixed region and the insulating layer 4542 having defects, these impurities can be diffused from the oxide semiconductor layer into the oxygen-excess mixed region and the insulating layer 4542 having defects by heat treatment, whereby these impurities can be removed from the oxide semiconductor layer. Further, the oxygen-excess mixed region functions as a barrier layer against impurities which have been diffused into the insulating layer having defects to prevent the impurities from entering the oxide semiconductor layer again; thus, the impurity concentration of the oxide semiconductor layer can be kept low. Accordingly, the thin film transistors 4509 and 4510 including the oxide semiconductor layer in which impurities such as hydrogen, moisture, hydroxyl, or hydride which cause variation are reduced are highly reliable thin film transistors with stable electric characteristics.

Note that the thin film transistor 4509 for a driver circuit has a conductive layer in a position which overlaps with a channel formation region in the oxide semiconductor layer in the thin film transistor. In this embodiment, the thin film transistors 4509 and 4510 are n-channel thin film transistors.

A conductive layer 4540 is provided over part of the insulating layer 4542 having defects, which overlaps with a channel formation region in an oxide semiconductor layer in the thin film transistor 4509 for the driver circuit. The conductive layer 4540 is provided at the position overlapping with the channel formation region in the oxide semiconductor layer, whereby the amount of change in threshold voltage of the thin film transistor 4509 before and after BT test can be reduced. A potential of the conductive layer 4540 may be the same or different from that of a gate electrode layer of the thin film transistor 4509. The conductive layer 4540 can also functions as a second gate electrode layer. Alternatively, the potential of the conductive layer 4540 may be GND or 0 V, or the conductive layer 4540 may be in a floating state.

In addition, the conductive layer 4540 functions to block an external electric field, that is, to prevent an external electric field (particularly, to prevent static electricity) from effecting the inside (a circuit portion including the thin film transistor). A blocking function of the conductive layer 4540 can prevent variation in electric characteristics of the thin film transistor due to the effect of external electric field such as static electricity.

Further, the insulating layer 4542 having defects which covers the oxide semiconductor layer of the thin film transistor 4510 is formed. A source electrode layer or a drain electrode layer of the thin film transistor 4510 is electrically connected to a wiring layer 4550 in an opening formed in the insulating layer 4542 having defects and the insulating layer 4551 which are provided over the thin film transistor. The wiring layer 4550 is formed in contact with a first electrode 4517, and the thin film transistor 4510 is electrically connected to the first electrode 4517 via the wiring layer 4550.

The insulating layer 4542 having defects can be formed using a material and a method which are similar to those of the insulating layer 116 having defects described in Embodiment 1.

A color filter layer 4545 is formed over the insulating layer 4551 so as to overlap with a light-emitting region of a light-emitting element 4511.

Further, in order to reduce surface roughness of the color filter layer 4545, the color filter layer 4545 is covered with an overcoat layer 4543 functioning as a planarization insulating film.

Further, an insulating layer 4544 is formed over the overcoat layer 4543. The insulating layer 4544 may be formed in a manner similar to that of the protective insulating layer 103 described in Embodiment 1, and a silicon nitride film may be formed by a sputtering method, for example.

Moreover, reference numeral 4511 denotes a light-emitting element. A first electrode 4517 which is a pixel electrode included in the light-emitting element 4511 is electrically connected to a source electrode layer or a drain electrode layer of the thin film transistor 4510 via the wiring layer 4550. Note that although the light-emitting element 4511 has a stacked-layer structure including the first electrode 4517, an electroluminescent layer 4512, and a second electrode 4513 in this embodiment, the structure of the light-emitting element 4511 is not limited thereto. The structure of the light-emitting element 4511 can be changed as appropriate depending on, for example, the direction in which light is extracted from the light-emitting element 4511.

The partition 4520 is formed using an organic resin film, an inorganic insulating film, or organic polysiloxane. It is particularly preferable that the partition be formed using a photosensitive material to have an opening over the first electrode 4517 and a sidewall of the opening be formed as an inclined surface with a continuous curvature.

The electroluminescent layer 4512 may be formed as a single layer or a stack of plural layers.

In order to prevent entry of oxygen, hydrogen, moisture, carbon dioxide, or the like into the light-emitting element 4511, a protective film may be formed over the second electrode 4513 and the partition 4520. As the protective film, a silicon nitride film, a silicon nitride oxide film, a DLC film, or the like can be formed.

In addition, a variety of signals and potentials are supplied from FPCs 4518a and 4518b to the signal line driver circuits 4503a and 4503b, the scan line driver circuits 4504a and 4504b, or the pixel portion 4502.

A connection terminal electrode 4515 is formed using the same conductive film as the first electrode 4517 included in the light-emitting element 4511. A terminal electrode 4516 is formed using the same conductive film as a source and drain electrode layers included in the thin film transistors 4509.

The connection terminal electrode 4515 is electrically connected to a terminal included in the FPC 4518a via an anisotropic conductive film 4519.

The first substrate or the second substrate needs to have a light-transmitting property if it is located in the direction in which light is extracted from the light-emitting element 4511. In that case, a light-transmitting material such as a glass plate, a plastic plate, a polyester film, or an acrylic resin film is used.

As the filler 4507, an ultraviolet curable resin or a thermosetting resin can be used as well as an inert gas such as nitrogen or argon. For example, poly(vinyl chloride) (PVC), acrylic, polyimide, an epoxy resin, a silicone resin, poly(vinyl butyral) (PVB), or ethylene with vinyl acetate (EVA) can be used. For example, nitrogen may be used as the filler.

If needed, an optical film such as a polarizing plate, a circularly polarizing plate (including an elliptically polarizing plate), or a retardation plate (a quarter-wave plate or a half-wave plate) may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions of the surface so as to reduce the glare can be performed.

The sealant can be formed by a screen printing method, an ink jetting apparatus, or a dispensing apparatus. As the sealant, typically, a material containing a visible light curable resin, an ultraviolet curable resin, or a thermosetting resin can be used. Further, a filler may be contained.

As the signal line driver circuits 4503a and 4503b and the scan line driver circuits 4504a and 4504b, driver circuits formed by using a single crystal semiconductor film or a polycrystalline semiconductor film over a substrate separately prepared may be mounted. Alternatively, only the signal line driver circuits or part thereof, or only the scan line driver circuits or part thereof may be separately formed and then mounted. The structure is not limited to the structure illustrated in FIGS. 11A and 11B.

Through the above steps, a highly reliable light-emitting display device (display panel) as a semiconductor device can be manufactured.

This embodiment can be implemented in appropriate combination with another embodiment.

Embodiment 12

Figure 8A:
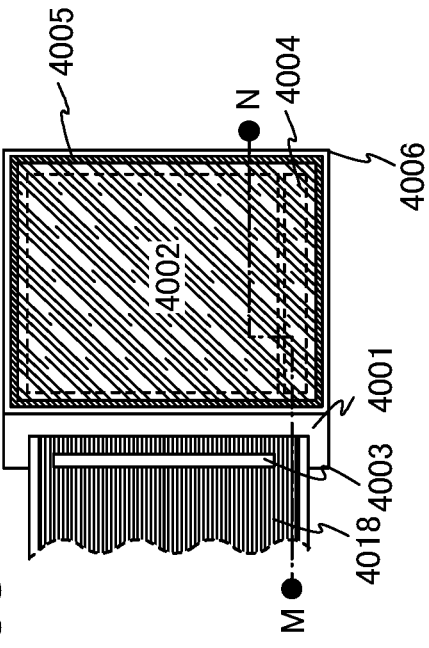
FIGS. 8A to 8C illustrate a semiconductor device.
Figure 8C:
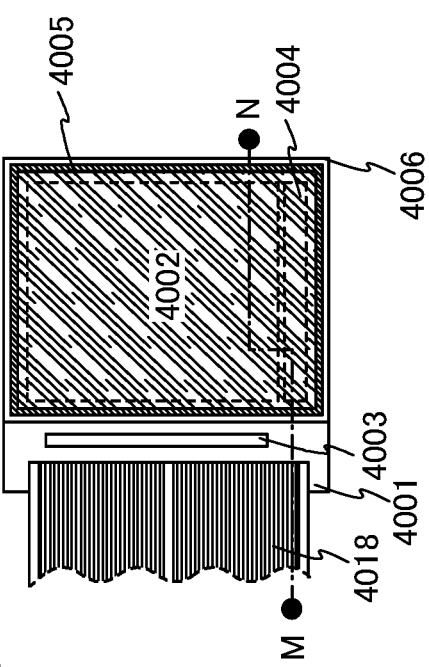
Figure 8B:
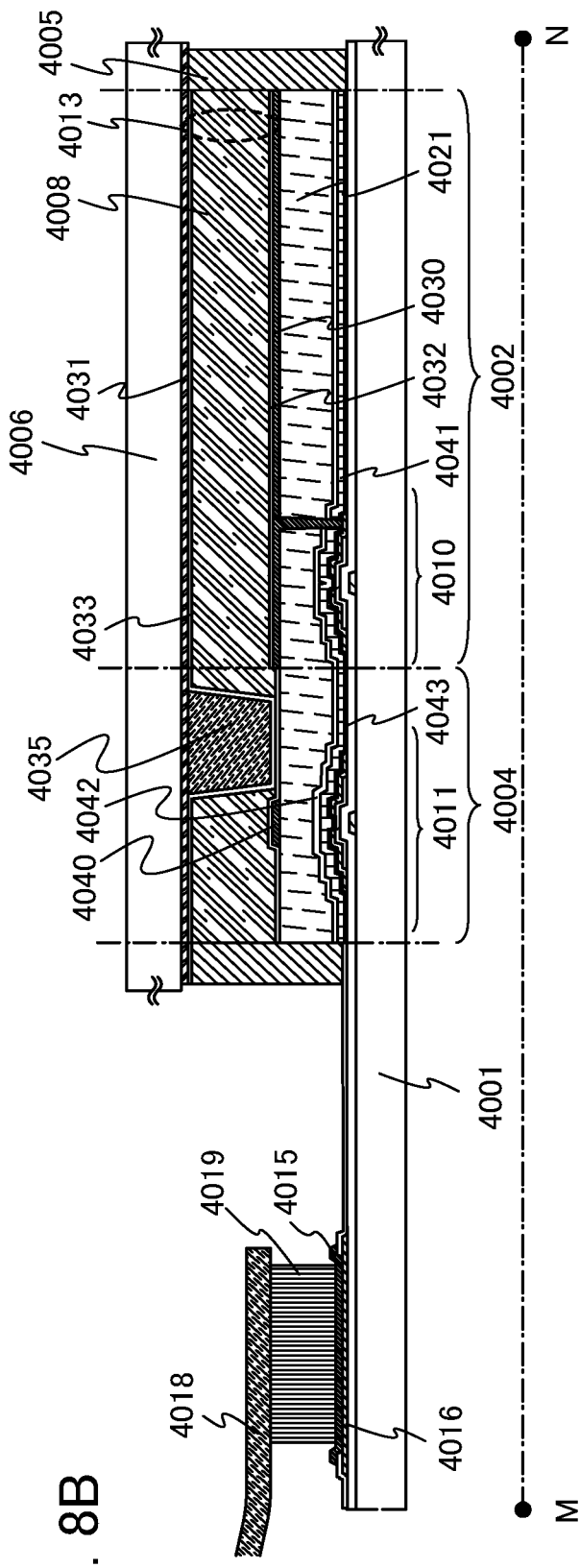

The appearance and a cross section of a liquid crystal display panel, which is one embodiment of a semiconductor device, will be described with reference to FIGS. 8A, 8B, and 8C. FIGS. 8A and 8C are plan views of panels in which thin film transistors 4010 and 4011 and a liquid crystal element 4013 are sealed between a first substrate 4001 and a second substrate 4006 with a sealant 4005. FIG. 8B is a cross-sectional view taken along line M-N in FIG. 8A or FIG. 8C.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with a liquid crystal layer 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region that is different from the region surrounded by the sealant 4005 over the first substrate 4001.

Note that there is no particular limitation on the connection method of the driver circuit which is separately formed, and a COG method, a wire bonding method, a TAB method, or the like can be used. FIG. 8A illustrates an example in which the signal line driver circuit 4003 is mounted by a COG method. FIG. 8C illustrates an example in which the signal line driver circuit 4003 is mounted by a TAB method.

The pixel portion 4002 and the scan line driver circuit 4004 provided over the first substrate 4001 include a plurality of thin film transistors. FIG. 8B illustrates the thin film transistor 4010 included in the pixel portion 4002 and the thin film transistor 4011 included in the scan line driver circuit 4004, as an example. The oxygen-excess oxide insulating layer 4043, an insulating layer 4041 having defects, a protective insulating layer 4042, and an insulating layer 4021 are provided over the thin film transistors 4010 and 4011.

Any of the thin film transistors in Embodiments 1 to 9 can be used as appropriate as the thin film transistors 4010 and 4011, and they can be formed using steps and materials similar to those for the thin film transistors in Embodiments 1 to 9. An oxygen-excess oxide insulating layer 4043 is provided between an oxide semiconductor layer and the insulating layer having defects. As in Embodiment 1, an oxygen-excess mixed region may be provided instead of the oxygen-excess oxide insulating layer. An oxygen-excess mixed region produces an effect similar to the effect of the oxygen-excess oxide insulating layer.

Since the oxygen-excess oxide insulating layer 4043 and the insulating layer 4041 having defects have a high binding energy to hydrogen or moisture (a hydrogen atom or a compound including a hydrogen atom such as $H_2O$) and these impurities are stabilized in the oxygen-excess oxide insulating layer 4043 and the insulating layer 4041 having defects, these impurities can be diffused from the oxide semiconductor layer into the oxygen-excess oxide insulating layer 4043 and the insulating layer 4041 having defects, whereby these impurities can be removed from the oxide semiconductor layer. Further, the oxygen-excess oxide insulating layer 4043 functions as a barrier layer against impurities which have been diffused into the insulating layer 4041 having defects to prevent the impurities from entering the oxide semiconductor layer again; thus, the impurity concentration of the oxide semiconductor layer can be kept low. Accordingly, the thin film transistors 4010 and 4011 including the oxide semiconductor layer in which impurities such as hydrogen, moisture, hydroxyl, or hydride which cause variation are reduced are highly reliable thin film transistors with stable electric characteristics. In this embodiment, the thin film transistors 4010 and 4011 are n-channel thin film transistors.

A conductive layer 4040 is provided over part of the insulating layer 4021, which overlaps with a channel formation region in an oxide semiconductor layer in the thin film transistor 4011 for the driver circuit. The conductive layer 4040 is provided at the position overlapping with the channel formation region in the oxide semiconductor layer, whereby the amount of change in threshold voltage of the thin film transistor 4011 before and after BT test can be reduced. A potential of the conductive layer 4040 may be the same or different from that of a gate electrode layer of the thin film transistor 4011. The conductive layer 4040 can also functions as a second gate electrode layer. Alternatively, the potential of the conductive layer 4040 may be GND or 0 V, or the conductive layer 4044 may be in a floating state.

In addition, the conductive layer 4040 functions to block an external electric field, that is, to prevent an external electric field (particularly, to prevent static electricity) from effecting the inside (a circuit portion including the thin film transistor). A blocking function of the conductive layer 4040 can prevent variation in electric characteristics of the thin film transistor due to the effect of external electric field such as static electricity.

A pixel electrode layer 4030 included in the liquid crystal element 4013 is electrically connected to a source electrode layer or a drain electrode layer of the thin film transistor 4010. A counter electrode layer 4031 of the liquid crystal element 4013 is provided on the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033 functioning as alignment films, respectively, and the liquid crystal layer 4008 is sandwiched between the pixel electrode layer 4030 and the counter electrode layer 4031 with the insulating layers 4032 and 4033 interposed therebetween.

Note that a light-transmitting substrate can be used as the first substrate 4001 and the second substrate 4006; glass, ceramics, or plastics can be used. The plastic can be a fiberglass-reinforced plastics (FRP) plate, a polyvinyl fluoride (PVF) film, a polyester film, or an acrylic resin film.

Reference numeral 4035 denotes a columnar spacer which is obtained by selective etching of an insulating film and provided in order to control the distance (a cell gap) between the pixel electrode layer 4030 and the counter electrode layer 4031. Note that a spherical spacer may be used. The counter electrode layer 4031 is electrically connected to a common potential line formed over the substrate where the thin film transistor 4010 is formed. The counter electrode layer 4031 and the common potential line can be electrically connected to each other via conductive particles arranged between a pair of substrates using the common connection portion. Note that the conductive particles are included in the sealant 4005.

Alternatively, liquid crystal exhibiting a blue phase for which an alignment film is unnecessary may be used. A blue phase is one of liquid crystal phases, which is generated just before a cholesteric phase changes into an isotropic phase while the temperature of cholesteric liquid crystal is increased. Since the blue phase is generated within an only narrow range of temperature, a liquid crystal composition containing a chiral agent at 5 wt % or more is used for the liquid crystal layer 4008 in order to improve the temperature range. The liquid crystal composition including liquid crystal exhibiting a blue phase and a chiral agent has a short response time of 1 msec or less and is optically isotropic;

therefore, alignment treatment is not necessary and viewing angle dependence is small. In addition, since an alignment film does not need to be provided and rubbing treatment is unnecessary, electrostatic breakdown caused by rubbing treatment can be prevented and defects and damage of the liquid crystal display device can be reduced in the manufacturing process. Thus, the productivity of the liquid crystal display device can be increased. A thin film transistor including an oxide semiconductor layer particularly has a possibility that electric characteristics of the thin film transistor may significantly change and deviate from the designed range by the influence of static electricity. Therefore, it is more effective to use a blue phase liquid crystal material for a liquid crystal display device including a thin film transistor that includes an oxide semiconductor layer.

Note that this embodiment can also be applied to a transflective liquid crystal display device in addition to a transmissive liquid crystal display device.

Although, a polarizing plate is provided on the outer surface of the substrate (on the viewer side) and a coloring layer and an electrode layer used for a display element are sequentially provided on the inner surface of the substrate in the example of the liquid crystal display device, the polarizing plate may be provided on the inner surface of the substrate. The stacked-layer structure of the polarizing plate and the coloring layer is not limited to the structure in this embodiment and may be set as appropriate depending on materials of the polarizing plate and the coloring layer or conditions of the manufacturing process. Further, a light-blocking film functioning as a black matrix may be provided in a portion other than the display portion.

The oxygen-excess oxide insulating layer 4043 and the insulating layer 4041 having defects are stacked in contact with the oxide semiconductor layer over the thin film transistors 4011 and 4010. The oxygen-excess oxide insulating layer 4043 can be formed using a material and a method which are similar to those of the oxygen-excess oxide insulating layer 139 described in Embodiment 2. The insulating layer 4041 having defects can be formed using a material and a method which are similar to those of the insulating layer 116 having defects described in Embodiment 1.

Further, the protective insulating layer 4042 is formed on and in contact with the insulating layer 4041 having defects. The protective insulating layer 4042 can be formed in a manner similar to that of the protective insulating layer 103 described in Embodiment 1, and a silicon nitride film can be used, for example. Further, in order to reduce surface roughness of the thin film transistors, the protective insulating layer 4042 is covered with the insulating layer 4021 functioning as a planarization insulating film.

The insulating layer 4021 is formed as the planarizing insulating film. For the insulating layer 4021, a heat-resistant organic material such as polyimide, acrylic, benzocyclobutene, polyamide, or epoxy can be used. As an alternative to such organic materials, it is possible to use a low-dielectric constant material (a low-k material), a siloxane-based resin, phosphosilicate glass (PSG), borophosphosilicate glass (BPSG), or the like. Note that the insulating layer 4021 may be formed by stacking a plurality of insulating films formed of these materials.

There is no particular limitation on the method for forming the insulating layer 4021. Depending on the material, insulating layer 4021 can be formed by a method such as sputtering method, an SOG method, a spin coating method, a dipping method, a spray coating method, or a droplet discharge method (e.g., an ink jetting method, screen printing, or offset printing), or by using a tool (apparatus) such as a doctor knife, a roll coater, a curtain coater, a knife coater, or the like. When the baking step of the insulating layer 4021 and the annealing of the semiconductor layer are combined, a semiconductor device can be manufactured efficiently.

The pixel electrode layer 4030 and the counter electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

Conductive compositions including a conductive high molecule (also referred to as a conductive polymer) can be used for the pixel electrode layer 4030 and the counter electrode layer 4031. The pixel electrode formed using the conductive composition preferably has a sheet resistance of 10000 Ω/square or less and a light transmittance of 70% or more at a wavelength of 550 nm. Further, the resistivity of the conductive high molecule included in the conductive composition is preferably 0.1 Ω·cm or less.

As the conductive high molecule, a so-called t-electron conjugated conductive polymer can be used. Examples include polyaniline and a derivative thereof, polypyrrole and a derivative thereof, polythiophene and a derivative thereof, and a copolymer of two or more of these materials.

Further, a variety of signals and potentials are supplied to the signal line driver circuit 4003 which is separately formed, the scan line driver circuit 4004, or the pixel portion 4002 from an FPC 4018.

A connection terminal electrode 4015 is formed using the same conductive film as the pixel electrode layer 4030 included in the liquid crystal element 4013. A terminal electrode 4016 is formed using the same conductive film as a source and drain electrode layers included in the thin film transistors 4010 and 4011.

The connection terminal electrode 4015 is electrically connected to a terminal included in the FPC 4018 via an anisotropic conductive film 4019.

Note that FIGS. 8A, 8B, and 8C illustrate the example in which the signal line driver circuit 4003 is formed separately and mounted on the first substrate 4001; however, this embodiment is not limited to this structure. The scan line driver circuit may be separately formed and then mounted, or only part of the signal line driver circuit or part of the scan line driver circuit may be separately formed and then mounted.

A black matrix (a light-blocking layer), an optical member (an optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

In an active matrix liquid crystal display device, pixel electrodes arranged in a matrix are driven to form a display pattern on a screen. Specifically, voltage is applied between a selected pixel electrode and a counter electrode corresponding to the pixel electrode, so that a liquid crystal layer provided between the pixel electrode and the counter electrode is optically modulated and this optical modulation is recognized as a display pattern by an observer.

In displaying moving images, a liquid crystal display device has a problem that a long response time of liquid crystal molecules causes afterimages or blurring of moving images. In order to improve the moving-image characteristics of a liquid crystal display device, a driving method called black insertion is employed in which black is displayed on the whole screen every other frame period.

Further, a driving method called double-frame rate driving may be employed in which a vertical synchronizing frequency is set 1.5 times or more, or 2 times or more as high as a usual vertical synchronizing frequency to improve the response speed.

Further alternatively, in order to improve the moving-image characteristics of a liquid crystal display device, a driving method may be employed in which a plurality of LEDs (light-emitting diodes) or a plurality of EL light sources are used to form a surface light source as a backlight, and each light source of the surface light source is independently driven in a pulsed manner in one frame period. As the surface light source, three or more kinds of LEDs may be used or an LED emitting white light may be used. Since a plurality of LEDs can be controlled independently, the timing at which the LED emits light can be synchronized with the timing at which the liquid crystal layer is optically modulated. In this driving method, part of the LEDs can be turned off; therefore, an effect of reducing power consumption can be obtained particularly in the case of displaying an image having a large black part.

By combining these driving methods, the display characteristics of a liquid crystal display device, such as moving-image characteristics, can be improved as compared to those of conventional liquid crystal display devices.

Since the thin film transistor is easily broken due to static electricity or the like, a protective circuit is preferably provided over the same substrate as the pixel portion and the driver circuit. The protective circuit is preferably formed using a non-linear element including an oxide semiconductor layer. For example, a protective circuit is provided between the pixel portion and a scan line input terminal and between the pixel portion and a signal line input terminal. In this embodiment, a plurality of protective circuits are provided so as to prevent breakage of the a pixel transistor and the like which can be caused when a surge voltage due to static electricity or the like is applied to a scan line, a signal line, and a capacitor bus line. The protective circuit is formed so as to release charge to a common wiring when a surge voltage is applied to the protective circuit. Further, the protective circuit includes non-linear elements arranged in parallel to each other with the scan line therebetween. The non-linear element is a two-terminal element such as a diode or a three-terminal element such as a transistor. For example, the non-linear element can be formed in the same steps as the thin film transistor in the pixel portion. For example, characteristics similar to those of a diode can be obtained by connection of a gate terminal to a drain terminal of the non-linear element.

For the liquid crystal display module, a twisted nematic (TN) mode, an in-plane-switching (IPS) mode, a fringe field switching (FFS) mode, an axially symmetric aligned micro-cell (ASM) mode, an optically compensated birefringence (OCB) mode, a ferroelectric liquid crystal (FLC) mode, an antiferroelectric liquid crystal (AFLC) mode, or the like can be employed.

There is no particular limitation in the semiconductor device disclosed in this specification, and a liquid crystal display device including a TN liquid crystal, an OCB liquid crystal, an STN liquid crystal, a VA liquid crystal, an ECB liquid crystal, a GH liquid crystal, a polymer dispersed liquid crystal, a discotic liquid crystal, or the like can be used. In particular, a normally black liquid crystal panel such as a transmissive liquid crystal display device utilizing a vertical alignment (VA) mode is preferable. Some examples are given as the vertical alignment mode. For example, a multi-domain vertical alignment (MVA) mode, a patterned vertical alignment (PVA) mode, and an ASV mode can be used.

Further, this embodiment can also be applied to a VA liquid crystal display device. The VA mode of a liquid crystal display device is a kind of mode in which alignment of liquid crystal molecules of a liquid crystal display panel is controlled. In the VA liquid crystal display device, liquid crystal molecules are aligned in a vertical direction with respect to a panel surface when no voltage is applied. Further, a method called multi-domain or multi-domain design, by which a pixel is divided into some regions (subpixels), and liquid crystal molecules are aligned in different directions in their respective regions, can be used.

This embodiment can be implemented in appropriate combination with another embodiment.

Embodiment 13

In this embodiment, an example of an electronic paper will be described as a semiconductor device of an embodiment of the present invention.

Figure 12:
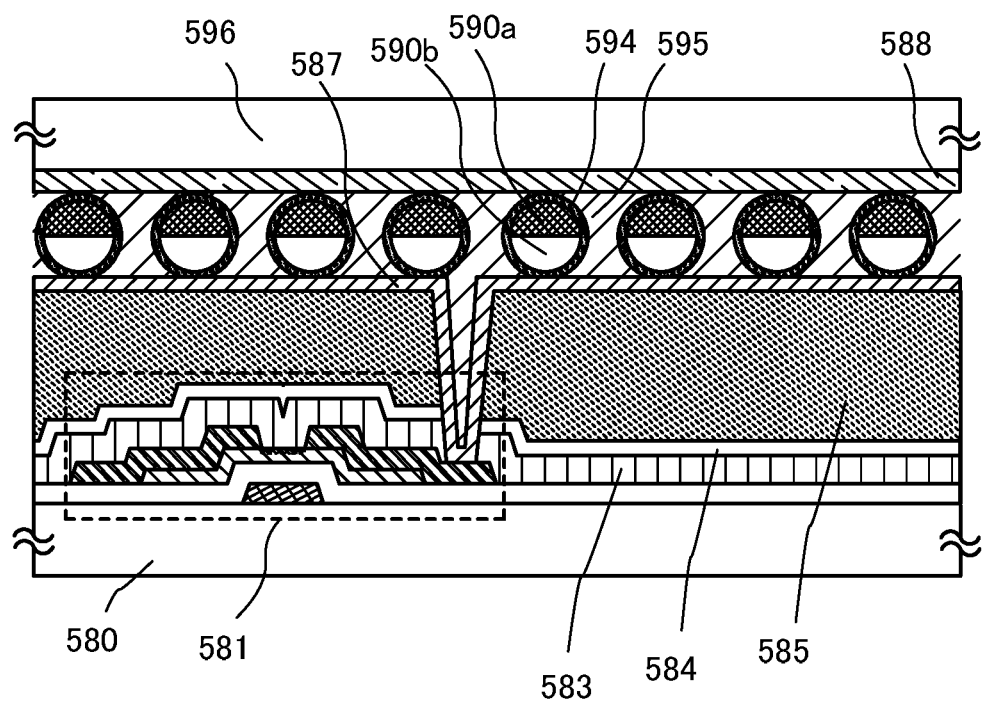
FIG. 12 illustrates a semiconductor device.

FIG. 12 illustrates an active matrix electronic paper as an example of a semiconductor device to which an embodiment of the present invention is applied. Any of the thin film transistors in Embodiments 1 to 9 can be used as appropriate as a thin film transistor 581, and the thin film transistor 581 can be formed using steps and materials similar to those for the thin film transistors in Embodiments 1 to 9. The thin film transistor 581 includes an oxygen-excess mixed region between an oxide semiconductor layer and the insulating layer 583 having defects. As in Embodiment 2, an oxygen-excess oxide insulating layer may be provided instead of the oxygen-excess mixed region. An oxygen-excess oxide insulating layer produces an effect similar to the effect of the oxygen-excess mixed region.

Since the oxygen-excess mixed region and the insulating layer 583 having defects have a high binding energy to hydrogen or moisture (a hydrogen atom or a compound including a hydrogen atom such as $H_2O$) and these impurities are stabilized in the oxygen-excess mixed region and the insulating layer having many defects, these impurities can be diffused from the oxide semiconductor layer into the oxygen-excess mixed region and the insulating layer 583 having defects, whereby these impurities are removed from the oxide semiconductor layer. Further, the oxygen-excess mixed region functions as a barrier layer against impurities which have been diffused into the insulating layer 583 having defects to prevent the impurities from entering the oxide semiconductor layer again; thus, the impurity concentration of the oxide semiconductor layer can be kept low. Accordingly, the thin film transistor 581 including an oxide semiconductor layer in which impurities such as hydrogen, moisture, hydroxyl, or hydride (also referred to as a hydrogen compound) which cause variation are reduced are highly reliable thin film transistors with stable electric characteristics.

The electronic paper of FIG. 12 is an example of a display device in which a twisting ball display system is employed. The twisting ball display system refers to a method in which spherical particles each colored in black and white are arranged between a first electrode layer and a second electrode layer which are electrode layers used in a display element, and a potential difference is generated between the first electrode layer and the second electrode layer to control orientation of the spherical particles, so that display is performed.

The thin film transistor 581 provided over a substrate 580 is a bottom-gate thin film transistor. A source electrode layer or a drain electrode layer of the thin film transistor 581 is in contact with and electrically connected to a first electrode layer 587 in an opening formed in the insulating layer 583 having defects, a protective insulating layer 584, and in an insulating layer 585.

Between the first electrode layer 587 and a second electrode layer 588 formed on a substrate 596, spherical particles each having a black region 590a, a white region 590b, and a cavity 594 filled with liquid around the regions are provided. Space around the spherical particles is filled with a filler 595 such as a resin (see FIG. 12). In this embodiment, the first electrode layer 587 corresponds to a pixel electrode, and the second electrode layer 588 on the counter substrate 596 corresponds to a common electrode.

Further, instead of the twisting ball, an electrophoretic element can be used. A microcapsule having a diameter of about 10 μm to 200 μm in which transparent liquid, positively charged white microparticles, and negatively charged black microparticles are encapsulated, is used. In the microcapsules which are provided between the first electrode layer and the second electrode layer, when an electric field is applied by the first electrode layer and the second electrode layer, the white microparticles and the black microparticles move to opposite sides from each other, so that white or black can be displayed. A display element using this principle is an electrophoretic display element and is called an electronic paper in general. The electrophoretic display element has higher reflectance than a liquid crystal display element, and thus, an auxiliary light is unnecessary, power consumption is low, and a display portion can be recognized in a dim environment. In addition, even when power is not supplied to the display portion, an image which has been displayed once can be maintained. Accordingly, a displayed image can be stored even when the semiconductor device having a display function (which may be referred to simply as a display device or a semiconductor device provided with a display device) is distanced from a radiowave source.

Through the above steps, a highly reliable electronic paper as a semiconductor device can be manufactured.

This embodiment can be implemented in appropriate combination with another embodiment.

Embodiment 14

The semiconductor device disclosed in this specification can be applied to a variety of electronic devices (including game machines). Examples of such electronic devices are a television device (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio playback device, a large-sized game machine such as a pinball machine, and the like.

Figure 13A:
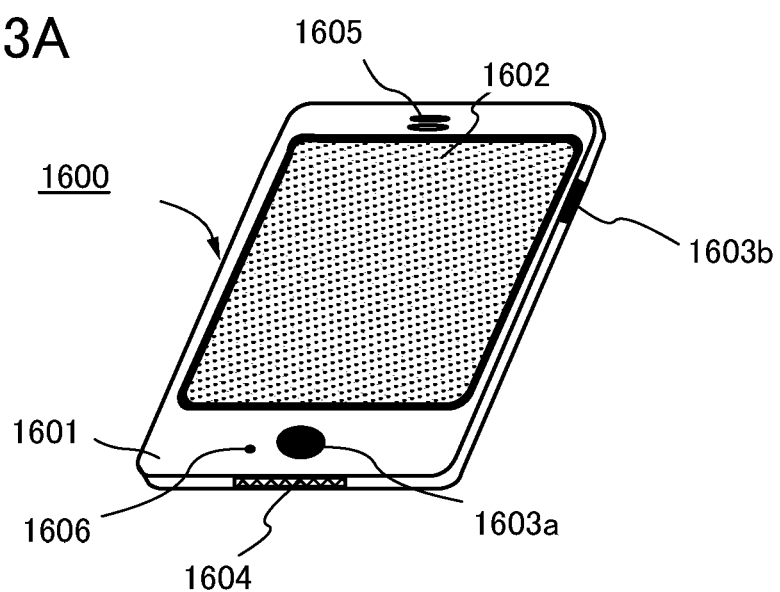
FIGS. 13A and 13B each illustrate an electronic device.

FIG. 13A illustrates a cellular phone 1600. The cellular phone 1600 includes a housing 1601 in which a display portion 1602 is incorporated, operation buttons 1603a and 1603b, an external connection port 1604, a speaker and 1605, microphone 1606.

Information can be input to the cellular phone 1600 illustrated in FIG. 13A by touching the display portion 1602 with a finger or the like. Further, operation such as making calls and texting can be performed by touching the display portion 1602 with a finger or the like.

There are mainly three screen modes of the display portion 1602. The first mode is a display mode mainly for displaying images. The second mode is an input mode mainly for inputting data such as text. The third mode is a display-and-input mode in which two modes of the display mode and the input mode are combined.

For example, in the case of making a call or texting, the display portion 1602 is placed in a text input mode mainly for inputting text, and characters displayed on a screen can be input. In this case, it is preferable to display a keyboard or number buttons on almost the entire area of the screen of the display portion 1602.

When a detection device including a sensor for detecting inclination, such as a gyroscope or an acceleration sensor, is provided inside the cellular phone 1600, display on the screen of the display portion 1602 can be automatically switched by detecting the direction of the cellular phone 1600 (whether the cellular phone 1600 is placed horizontally or vertically for a landscape mode or a portrait mode).

Further, the screen modes are switched by touching the display portion 1602 or operating the operation button 1603 of the housing 1601. Alternatively, the screen modes can be switched depending on kinds of images displayed on the display portion 1602. For example, when a signal for an image displayed on the display portion is data of moving images, the screen mode is switched to the display mode. When the signal is text data, the screen mode is switched to the input mode.

Further, in the input mode, a signal is detected by an optical sensor in the display portion 1602 and if input by touching the display portion 1602 is not performed for a certain period, the screen mode may be controlled so as to be switched from the input mode to the display mode.

The display portion 1602 can also function as an image sensor. For example, an image of a palm print, a fingerprint, or the like is taken by touching the display portion 1602 with the palm or the finger, whereby personal authentication can be performed. Moreover, when a backlight or sensing light source which emits near-infrared light is provided in the display portion, an image of finger veins, palm veins, or the like can be taken.

Any of the semiconductor devices described in the above embodiments can be applied to the display portion 1602. For example, a plurality of thin film transistors described in the above embodiments can be arranged as switching elements in pixels.

Figure 13B:
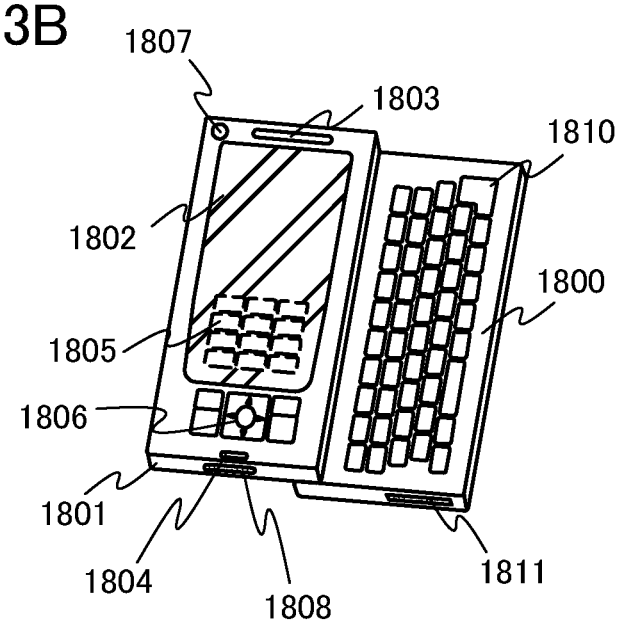

FIG. 13B illustrates another example of a cellular phone. A portable information terminal such as the one illustrated in FIG. 13B can have a plurality of functions. For example, in addition to a telephone function, such a portable information terminal can have a function of processing a variety of pieces of data by incorporating a computer.

The portable information terminal illustrated in FIG. 13B includes a housing 1800 and a housing 1801. The housing 1800 includes a display panel 1802, a speaker 1803, a microphone 1804, a pointing device 1806, a camera lens 1807, an external connection terminal 1808, and the like. The housing 1801 includes a keyboard 1810, an external memory slot 1811, and the like. In addition, an antenna is incorporated in the housing 1801.

Further, the display panel 1802 functions as a touch screen. A plurality of operation keys 1805 which is displayed is indicated by dashed lines in FIG. 13B.

Further, in addition to the above structure, a contactless IC chip, a small memory device, or the like may be incorporated.

Any of the semiconductor devices described in the above embodiments can be used for the display panel 1802 and the orientation of display is changed as appropriate depending on an application mode. Further, the camera lens 1807 is provided in the same plane as the display portion 1802; therefore, the portable information terminal can be used for videophone calls. The speaker 1803 and the microphone 1804 can be used for videophone calls, recording and playing sound, and the like without being limited to voice calls. Moreover, the housings 1800 and 1801 which are developed in FIG. 13B can be slid so that one is lapped over the other; therefore, the size of the portable information terminal can be reduced, which makes the portable information terminal suitable for being carried.

The external connection terminal 1808 can be connected to an AC adaptor and various types of cables such as a USB cable so that charging and data communication with a personal computer or the like are possible. Furthermore, a large amount of data can be stored and moved with a storage medium inserted into the external memory slot 1811.

In addition to the above described functions, the portable information terminal may have an infrared communication function, a television receiver function, and the like.

Figure 14A:
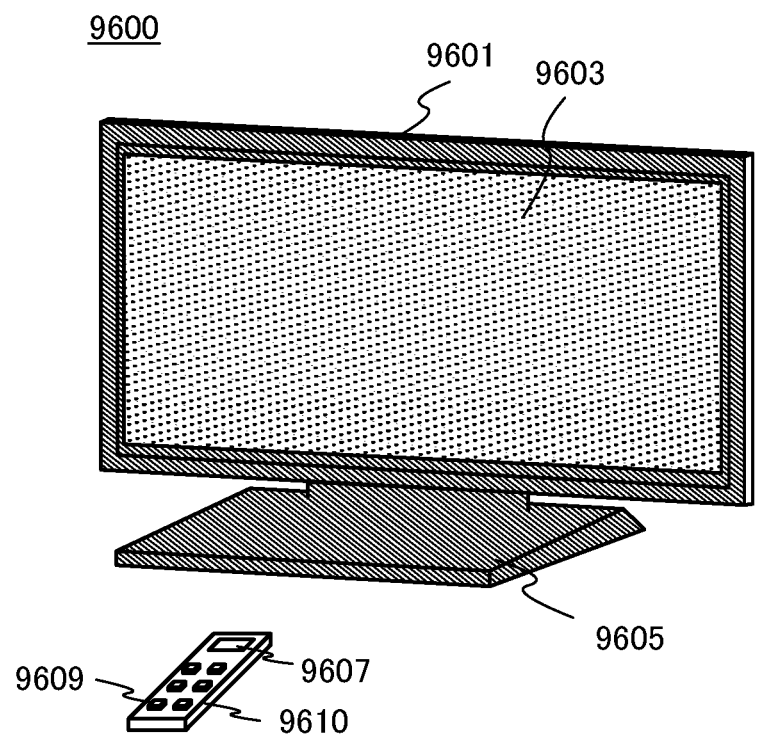
FIGS. 14A and 14B each illustrate an electronic device.

FIG. 14A illustrates a television device 9600. In the television device 9600, a display portion 9603 is incorporated in a housing 9601. The display portion 9603 can display images. Here, the housing 9601 is supported by a stand 9605.

The television device 9600 can be operated with an operation switch of the housing 9601 or a separate remote control 9610. Channels can be switched and volume can be controlled with operation keys 9609 of the remote control 9610, whereby an image displayed on the display portion 9603 can be controlled. Moreover, the remote control 9610 may be provided with a display portion 9607 for displaying data output from the remote control 9610.

Note that the television device 9600 is provided with a receiver, a modem, and the like. With the receiver, general TV broadcasts can be received. Moreover, when the display device is connected to a communication network with or without wires via the modem, one-way (from a sender to a receiver) or two-way (e.g., between a sender and a receiver or between receivers) information communication can be performed.

Any of the semiconductor devices described in the above embodiments can be applied to the display portion 9603. For example, a plurality of thin film transistors described in the above embodiments can be arranged as switching elements in pixels.

Figure 14B:
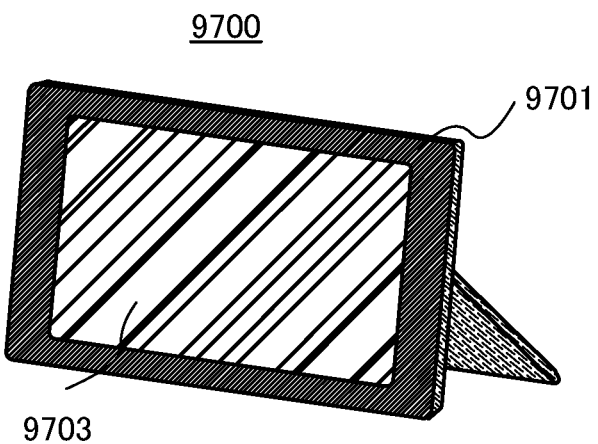

FIG. 14B illustrates a digital photo frame 9700. For example, in a digital photo frame 9700, a display portion 9703 is incorporated in a housing 9701. The display portion 9703 can display a variety of images. For example, the display portion 9703 can display image data taken with a digital camera or the like and function like a normal photo frame.

Any of the semiconductor devices described in the above embodiments can be applied to the display portion 9703. For example, a plurality of thin film transistors described in the above embodiments can be arranged as switching elements in pixels.

Note that the digital photo frame 9700 is provided with an operation portion, an external connection terminal (a USB terminal, a terminal connectable to a variety of cables such as a USB cable), a storage medium insertion portion, and the like. Although these components may be provided on the same surface as the display portion, it is preferable to provide them on the side surface or the back surface for design aesthetics. For example, a storage medium storing image data taken with a digital camera is inserted into the storage medium insertion portion of the digital photo frame and the data is loaded, whereby the image can be displayed on the display portion 9703.

The digital photo frame 9700 may be configured to transmit and receive data wirelessly. Through wireless communication, desired image data can be loaded to be displayed.

Figure 15:
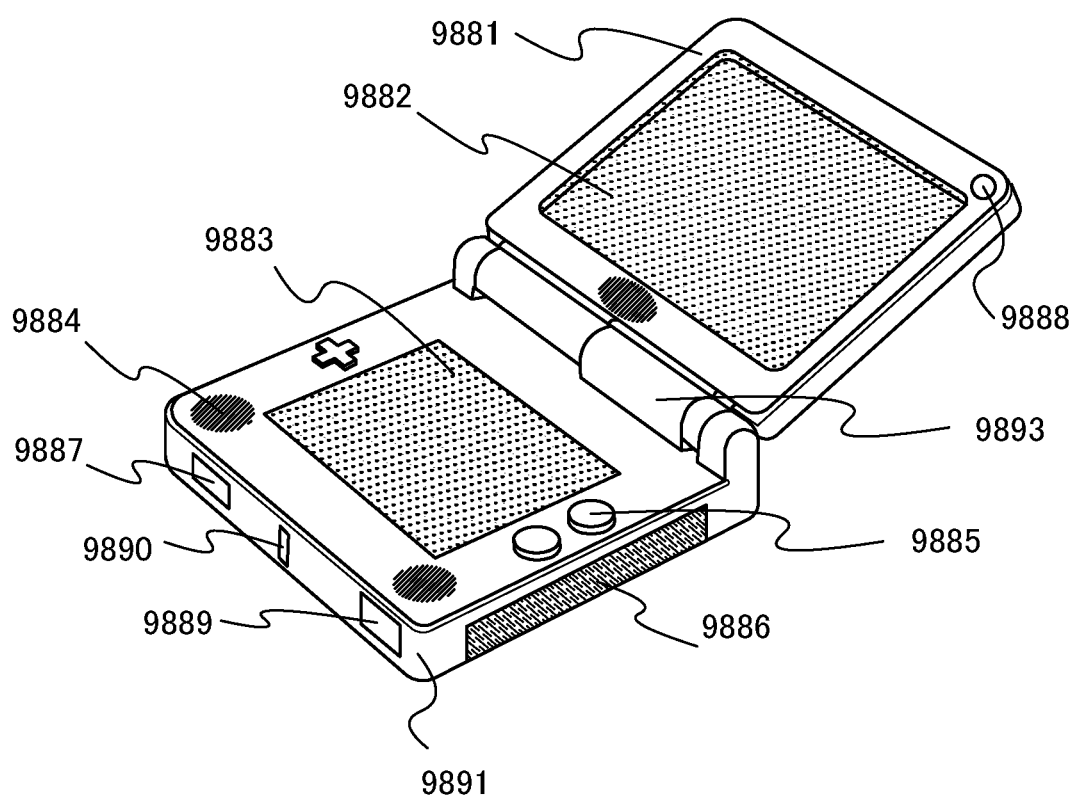
FIG. 15 illustrates an electronic device.

FIG. 15 illustrates a portable game console including two housings, a housing 9881 and a housing 9891 which are jointed with a joint portion 9893 so that the portable game console can be opened or folded. A display portion 9882 and a display portion 9883 are incorporated in the housing 9881 and the housing 9891, respectively.

Any of the semiconductor devices described in the above embodiments can be applied to the display portion 9883. For example, a plurality of thin film transistors described in the above embodiments can be arranged as switching elements in pixels.

In addition, the portable game console illustrated in FIG. 15 is provided with a speaker portion 9884, a storage medium insertion portion 9886, an LED lamp 9890, input means (operation keys 9885, a connection terminal 9887, a sensor 9888 (having a function of measuring force, displacement, position, speed, acceleration, angular velocity, rotation number, distance, light, liquid, magnetism, temperature, chemical substance, sound, time, hardness, electric field, current, voltage, electric power, radial ray, flow rate, humidity, gradient, vibration, smell, or infrared ray), and a microphone 9889), and the like. Needless to say, the structure of the portable game console is not limited to the above and another structure which is provided with at least the thin film transistor disclosed in this specification can be employed. The portable game console may include an additional accessory as appropriate. The portable game console illustrated in FIG. 15 has a function of reading a program or data stored in a storage medium to display it on the display portion, and a function of sharing data with another portable game console by wireless communication. Note that a function of the portable game console illustrated in FIG. 15 is not limited to those described above, and the portable game console can have a variety of functions.

Figure 17:
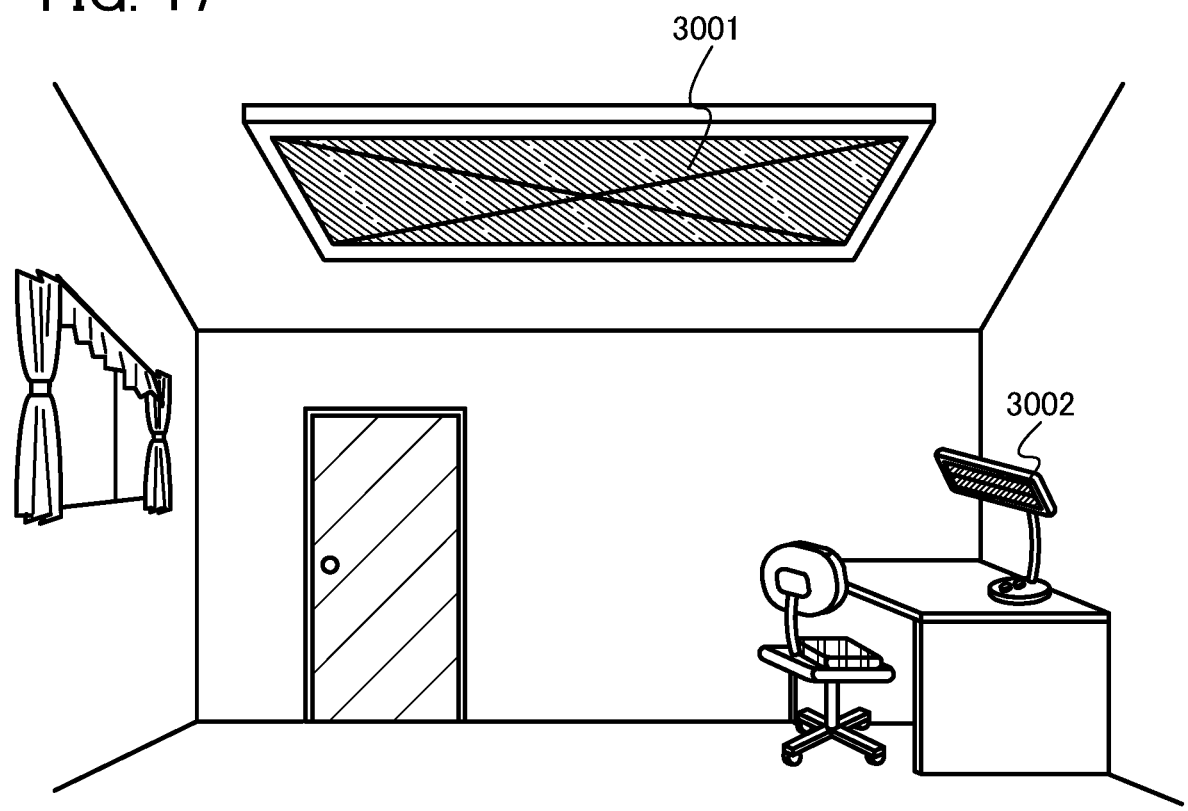
FIG. 17 illustrates electronic devices.

FIG. 17 illustrates an example in which the light-emitting device which is an example of the semiconductor device formed according to any of the above embodiments is used as an indoor lighting device 3001. Since a light-emitting device described in this specification can have a large area, the light-emitting device can be used as a lighting device having a large emission area. In addition, any of the light-emitting devices described in the above embodiments can also be used as a desk lamp 3002. Note that the lighting equipment includes in its category, a ceiling light, a wall light, a vehicle interior light, an emergency exit light, and the like.

As described above, the semiconductor device described in any of Embodiments 1 to 9 can be applied to a display panel of a variety of electronic devices described above and highly reliable electronic appliances can be provided.

Embodiment 15

Figure 16:
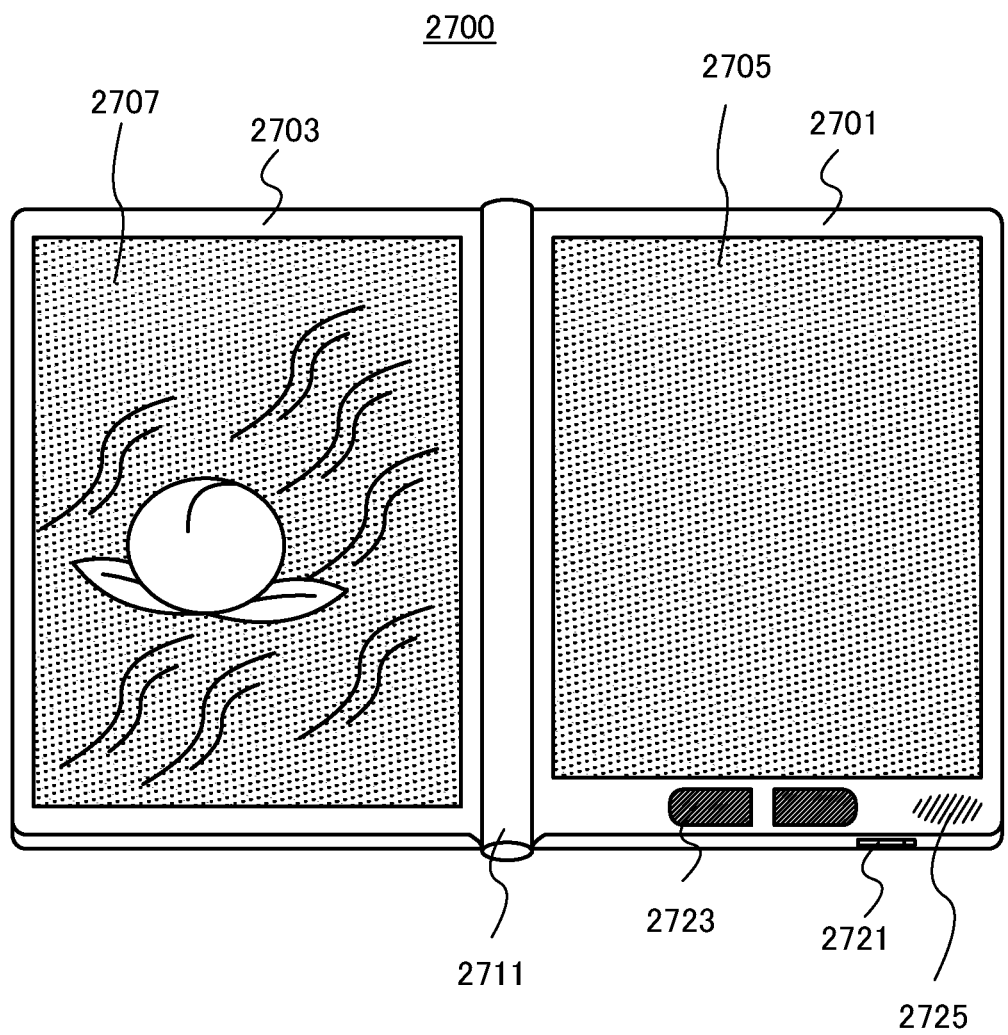
FIG. 16 illustrates an electronic device.

The semiconductor device disclosed in this specification can be applied to an electronic paper. An electronic paper can be used for electronic devices for displaying information in all fields. For example, an electronic paper can be applied to an electronic book reader (an e-book reader), a poster, an advertisement in a vehicle such as a train, or a display of a variety of cards such as a credit card. FIG. 16 illustrates examples of the electronic devices.

FIG. 16 illustrates an electronic book reader 2700. For example, an electronic book reader 2700 includes two housings, a housing 2701 and a housing 2703. The housing 2701 and the housing 2703 are combined with a hinge 2711 so that the electronic book reader 2700 can be opened and closed along the hinge 2711. With such a structure, the electronic book reader 2700 can be handled like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right (the display portion 2705 in FIG. 16) can display text and a display portion on the left (the display portion 2707 in FIG. 16) can display an image.

FIG. 16 illustrates an example in which the housing 2701 is provided with an operation portion and the like. For example, the housing 2701 is provided with a power supply switch 2721, operation keys 2723, a speaker 2725, and the like. Pages can be turned with the operation keys 2723. Note that a keyboard, a pointing device, and the like may be provided on the same surface as the display portion of the housing. Moreover, an external connection terminal (an earphone terminal, a USB terminal, a terminal connectable to a variety of cables such as an AC adapter or a USB cable), a storage medium insertion portion, and the like may be provided on the back surface or the side surface of the housing. Moreover, the electronic book reader 2700 may have a function of an electronic dictionary.

The electronic book reader 2700 may be configured to wirelessly transmit and receive data. Through wireless communication, desired book data or the like can be purchased and downloaded from an electronic book server.

This embodiment can be implemented in appropriate combination with another embodiment.

This application is based on Japanese Patent Application serial no. 2009-249876 filed with Japan Patent Office on Oct. 30, 2009, the entire contents of which are hereby incorporated by reference.

The invention claimed is:

1. A semiconductor device comprising:
a gate electrode layer over a substrate;
a gate insulating layer over the gate electrode layer;
an oxide semiconductor layer over the gate insulating layer;
a source electrode layer and a drain electrode layer, each of the source electrode layer and the drain electrode layer being in contact with the oxide semiconductor layer;
a first insulating layer over the source electrode layer and the drain electrode layer, the first insulating layer comprising oxygen and silicon;
a first region between the oxide semiconductor layer and the first insulating layer; and
a second insulating layer covering the first insulating layer,
wherein the first region comprises oxygen, silicon and at least one of metal elements included in the oxide semiconductor layer,
wherein the gate insulating layer comprises a first layer and a second layer over the first layer,
wherein the first layer is a nitride layer and the second layer is an oxide layer,
wherein the first insulating layer is in contact with a top surface of the second layer of the gate insulating layer, and
wherein the second insulating layer is a nitride layer and in contact with a top surface of the first layer of the gate insulating layer.

2. A semiconductor device according to claim 1, wherein the first region is in oxygen-excess state.

3. A semiconductor device according to claim 1, wherein the oxide semiconductor layer comprises indium, gallium and zinc.

4. The semiconductor device according to claim 1,
wherein the first insulating layer has defects, and
wherein the first insulating layer is configured to bind and stabilize an impurity diffused from the oxide semiconductor layer.

5. A semiconductor device according to claim 1, wherein a thickness of the first region is 0.1 nm to 30 nm.

6. A semiconductor device comprising:
a gate electrode layer over a substrate;
a gate insulating layer over the gate electrode layer;
an oxide semiconductor layer over the gate insulating layer;
a source electrode layer and a drain electrode layer, each of the source electrode layer and the drain electrode layer being in contact with the oxide semiconductor layer;
a first insulating layer over the source electrode layer and the drain electrode layer, the first insulating layer comprising oxygen and silicon;
a first region between the oxide semiconductor layer and the first insulating layer; and
a second insulating layer covering the first insulating layer,
wherein the oxide semiconductor layer comprises indium, gallium and zinc,
wherein the first region comprises indium, gallium, zinc, and silicon,
wherein the gate insulating layer comprises a first layer and a second layer over the first layer,
wherein the first insulating layer is in contact with a top surface of the second layer of the gate insulating layer, and
wherein the second insulating layer is a nitride layer and in contact with a top surface of the first layer of the gate insulating layer.

7. A semiconductor device according to claim 6, wherein the first region is in oxygen-excess state.

8. The semiconductor device according to claim 6,
wherein the first insulating layer has defects, and
wherein the first insulating layer is configured to bind and stabilize an impurity diffused from the oxide semiconductor layer.

9. A semiconductor device according to claim 6, wherein a thickness of the first region is 0.1 nm to 30 nm.

* * * * *